US011336287B1

(12) United States Patent
Rodriguez et al.

(10) Patent No.: US 11,336,287 B1
(45) Date of Patent: May 17, 2022

(54) DATA PROCESSING ENGINE ARRAY ARCHITECTURE WITH MEMORY TILES

(71) Applicant: Xilinx, Inc., San Jose, CA (US)

(72) Inventors: Javier Cabezas Rodriguez, Campbell, CA (US); Juan J. Noguera Serra, San Jose, CA (US); David Clarke, Dublin (IE); Sneha Bhalchandra Date, Santa Clara, CA (US); Tim Tuan, San Jose, CA (US); Peter McColgan, Dublin (IE); Jan Langer, Chemnitz (DE); Baris Ozgul, Dublin (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 17/196,574

(22) Filed: Mar. 9, 2021

(51) Int. Cl.
*H03K 19/1776* (2020.01)
*H03K 19/17704* (2020.01)
*H03K 19/17768* (2020.01)
*H03K 19/17758* (2020.01)
*H03K 19/17796* (2020.01)

(52) U.S. Cl.
CPC ... *H03K 19/1776* (2013.01); *H03K 19/17708* (2013.01); *H03K 19/17758* (2020.01); *H03K 19/17768* (2013.01); *H03K 19/17796* (2013.01)

(58) Field of Classification Search
None
See application file for complete search history.

(56) References Cited

U.S. PATENT DOCUMENTS 3,776,137 A 12/1973 Abbott
4,876,641 A 10/1989 Cowley
6,091,263 A 7/2000 New et al.
6,150,839 A 11/2000 New et al.
6,204,687 B1 3/2001 Schultz et al.
6,462,579 B1 10/2002 Camilleri et al.
6,526,557 B1 2/2003 Young et al.
6,759,869 B1 7/2004 Young et al.
6,781,407 B2 8/2004 Schultz
(Continued)

FOREIGN PATENT DOCUMENTS

WO 2019195132 A1 10/2019
WO 2019195309 A1 10/2019
WO 2019195343 A1 10/2019

OTHER PUBLICATIONS

ARM Limited, "AMBA 3 APB Protocol Specification," v1.0, Sep. 25, 2003, pp. 1-34, ARM Limited, Cambridge, UK.
(Continued)

*Primary Examiner* — Jany Richardson
(74) *Attorney, Agent, or Firm* — Kevin T. Cuenot

(57) ABSTRACT

An integrated circuit can include a data processing engine (DPE) array having a plurality of tiles. The plurality of tiles can include a plurality of DPE tiles, wherein each DPE tile includes a stream switch, a core configured to perform operations, and a memory module. The plurality of tiles can include a plurality of memory tiles, wherein each memory tile includes a stream switch, a direct memory access (DMA) engine, and a random-access memory. The DMA engine of each memory tile may be configured to access the random-access memory within the same memory tile and the random-access memory of at least one other memory tile. Selected ones of the plurality of DPE tiles may be configured to access selected ones of the plurality of memory tiles via the stream switches.

20 Claims, 23 Drawing Sheets

(56) References Cited

U.S. PATENT DOCUMENTS

| | | |
|---|---|---|
| 6,810,514 B1 | 10/2004 | Alfke et al. |
| 6,836,842 B1 | 12/2004 | Guccione et al. |
| 6,907,595 B2 | 6/2005 | Curd et al. |
| 7,024,651 B1 | 4/2006 | Camilleri et al. |
| 7,057,413 B1 | 6/2006 | Young et al. |
| 7,124,338 B1 | 10/2006 | Mark et al. |
| 7,185,309 B1 | 2/2007 | Kulkarni et al. |
| 7,199,608 B1 | 4/2007 | Trimberger |
| 7,224,184 B1 | 5/2007 | Levi et al. |
| 7,281,093 B1 | 10/2007 | Kulkarni et al. |
| 7,301,822 B1 | 11/2007 | Walstrum, Jr. et al. |
| 7,302,625 B1 | 11/2007 | Payakapan et al. |
| 7,454,658 B1 | 1/2008 | Baxter |
| 7,328,335 B1 | 2/2008 | Sundararajan et al. |
| 7,380,035 B1 | 5/2008 | Donlin |
| 7,394,288 B1 | 7/2008 | Agarwal |
| 7,420,392 B2 | 9/2008 | Schultz et al. |
| 7,477,072 B1 | 1/2009 | Kao et al. |
| 7,478,357 B1 | 1/2009 | Mason et al. |
| 7,482,836 B2 | 1/2009 | Levi et al. |
| 7,500,060 B1 | 3/2009 | Anderson et al. |
| 7,509,617 B1 | 3/2009 | Young et al. |
| 7,518,396 B1 | 4/2009 | Kondapalli et al. |
| 7,521,961 B1 | 4/2009 | Anderson |
| 7,539,845 B1 | 5/2009 | Wentzlaff et al. |
| 7,546,572 B1 | 6/2009 | Ballagh et al. |
| 7,574,680 B1 | 8/2009 | Kulkarni et al. |
| 7,576,561 B1 | 8/2009 | Huang |
| 7,619,442 B1 | 11/2009 | Mason et al. |
| 7,640,527 B1 | 12/2009 | Dorairaj et al. |
| 7,650,248 B1 | 1/2010 | Baxter |
| 7,653,820 B1 | 1/2010 | Trimberger |
| 7,689,726 B1 | 3/2010 | Sundararajan et al. |
| 7,724,815 B1 | 5/2010 | Raha et al. |
| 7,746,099 B1 | 6/2010 | Chan et al. |
| 7,774,579 B1 * | 8/2010 | Wentzlaff ............ G06F 15/8007 712/11 |
| 7,788,625 B1 | 8/2010 | Donlin et al. |
| 7,831,801 B1 | 11/2010 | Anderson |
| 8,006,021 B1 | 8/2011 | Li et al. |
| 8,020,163 B2 | 9/2011 | Nollet et al. |
| 8,045,546 B1 | 10/2011 | Bao et al. |
| 8,102,188 B1 | 1/2012 | Chan et al. |
| 8,214,694 B1 | 7/2012 | McKechnie et al. |
| 8,250,342 B1 | 8/2012 | Kostamov et al. |
| 8,359,448 B1 | 1/2013 | Neuendorffer |
| 8,415,974 B1 | 4/2013 | Lysaght |
| 8,656,141 B1 | 2/2014 | Agarwal |
| 8,719,750 B1 | 5/2014 | Balzli, Jr. |
| 8,796,539 B2 | 8/2014 | Asaumi et al. |
| 8,928,351 B1 | 1/2015 | Konduru |
| 9,081,634 B1 | 7/2015 | Simkins et al. |
| 9,152,794 B1 | 10/2015 | Sanders et al. |
| 9,165,143 B1 | 10/2015 | Sanders et al. |
| 9,218,443 B1 | 12/2015 | Styles et al. |
| 9,230,112 B1 | 1/2016 | Peterson et al. |
| 9,323,876 B1 | 4/2016 | Lysaght et al. |
| 9,336,010 B2 | 5/2016 | Kochar et al. |
| 9,411,688 B1 | 8/2016 | Poolla et al. |
| 9,436,785 B1 | 9/2016 | Javre |
| 9,639,487 B1 | 5/2017 | Wentzlaff |
| 9,652,252 B1 | 5/2017 | Kochar et al. |
| 9,652,410 B1 | 5/2017 | Schelle et al. |
| 9,722,613 B1 | 8/2017 | Schultz et al. |
| 9,990,241 B2 | 6/2018 | Dobbs |
| 10,243,882 B1 | 3/2019 | Swarbrick |
| 10,673,439 B1 | 6/2020 | Ahmad |
| 10,747,690 B2 | 8/2020 | Bilski |
| 10,824,584 B1 * | 11/2020 | Noguera Serra . G06F 15/17306 |
| 10,866,753 B2 | 12/2020 | Noguera Serra |
| 2004/0114609 A1 | 6/2004 | Swarbrick et al. |
| 2004/0210695 A1 | 10/2004 | Weber et al. |
| 2007/0006137 A1 | 1/2007 | Savagaonkar |
| 2007/0124565 A1 * | 5/2007 | Jones ................ G06F 15/17337 712/201 |
| 2008/0082759 A1 | 4/2008 | Pong |
| 2008/0320255 A1 | 12/2008 | Wingard et al. |
| 2008/0320268 A1 | 12/2008 | Wingard et al. |
| 2012/0036296 A1 | 2/2012 | Wingard et al. |
| 2012/0310983 A1 | 12/2012 | Mittal |
| 2014/0006751 A1 | 1/2014 | Aliseychik et al. |
| 2014/0267334 A1 | 9/2014 | Duluk, Jr. |
| 2016/0011996 A1 | 1/2016 | Asaad et al. |
| 2017/0140800 A1 | 5/2017 | Wingard et al. |
| 2017/0220499 A1 | 8/2017 | Gray |
| 2017/0315944 A1 | 11/2017 | Mayer et al. |
| 2018/0012637 A1 | 1/2018 | Krishna |
| 2019/0155666 A1 | 5/2019 | Dobbs |
| 2019/0205263 A1 | 7/2019 | Fleming |
| 2019/0205269 A1 | 7/2019 | Fleming, Jr. |
| 2019/0238453 A1 | 8/2019 | Swarbrick et al. |
| 2019/0266125 A1 | 8/2019 | Swarbrick et al. |
| 2019/0303033 A1 | 10/2019 | Noguera Serra et al. |
| 2019/0303311 A1 | 10/2019 | Bilski et al. |
| 2019/0303323 A1 | 10/2019 | Swarbrick et al. |
| 2019/0303328 A1 | 10/2019 | Bilski et al. |

OTHER PUBLICATIONS

ARM Limited, "AMBA 4 Axis-Stream Protocol SpecificaTIon," V1.0, Mar. 3, 2010, pp. 1-42, ARM Limited, Cambridge UK.

Xilinx, Inc., "Zynq-7000 AP SoC—32 Bit DDR Access with ECC Tech Tip," 15 pg., printed on Aug. 10, 2018, <http://www.wiki.xilinx.com/Zynq-7000+AP+XoC+-+32+Bit+DDR+Access+with+ECC+Tech+Tip>, San Jose, CA, USA.

Dally, William J. et al., "Deadlock=Free Message Routing in Multiprocessor Interconnection Networks," IEEE Transactions on Computers, May 1987, pp. 547-553, vol. C-36, No. 5, IEEE, Piscataway, New Jersjey, USA.

Doud, B., "Accelerating the Data Plane With the Tile-MX Manycore Processor," Feb. 25, 2015, 19 pp., Linley Data Center Conference, H/Chip Semiconductor, Inc, San Jose, California, USA.

Mellanox, EZchip, "Tile-Gx72 Processor," PB041, Feb. 14, 2015, 2 pp., EZchip Semiconductor, Inc., San Jose, California, USA.

Glass, Christopher et al., "The Turn Model for Adaptive Routing," Journal of the Association for Computing Machinery, Sep. 1994, pp. 874,902, vol. 41, No. 5, ACM, New York, New York, USA.

Kalray, "Deep Learning for High-Performance Embedded Applications," 19 pp., Kalray Inc., Los Altos, California, USA.

Kalray, "Kalray NVMe-oF Target Controller Solutions," Dec. 18, 2017, 14 pp., Kalray Inc., Los Altos, California, USA.

Kalray, "MPPA Processors for Autonomous Driving," May 25, 2017, 18 pp., Kalray Inc., Los Altos, California, USA.

Mellanox, "BlueField Multicore System on Chip," copyright 2017, 4 pp., Mellanox Technologies, Sunnyvale, California, USA.

Mellanox, "NP-5 Network Processor," copyright 2017, 2 pp., Mellanox Technologies, Sunnyvale, California, USA.

ARM Limited, "AMBA AXI and ACE Protocol Specification," Jun. 16, 2003, pp. 1-306, ARM Limited, Cambridge, UK.

Rantala, Ville et al., "Network on Chip R outing Algorithms," TUCS Technical Report No. 779, Aug. 2006, pp. 1-38, Turku Centre for Computer Science, Turku, Finland.

Schooler, Richard, "Tile Processors: Many-Core for Embedded and Cloud Computing," Sep. 15, 2010, 35 pp., 14th Annual Workshop on High Performance Embedded Computing (HPEC '10).

Swarbrick et al., "End-To-End Quality-Of-Service in a Network-On-Chip," U.S. Appl. No. 15/886,583, filed Feb. 1, 2018, Xilinx, Inc., San Jose, CA, USA.

Swarbrick et al., "Configurable Network-On-Chip for a Programmable Device", U.S. Appl. No. 16/041,473, filed Jul. 20, 2018, 34 pages, Xilinx, Inc., San Jose, CA, USA.

Swarbrick, et al., "Peripheral Interconnect for Configurable Slave Endpont Circuits," U.S. Appl. No. 15/936,916, filed Jul. 20, 2018, 42 pg., Xilinx, Inc., San Jose, CA, USA.

Swarbrick, et al., "ECC Proxy Extension and Byte Organization for Multi-Master Systems ," U.S. Appl. No. 16/106,691, filed Aug. 21, 2018, 31 pg., Xilinx, Inc., San Jose, CA, USA.

(56) References Cited

OTHER PUBLICATIONS

Swarbrick, et al., "Flexible Address Mapping for a NOC in an Integrated Circuit" U.S. Appl. No. 15/964,901, filed Apr. 27, 2018, 28 pg., Xilinx, Inc., San Jose, CA, USA.

Swarbrick, et al., "Multi-Chip Structure Having Configurable Network-On-Chip," U.S. Appl. No. 15/990,506, filed May 25, 2018, 33 pg., Xilinx, Inc., San Jose, CA, USA.

Swarbrick, et al., "Programmable NOC Compatible With Multiple Interface Communication Protocol," U.S. Appl. No. 15/904,211, filed Feb. 23, 2018, 27 pg., Xilinx, Inc., San Jose, CA, USA.

TIS Committee, Tool Interface Standard (TIS) Executable and Linking Format (ELF) Specification, Version 1.2, May 1995, 106 pg, Tool Interface Standard Committee.

Wentzlaff, David, et al., "On-Chip Interconnection Architecture of the Tile Processor," IEEE Micro, Nov. 12, 2007, pp. 15-31, vol. 27, Issue 5, IEEE Computer Society Press, Los Alamitos, California, USA.

EZchip, "Tile-Gx72 Processor," Feb. 14, 2015, 2 pp., EZchip Semiconductor, Inc., San Jose, California, USA.

Xilinx, "UltraScale Architecture DSP Slice," UG579, Oct. 18, 2017, 74 pp., Xilinx, Inc., San Jose, California, USA.

Xilinx, Inc., "AXI4-Stream Interconnect v1.1, LogiCORE IP Product Guide," PG035, Vivado Design Suite,Chap. 2 Product Specification, Chap 3: Designing With the Core, Oct. 4, 2017, 44 pg., Xilinx, Inc., San Jose, California, USA.

LogiCORE IP AXI Interconnect (v1.06.a), Product Specification, DS768, Dec. 18, 2012, 62 pg., Xilinx, Inc., San Jose, California.

Stocksdale et al., Architecting H BM as a High Bandwidth, High Capacity, Self-Managed Last-Level Cache, Nov. 2017, PDSW-DSICS' 17 Denver, Co, USA (Year: 2017).

Xilinx, Inc., "Versal: The First Adaptive Compute Acceleration Platform (ACAP)," WP505 (v1.1.1) Sep. 29, 2020, 21 pages.

Xilinx, Inc., "Xilinx AI Engines and Their Applications," WP506 (v1.1) Jul. 10, 2020, 13 pages.

\* cited by examiner

US 11,336,287 B1

DATA PROCESSING ENGINE ARRAY ARCHITECTURE WITH MEMORY TILES

TECHNICAL FIELD

This disclosure relates to integrated circuits (ICs) and, more particularly, to an architecture for a data processing engine array implemented within an IC, where the data processing engine array has one or more memory tiles.

BACKGROUND

A programmable integrated circuit (IC) refers to a type of IC that includes programmable circuitry. An example of a programmable IC is a field programmable gate array (FPGA). An FPGA is characterized by the inclusion of programmable circuit blocks. Examples of programmable circuit blocks that may be found on a programmable IC include, but are not limited to, input/output blocks, configurable logic blocks, dedicated random access memory blocks, digital signal processing blocks, processors, clock managers, and delay lock loops. In some cases, a programmable IC may include one or more programmable processing elements arranged in an array.

Circuit designs may be physically implemented within the programmable circuitry of a programmable IC by loading configuration data into internal configuration memory of the device. The configuration memory may include a plurality of individual configuration memory cells and/or registers. The collective states of the configuration memory determine the functionality of the programmable IC. For example, the particular operations performed by the various programmable circuit blocks and the connectivity between the programmable circuit blocks of the programmable IC are defined by the collective states of the configuration memory once loaded with the configuration data.

SUMMARY

In one aspect, an integrated circuit (IC) can include a data processing engine (DPE) array having a plurality of tiles. The plurality of tiles can include a plurality of DPE tiles, wherein each DPE tile includes a stream switch, a core configured to perform operations, and a memory module. The plurality of tiles can include a plurality of memory tiles, wherein each memory tile includes a stream switch, a direct memory access (DMA) engine, and a random-access memory (RAM). The DMA engine of each memory tile may be configured to access the RAM within the same memory tile and the RAM of at least one other memory tile. Selected ones of the plurality of DPE tiles may be configured to access selected ones of the plurality of memory tiles via the stream switches.

In another aspect, an IC having a DPE array can include a plurality of memory tiles. A first memory tile can include a first direct memory access (DMA) engine, a first RAM connected to the first DMA engine, and a first stream switch coupled to the first DMA engine. The first DMA engine may be coupled to a second RAM disposed in a second memory tile. The first stream switch may be coupled to a second stream switch disposed in the second memory tile.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
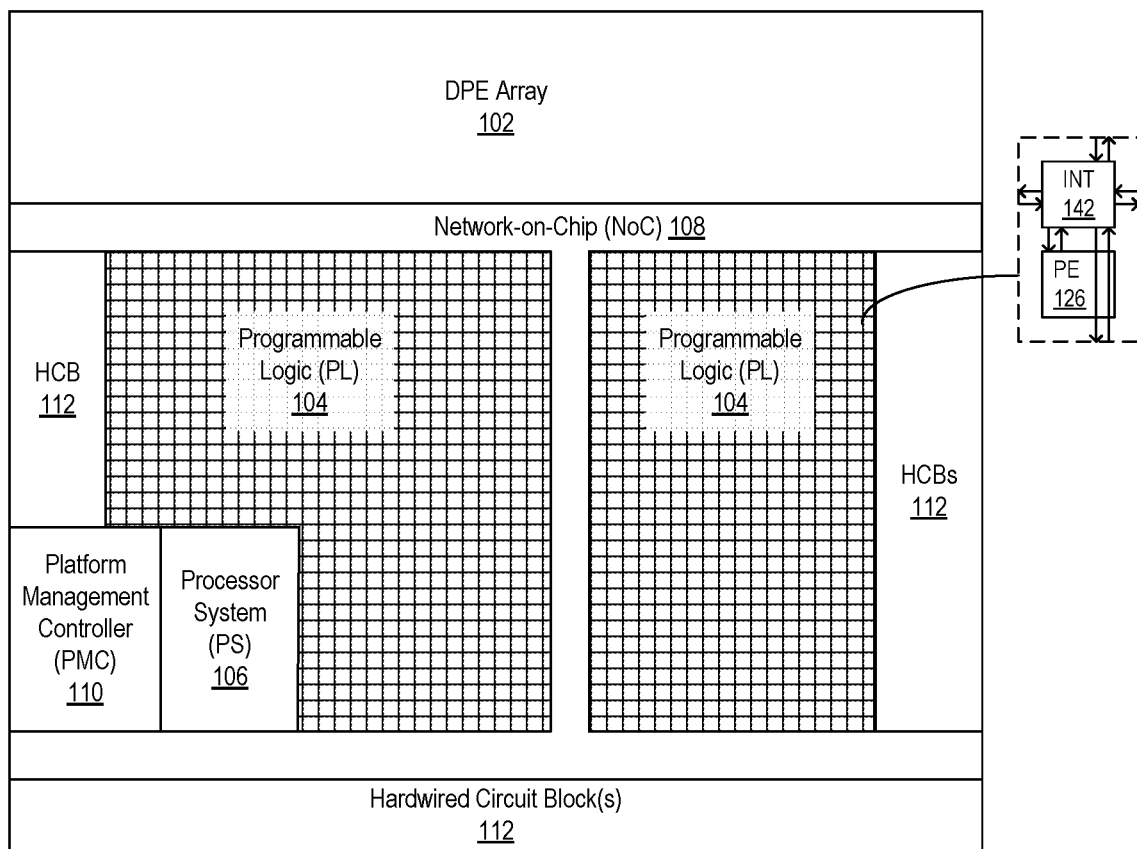
FIG. 1 illustrates an example architecture for an integrated circuit (IC).

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to an architecture for a data processing engine (DPE) array within an IC that includes one or more memory tiles. A DPE array can include a plurality of DPE tiles coupled to a System-on-Chip (SoC) interface. Each DPE tile is capable of processing a significant amount of data. Data operated on by the DPE tiles may be provided as input from one or more other systems and/or circuits of the IC to the DPE array through the SoC interface. Similarly, data that is output from the DPE array may be provided through the SoC interface to one or more other systems and/or circuits on the IC.

As the DPE tiles become more powerful and capable of processing more data per unit of time, the amount of data that must flow through the SoC interface, whether as input to the DPE array or output from the DPE array, also increases. The increased bandwidth requirements of the SoC interface may be attributed to DPE array data inflows and DPE array data outflows. These DPE array data inflows and outflows may convey communications with other on-chip circuit blocks and off-chip circuits such as memories. In accordance with the inventive arrangements described within this disclosure, a DPE array architecture is provided that incorporates an additional type of circuit block or tile referred to as a "memory tile." The memory tiles may be implemented as hardwired and programmable circuit blocks that are included within the DPE array itself. By incorporating the memory tile(s) within the DPE array, a larger pool of memory is made available to the DPE tiles thereby reducing the need to access memory external to the DPE array. This also reduces the bandwidth requirements placed on the SoC interface.

This disclosure also provides example architectures for implementing the memory tiles. In accordance with the examples provided herein, the memory tiles are configurable so that two or more of the memory tiles may be configured to behave as a single larger memory within the DPE array referred to as a composite memory. Accordingly, inclusion of two or more memory tiles in the DPE array allows for flexible formation of composite memories that may be made available to different clusters of DPE tiles based on workload and/or the particular application(s) being executed in the DPE array.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example architecture for an IC 100. IC 100 is an example of a heterogeneous device in that the device includes a plurality of different types of systems contained therein. IC 100 is also an example of a programmable IC, an adaptive system, and a System-on-Chip (SoC). In the example, IC 100 includes a plurality of different systems including a DPE array 102, programmable logic (PL) 104, a processor system (PS) 106, a Network-on-Chip (NoC) 108, a platform management controller (PMC) 110, and one or more hardwired circuit blocks 112.

In the example of FIG. 1, IC 100 is implemented on a single die provided within a single package. In other examples, IC 100 may be implemented using a plurality of interconnected dies within a single package where the various systems of IC 100 illustrated in FIG. 1 are implemented across the different interconnected dies. The particular number of dies used to form or implement IC 100 is not intended as a limitation.

DPE array 102 is formed of a plurality of different types of circuit blocks referred to as tiles. DPE array 102 includes two or more DPE tiles, one or more memory tiles, and an SoC interface that includes a plurality of interface tiles. Each type of tile of DPE array 102 is hardwired and programmable. DPE tiles are capable of performing data processing operations and operating on a large amount of data. Each DPE tile includes a core connected to a memory module. The core is capable of accessing the memory module and performing the data processing operations. In one aspect, the core is capable of executing program code. In another aspect, the core may be implemented as a custom circuit that does not execute program code. The memory module of the DPE tile is configured to store application data. DPE tiles are described herein in greater detail in connection with FIGS. 6A and 6B.

Each memory tile may include a random-access memory (RAM) and a direct memory access (DMA) engine coupled to the RAM in the same memory tile. Each DMA engine of a memory tile may be coupled to one or more RAMs of other memory tiles included in DPE array 102. Memory tiles are described herein in greater detail in connection with FIGS. 11A-11C. The SoC interface provides an interface between the DPE tiles and/or memory tiles and other systems and/or circuits of IC 100. The SoC interface and the interface tiles are described in greater detail herein in connection with FIGS. 2A-2D and 7A-7C.

PL 104 is circuitry that may be programmed to perform specified functions. As an example, PL 104 may be implemented as field programmable gate array type of circuitry. PL 104 can include an array of programmable circuit blocks. As defined herein, the term "programmable logic" means circuitry used to build reconfigurable digital circuits. Programmable logic is formed of many programmable circuit blocks that provide basic functionality. The topology of PL 104 is highly configurable unlike hardwired circuitry. Each programmable circuit block of PL 104 typically includes a programmable element 126 (e.g., a functional element) and a programmable interconnect 142. The programmable interconnects 142 provide the highly configurable topology of PL 104. The programmable interconnects 142 may be configured on a per wire basis to provide connectivity among the programmable elements 126 of programmable circuit blocks of PL 104 and is configurable on a per-bit basis (e.g., where each wire conveys a single bit of information) unlike connectivity among tiles of DPE array 102, for example.

Examples of programmable circuit blocks of PL 104 include configurable logic blocks having look-up tables and registers. Unlike hardwired circuitry described below and sometimes referred to as hardwired circuit blocks, these programmable circuit blocks have an undefined function at the time of manufacture. PL 104 may include other types of programmable circuit blocks that also provide basic and defined functionality with more limited programmability. Examples of these circuit blocks may include digital signal processing blocks (DSPs), phase lock loops (PLLs), and block random access memories (BRAMs). These types of programmable circuit blocks, like others in PL 104, are numerous and intermingled with the other programmable circuit blocks of PL 104. These circuit blocks may also have an architecture that generally includes a programmable interconnect 142 and a programmable element 126 and, as such, are part of the highly configurable topology of PL 104.

Prior to use, PL 104, e.g., the programmable interconnect and the programmable elements, must be programmed or "configured" by loading configuration data into internal configuration memory cells therein. The configuration data used to configure PL 104 may be referred to as a configuration bitstream. The configuration memory cells, once loaded with a configuration data, define how PL 104 is configured, e.g., the topology, and operates (e.g., particular functions performed).

PS 106 is implemented as hardwired circuitry that is fabricated as part of IC 100. PS 106 may be implemented as, or include, any of a variety of different processor types each capable of executing program code. For example, PS 106 may be implemented as an individual processor including one or more cores or a plurality of processors each including one or more cores. In another example, PS 106 may include one or more processors, modules, co-processors, I/O interfaces, and/or other resources. PS 106 may be implemented using any of a variety of different types of architectures. Example architectures that may be used to implement PS 106 may include, but are not limited to, an ARM processor architecture, an x86 processor architecture, a graphics processing unit (GPU) architecture, a mobile processor architecture, a DSP architecture, combinations of the foregoing architectures, or other suitable circuit architecture that is capable of executing computer-readable instructions or program code.

NoC 108 is a programmable interconnecting network for sharing data between endpoint circuits in IC 100. The endpoint circuits can be disposed in DPE array 102, PL 104, PS 106, and/or selected hardwired circuit blocks 112. NoC 108 can include high-speed data paths with dedicated switching. In an example, NoC 108 includes one or more horizontal paths, one or more vertical paths, or both horizontal and vertical path(s). The arrangement and number of regions shown in FIG. 1 is merely an example. NoC 108 is an example of a common infrastructure that is available within IC 100 to connect selected components and/or systems.

Nets that are to be routed through NoC 108 are unknown until a design is created for implementation within IC 100. NoC 108 may be programmed by loading configuration data into internal configuration registers that define how elements within NoC 108, such as switches and interfaces, are configured and operate to pass data from switch to switch and among the NoC interfaces to connect the endpoint circuits. NoC 108 is fabricated as part of IC 100 (e.g., is hardwired) and, while not physically modifiable, may be programmed to establish connectivity between different master circuits and different slave circuits of a user circuit design. NoC 108, upon power-on, may not implement any data paths or routes therein. NoC 108 may be configured by a master circuit such as PMC 110 to implement data paths or routes between endpoint circuits of IC 100. In another aspect, NoC 108, upon power-on, may include one or more default data paths implemented therein, where a master circuit may reconfigure such data paths and/or program NoC 108 to add additional data paths between endpoint circuits.

PMC 110 is responsible for managing IC 100. PMC 110 is a system within IC 100 that is capable of managing the other programmable circuit resources across the entirety of IC 100. PMC 110 is capable of maintaining a safe and secure environment, booting IC 100, and managing IC 100 during normal operations. For example, PMC 110 is capable of providing unified and programmable control over power-up, boot/configuration, security, power management, safety monitoring, debugging, and/or error handling for the different systems of IC 100 such as DPE array 102, PL 104, PS 106, and NoC 108. PMC 110 operates as a dedicated platform manager that decouples PS 106 from PL 104. As such, PS 106 and PL 104 may be managed, configured, and/or powered on and/or off independently of one another.

In one aspect, PMC 110 may be implemented as a processor with dedicated resources. PMC 110 is capable of operating as a Root-of-Trust for the entirety of IC 100. As an example, PMC 110 is capable of authenticating and/or validating device images containing configuration data for any of the programmable resources of IC 100 that may be loaded into IC 100. PMC 110 further is capable of protecting IC 100 against tampering during operation. By operating as the Root-of-Trust for IC 100, PMC 110 is capable of monitoring operation of PL 104, PS 106, and/or any other programmable circuit resources that may be included in IC 100. The Root-of-Trust capabilities, as performed by PMC 110, are distinct and separate from PS 106 and PL 104 and/or any operations performed by the PS 106 and/or PL 104.

Hardwired circuit blocks 112 are special-purpose circuit blocks fabricated as part of IC 100. Though hardwired, hardwired circuit blocks 112 may be configured by loading configuration data into control registers to implement one or more different modes of operation. Examples of hardwired circuit blocks 112 may include input/output (I/O) blocks, transceivers for sending and receiving signals to circuits and/or systems external to IC 100, memory controllers, or the like. Examples of different I/O blocks may include single-ended and pseudo differential I/Os. Examples of transceivers may include high-speed differentially clocked transceivers. Other examples of hardwired circuit blocks 112 include, but are not limited to, cryptographic engines, digital-to-analog converters (DACs), analog-to-digital converters (ADCs), and the like. In general, hardwired circuit blocks 112 are application-specific circuit blocks.

The various programmable circuit resources illustrated in FIG. 1 may be programmed initially as part of a boot process for IC 100. During runtime, the programmable circuit resources may be reconfigured. In one aspect, PMC 110 is capable of initially configuring DPE array 102, PL 104, PS 106, and NoC 108. At any point during runtime, PMC 110 may reconfigure all or a portion of IC 100. In some cases, PS 106 may configure and/or reconfigure PL 104 and/or NoC 108 once initially configured by PMC 110.

It should be appreciated that the example architecture illustrated in FIG. 1 is provided for purposes of illustration and not limitation. In this regard, IC 100 may include fewer systems or more systems that shown in FIG. 1. In one or more example implementations, IC 100 may omit PMC 110 and rely on PS 106 to perform certain operations otherwise performed by PMC 110. In other example implementations, IC 100 may include DPE array 102 in combination with any one or more of the other systems described herein. In still another example implementation, IC 100 may be implemented to include DPE array 102 without any other systems.

Figure 2A:
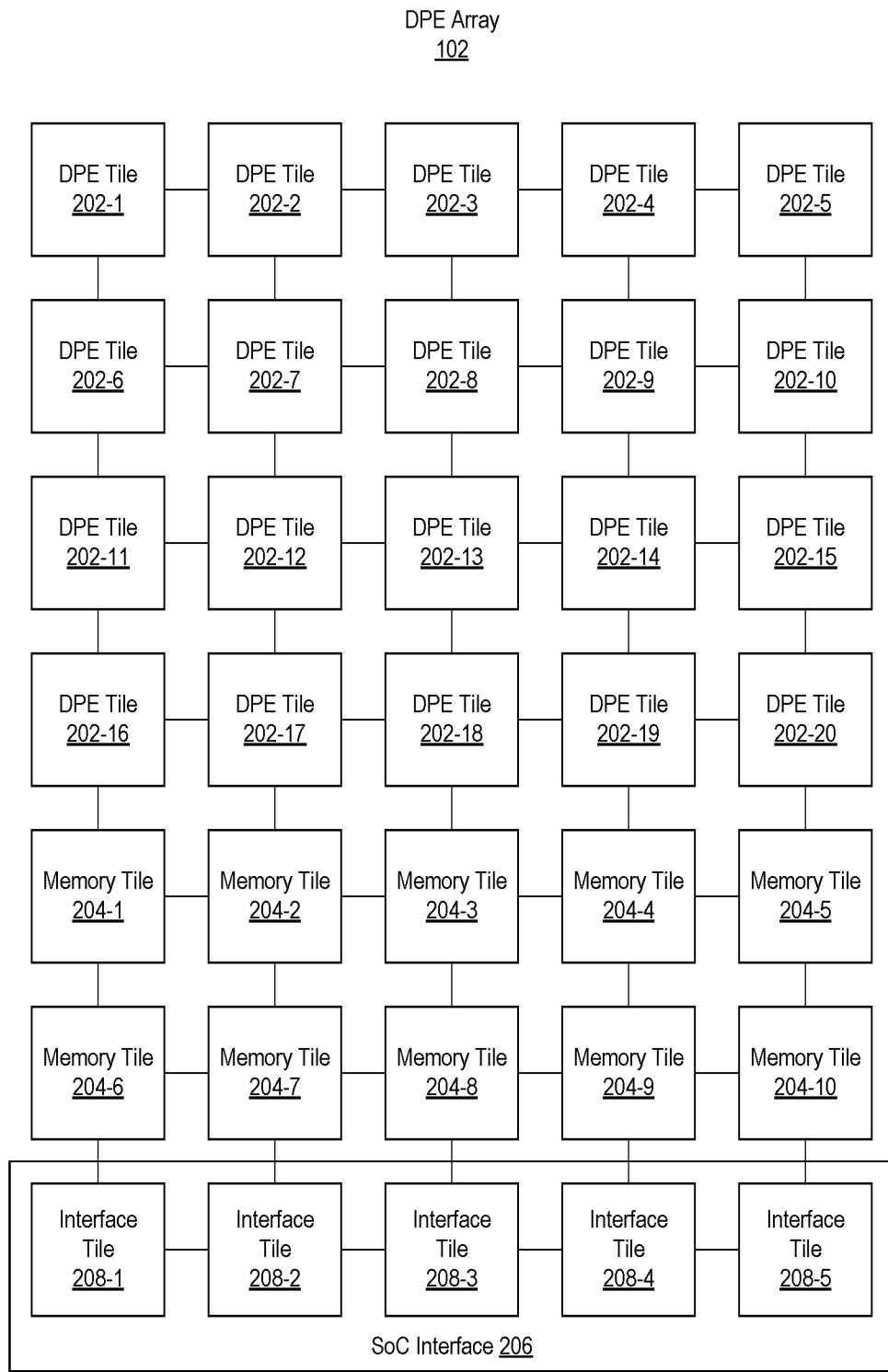
FIGS. 2A, 2B, 2C, and 2D illustrate different example implementations of a data processing engine (DPE) array.

FIGS. 2A-2D illustrate different example implementations of DPE array 102. In the example of FIG. 2A, DPE array 102 includes a plurality of DPE tiles 202 arranged in a gird having rows and columns. DPE array 102 also includes a plurality of memory tiles 204. For purposes of illustration, memory tiles 202 are grouped into two rows, where the individual memory tiles 202 in each row are aligned with the columns of the grid arrangement. DPE array 102 further includes SoC interface 206. SoC interface 206 includes interface tiles 208 arranged in a row where the individual tiles 208 are aligned with the columns of the grid arrangement of DPE array 102.

Within this disclosure, the term "tile" as used in reference to DPE array 102, refers to DPE tiles 202, memory tiles 204, and/or interface tiles 208. In the example of FIG. 2A, each row of tiles of the grid is homogenous in that each row includes only DPE tiles 202, only memory tiles 204, or only interface tiles 208. The rows of like tiles are grouped together or adjacent to one another. For example, all rows of DPE tiles 202 are grouped together without any rows of other tile types intervening. Similarly, all rows of memory tiles 204 are grouped together without any rows of other tile types intervening.

The columns of the grid are heterogeneous in that each column includes different types of tiles. Each column includes a plurality of DPE tiles 202, a plurality of memory tiles 204, and an (e.g., one) interface tile 208. In the example of FIG. 2A, the particular number of rows and/or columns included in the grid arrangement is not intended as a limitation. DPE array 102 may include fewer or more rows of DPE tiles 202, fewer or more rows of memory tiles 204, and/or fewer or more columns of tiles.

Figure 2B:
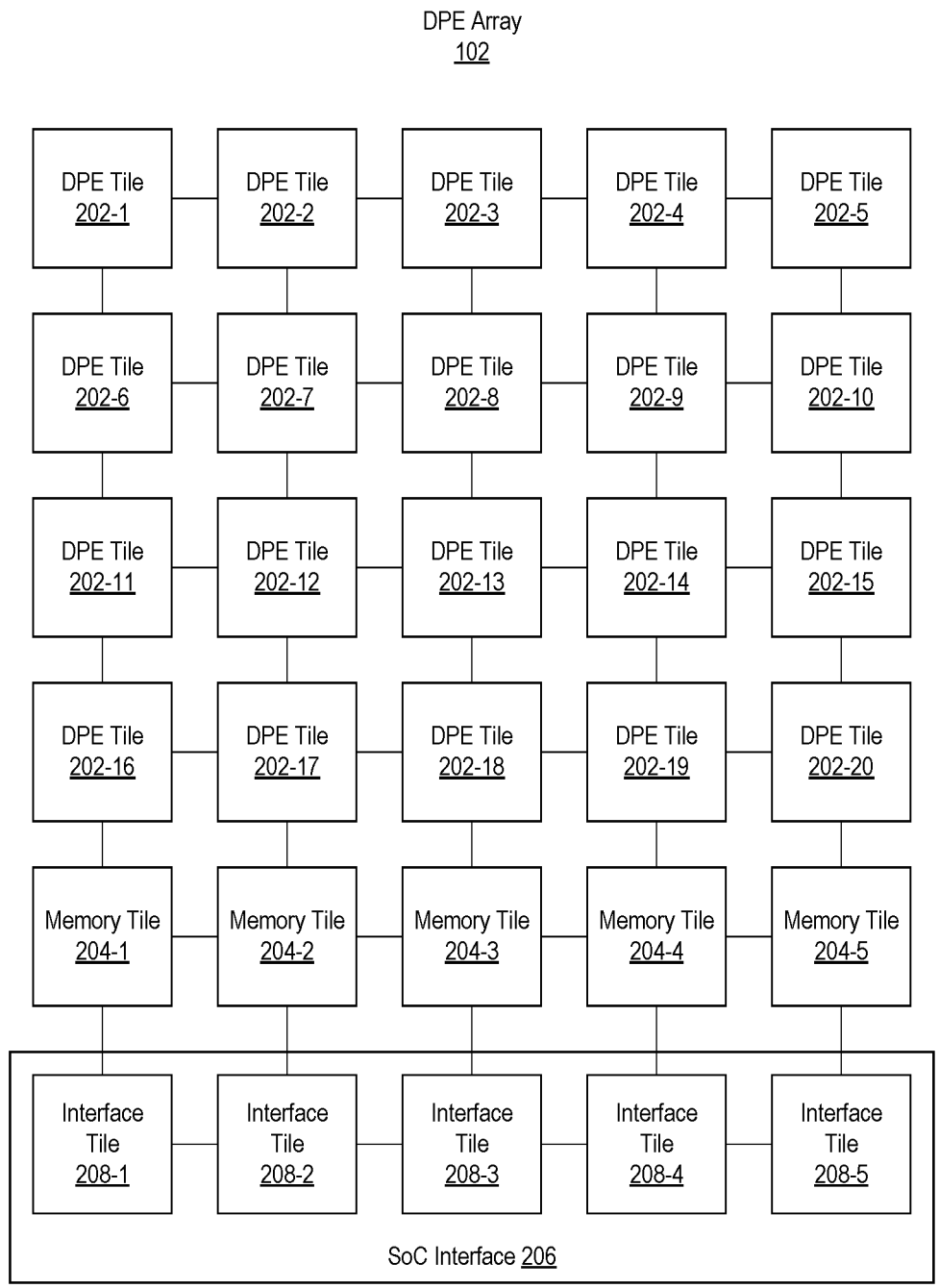

The example of FIG. 2B is similar to that of FIG. 2A. In the example of FIG. 2B, only one row of memory tiles 204 is included. Still, in FIG. 2B, like the example of FIG. 2A, each row of tiles of the grid is homogenous in that each row includes only DPE tiles 202, only memory tiles 204, or only interface tiles 208. The columns of the grid are heterogeneous in that each column includes different types of tiles. Each column includes, a plurality of DPE tiles 202, one memory tile 204, and an (e.g., one) interface tile 208. In the example of FIG. 2B, the particular number of rows and/or columns included in the grid arrangement is not intended as a limitation. DPE array 102 may include fewer or more rows of DPE tiles 202, fewer or more rows of memory tiles 204, and/or fewer or more columns of tiles.

In the examples of FIGS. 2A and 2B, the rows of memory tiles 204 may be located in different locations or positions within the grid arrangement than shown. For example, a row or a group of two or more rows of memory tiles 204 may be located at the top of the grid arrangement, at the bottom of the grid arrangement (e.g., between SoC interface 206 and any rows of DPE tiles 202), between selected rows of DPE tiles 202, or any combination thereof. Further, DPE array 102 may include multiple rows or groups of rows of memory tiles 204 where each such row or group of rows of memory tiles 204 is separated from another row or group of rows of memory tiles 204 by one or more intervening tiles of another type.

Figure 2C:
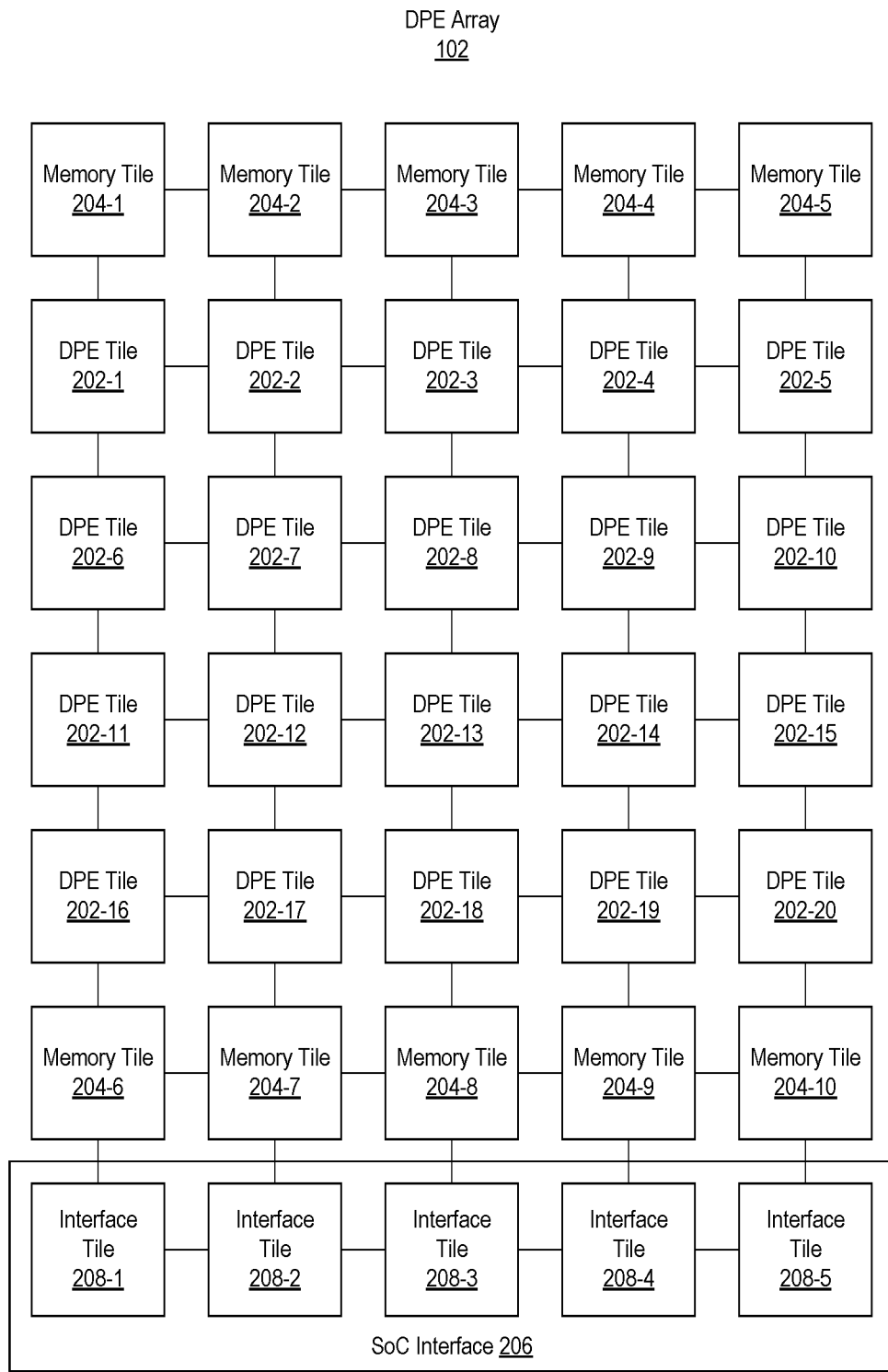

The example of FIG. 2C is similar to that of FIG. 2A. In the example of FIG. 2C, the rows of memory tiles 204 are not grouped together. As shown, one row of memory tiles is positioned at the top of the grid arrangement while a second row of memory tiles 204 is positioned toward the bottom of the grid arrangement between DPE tiles 202 and the row of interface tiles 208. It should be appreciated that more than one row of memory tiles 204 may be positioned between DPE tiles 202 and SoC interface 206 and/or at the top of the grid arrangement. For example, two or more rows of memory tiles 204 may be positioned at the top of the grid, while two or more rows of memory tiles 204 may also be positioned toward the bottom. Further, depending on the size of DPE array 102, additional rows or groups of two or more rows of memory tiles 204 may be included between other rows of DPE tiles 202. In one example, rows of DPE tiles 202 and rows of memory tiles 204 may alternate. In another arrangement, groups of two or more rows of DPE tiles 202 may alternate with groups of two or more rows of memory tiles. For example, DPE array 102 may be formed of 2, 3, 4, etc. rows of DPE tiles 202, followed by 2, 3, or 4, etc. rows of memory tiles 204 below, in a repeating pattern.

Figure 2D:
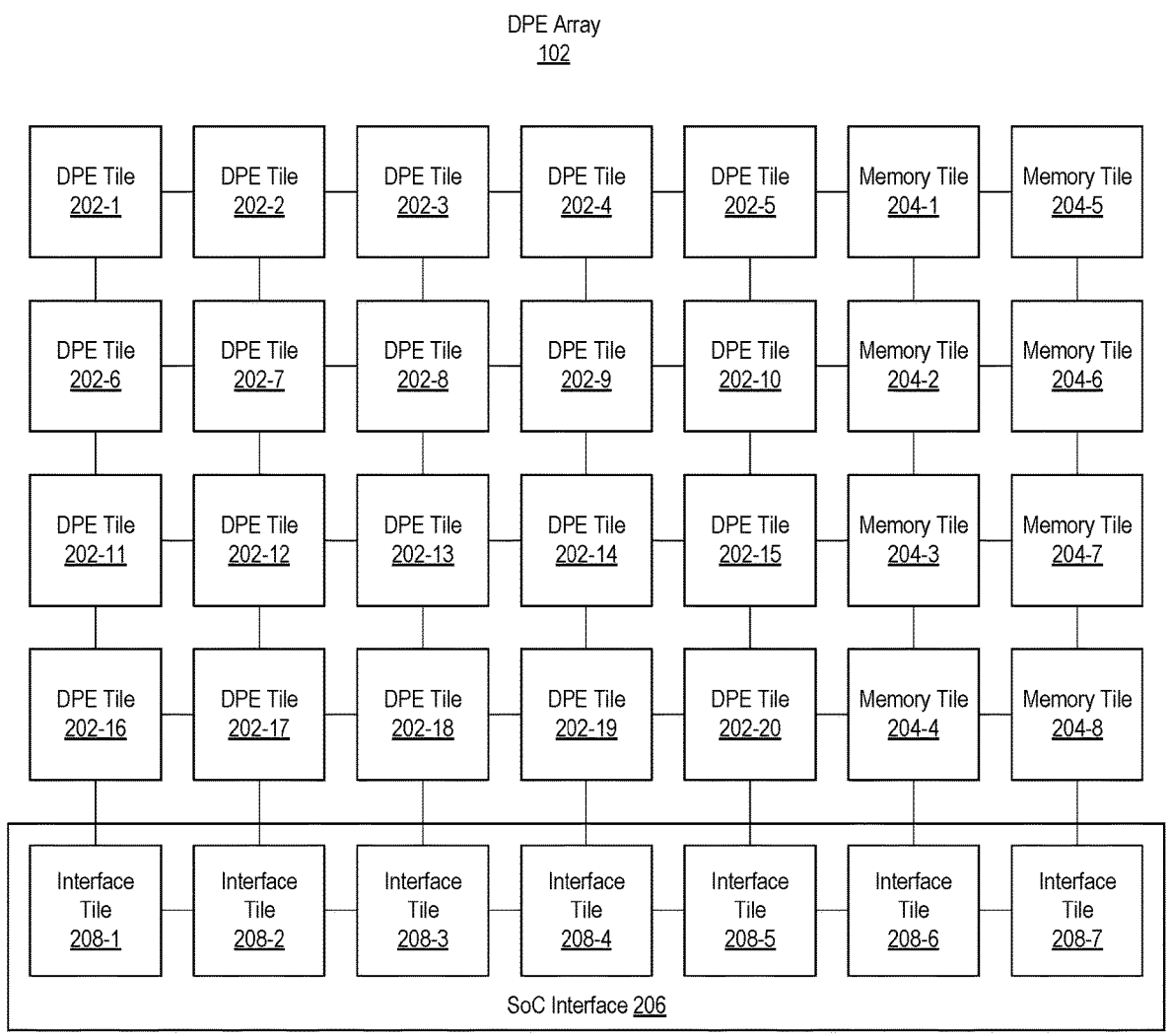

In the example of FIG. 2D, memory tiles 204 are arranged in columns as opposed to rows. As such, in the example of FIG. 2D, each row that includes one or more DPE tiles 202 also includes one or more memory tiles 204. Columns are still heterogeneous in that each column includes either a DPE tile 202 and an interface tile 208 or a memory tile 204 and an interface tile 208. Accordingly, above each interface tile 208, the column includes only DPE tiles 202 or only memory tiles 204 as opposed to a combination of both.

In the example, two columns of memory tiles 204 are shown. In other example implementations, fewer or more columns of memory tiles 204 may be included. Further, the columns of memory tiles 204 may be located in different positions of the grid arrangement than shown. For example, a column or a group of two or more columns of memory tiles 204 may be located at the left edge of the grid arrangement, at the right edge of the grid arrangement, between selected columns of DPE tiles 202, or any combination thereof. In an example, the columns may alternate between one or more columns including DPE tiles 202 and an interface tile 208 and one or more columns including memory tiles 204 and an interface tile 208.

In the examples of FIGS. 2A-2D, memory tiles 204 are organized such that memory tiles 204 are placed in columns or rows. In one or more other example implementations, individual memory tiles 204 or groups of memory tiles 204 may be interspersed among DPE tiles 202. For example, a cluster of a plurality of memory tiles 204 may be placed in the middle of DPE array 102 with DPE tiles 202 surrounding the cluster of memory tiles 204. In another example, memory tiles 204 may interspersed with DPE tiles 202 so that one or more columns and/or rows are formed of alternating DPE tiles 202 and memory tiles 204. In a particular example, the grid arrangement may be organized with a checkerboard organization where each row and column is formed of alternating DPE tiles 202 and memory tiles 204.

Figure 3:
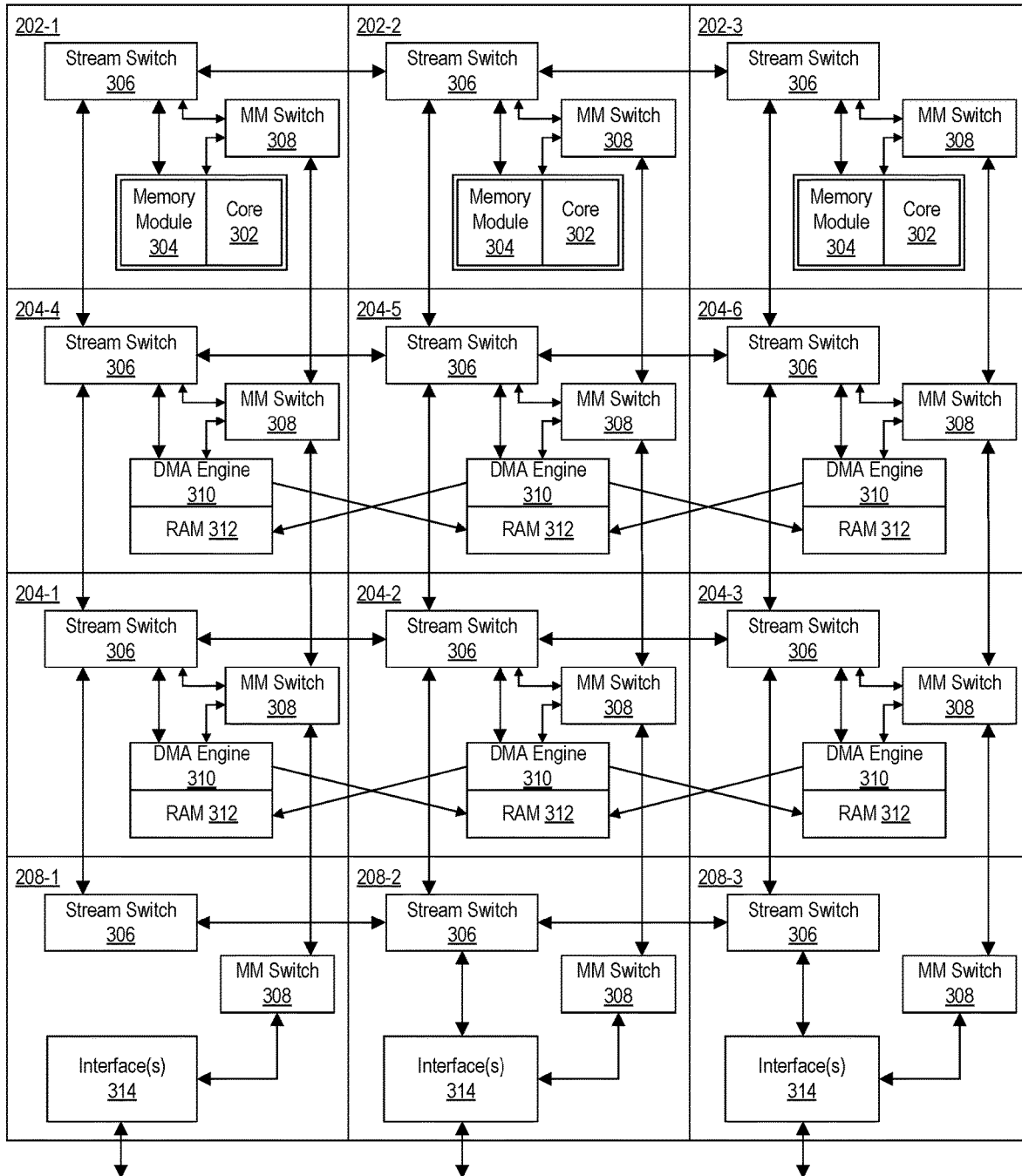
FIG. 3 illustrates another example implementation of a DPE array.

FIG. 3 illustrates another example implementation of a DPE array 102. DPE array 102 includes DPE tiles 202, memory tiles 204, and interface tiles 208. Interface tiles 208, taken collectively, form SoC interface 206. In the example of FIG. 3, fewer tiles are shown for ease of illustration. Further, some connections between components and/or tiles are omitted for ease of illustration.

In the example of FIG. 3, each tile, e.g., each DPE tile 202, memory tile 204, and interface tile 208, includes a stream switch 306 and a memory mapped (MM) switch 308. Each stream switch 306 is connected to the stream switch of an adjacent tile. For example, each stream switch 306 is connected to the stream switch 306 of the above adjacent tile, the stream switch of the below adjacent tile, the stream switch of the left adjacent tile, and the stream switch of the right adjacent tile so long as such an adjacent tile exists in DPE array 102. Stream switches 306 implement a packet-switched network in DPE array 102 over which application data is conveyed. In general, stream switches 306 are programmable to establish logical connections with other stream switches to form clusters of tiles that communicate application data during operation. Application data includes data that is operated on or generated by a tile of DPE array 102 during runtime.

MM switches 308 are coupled vertically in columns. That is, each MM switch 308 is connected to the MM switch 308 of the above adjacent tile and the MM switch 308 of the below adjacent tile so long as such an adjacent tile exists in DPE array 102. MM switches 308 may be used to read and/or write to any control registers and/or memories included in tiles of DPE array 102. In this regard, MM switches 308 form a memory mapped network that is used to convey configuration data to tiles of DPE array 102. Configuration data is data that is loaded into control registers of tiles of DPE array 102 for purposes of configuring the tile to implement particular connectivity with other tiles and/or enable/disable particular functionality of the tile. Configuration data may also include data written to memories of tiles for initialization. Configuration data is to be distinguished from application data.

A master circuit within IC 100, for example, is capable of reading and/or writing to any memory and/or registers of DPE array 102 coupled to a MM switch 308. Though not shown, each of tiles 202, 204, and 208 includes control registers that may be read and written by way of MM switches 308 thereby allowing each such tile to be programmed with configuration data.

Each DPE tile 202 further includes a core 302 and a memory module 304. Each memory tile 204 further includes a DMA engine 310 and a RAM 312. In the example of FIG. 3, each DMA engine 310 is capable of accessing (e.g., reading and/or writing) the RAM 312 included within the same memory tile 204. Depending on the configuration data loaded into each memory tile 204, as performed using MM switches 308, the DMA engine 310 of a given memory tile 204 is also capable of reading and/or writing to the RAM 312 of an adjacent memory tile 204 as pictured.

Each interface tile 208 also includes one or more interfaces 314. In the example of FIG. 3, interface(s) 314 are capable of connecting to other systems and/or circuits of IC 100. For purposes of illustration, interface(s) 314 are capable of coupling to NoC 108, to PL 104, to PS 106, to PMC 110, and/or to hardwired circuit blocks 112. Interface tiles 208 are capable of conveying data, whether application data via stream switches 306 or configuration data via MM switches 308, to the tiles located above each respective interface tile 208. Further, interface tiles 208 are configurable by loading configuration data into control registers of each respective interface tile 208 by way of MM switches 308.

Figure 4:
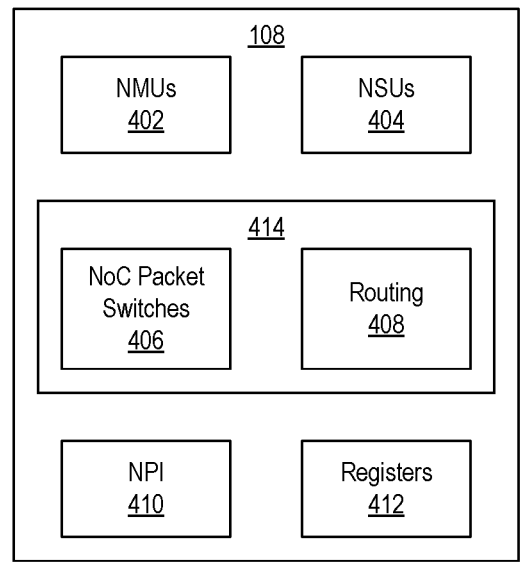
FIG. 4 illustrates an example implementation of a Network-on-Chip (NoC).

FIG. 4 illustrates an example implementation of NoC 108. NoC 108 includes NoC master units (NMUs) 402, NoC slave units (NSUs) 404, a network 414, and registers 412. NMUs 402 and NSUs 404 are capable of connecting to endpoint circuits. Endpoint circuits coupled to NMUs 402 and NSUs 404 can be hardwired circuit blocks 112, circuits implemented in PL 104, components in PS 106, and/or DPE tiles 202 or memory tiles 204 in DPE array 102. A given endpoint circuit can be coupled to more than one NMU 402 or more than one NSU 404.

NMUs 402 are capable of originating transactions, e.g., reads and writes, on NoC 108 while NSUs 404 respond to the transactions originated by NMUs 402. NMUs 402 are connected to NSUs 404 through network 414. In an example, network 414 includes NoC packet switches (NPSs) 406 and routing 408 between NPSs 406. Each NPS 406 performs switching of NoC packets. NPSs 406 are connected to each other and to NMUs 402 and NSUs 404 through routing 408 to implement a plurality of physical channels. NPSs 406 also support multiple virtual channels per physical channel.

NMUs 402, NSUs 404, and NPSs 406 can include registers 412 that determine the functionality thereof. Registers 412 in NoC 108 support interrupts, Quality of Service (QoS), error handling and reporting, transaction control, power management, and address mapping control. Registers 412 can be initialized in a usable state before being reprogrammed. Subsequent to initialization, registers 412 may be reprogrammed by writing to registers 412 using write requests. Configuration data for NoC 108 can be loaded into IC 100 for programming NoC 108 and/or other endpoint circuits.

Figure 5:
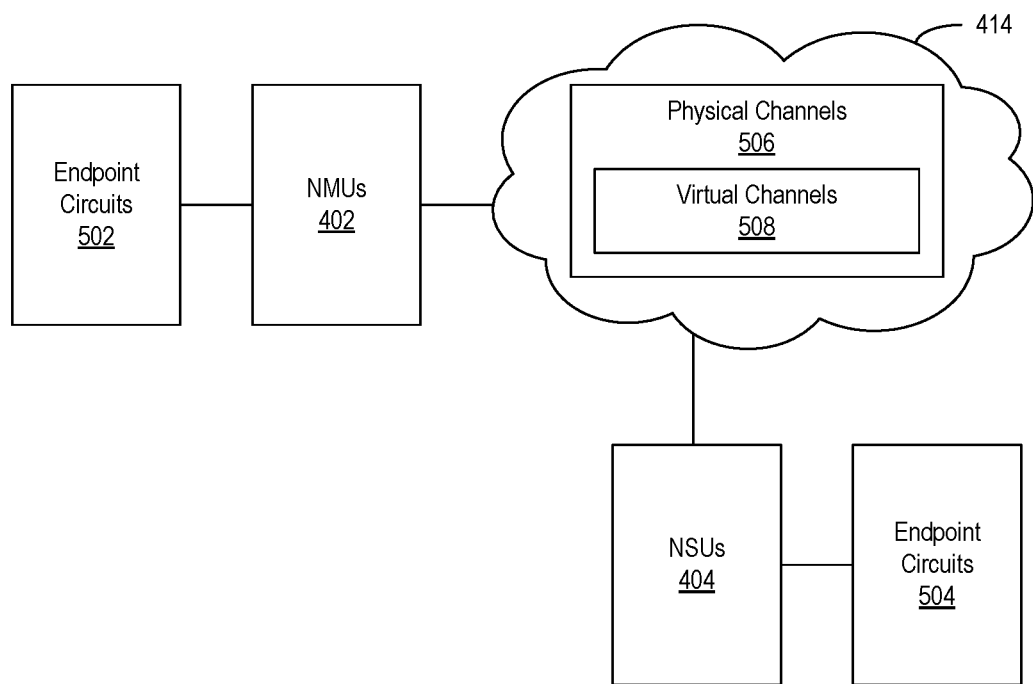
FIG. 5 illustrates example connections between endpoint circuits in the IC of FIG. 1 through a NoC.

FIG. 5 is a block diagram depicting connections between endpoint circuits in IC 100 through NoC 108 according to an example. In the example, endpoint circuits 502 are connected to endpoint circuits 504 through NoC 108. Endpoint circuits 502 are master circuits, which are coupled to NMUs 402 of NoC 108. Endpoint circuits 504 are slave circuits coupled to NSUs 404 of NoC 108. Each endpoint circuit 502 and 504 can be a circuit in PS 106, a DPE tile 202 in DPE array 102, a memory tile 204 in DPE array 102, a circuit in a region of PL 104, or a hardwired circuit block 112.

Network 414 includes a plurality of physical channels 506. Physical channels 506 are implemented by programming NoC 108. Each physical channel 506 includes one or more NPSs 406 and associated routing 408. An NMU 402 connects with an NSU 404 through at least one physical channel 506. A physical channel 506 can also have one or more virtual channels 508. Connections through network 414 use a master-slave arrangement. In an example, the most basic connection over network 414 includes a single master connected to a single slave. However, in other examples, more complex structures can be implemented.

Figure 6A:
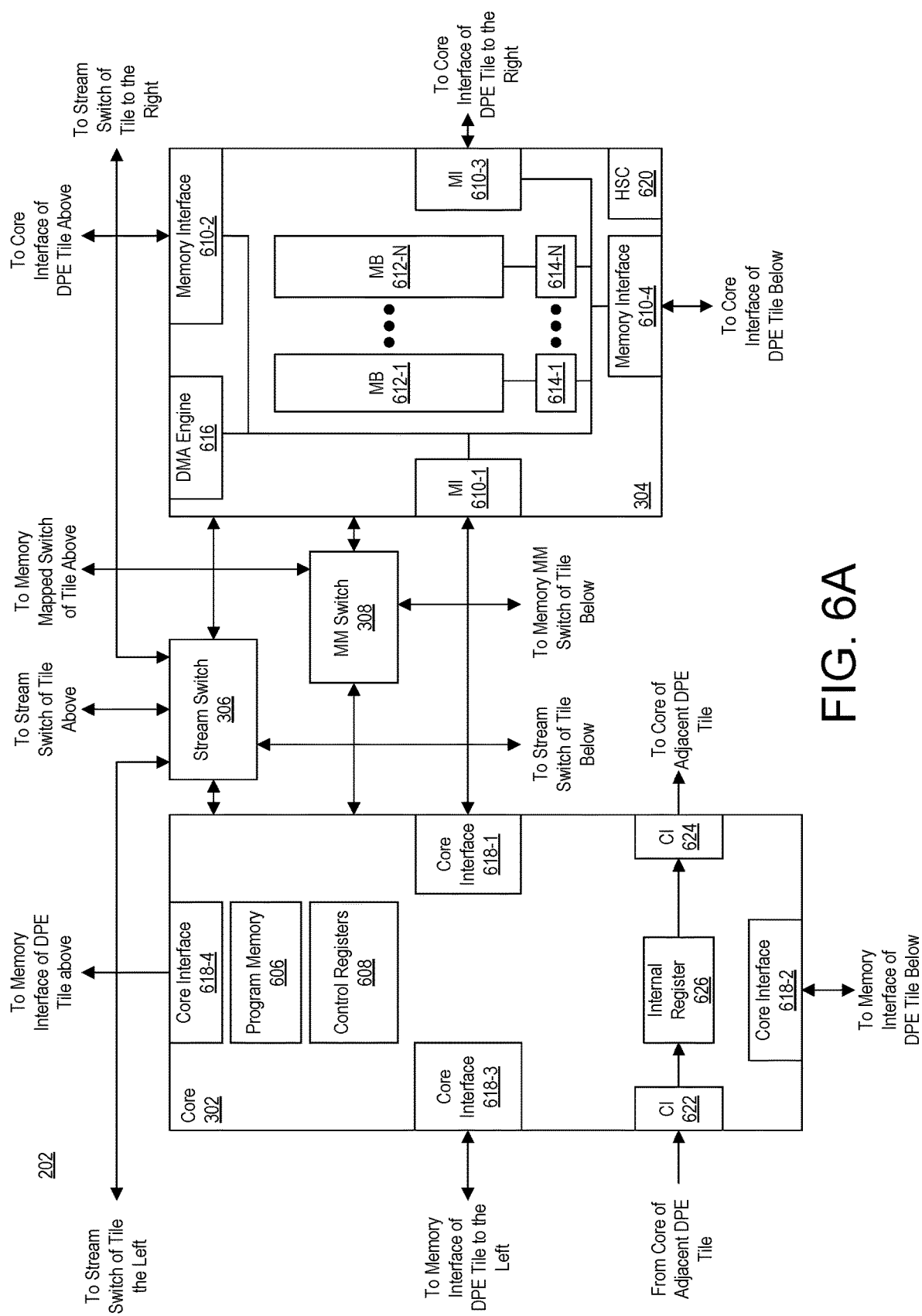
FIGS. 6A and 6B illustrate an example architecture for a DPE tile of a DPE array.
Figure 6B:
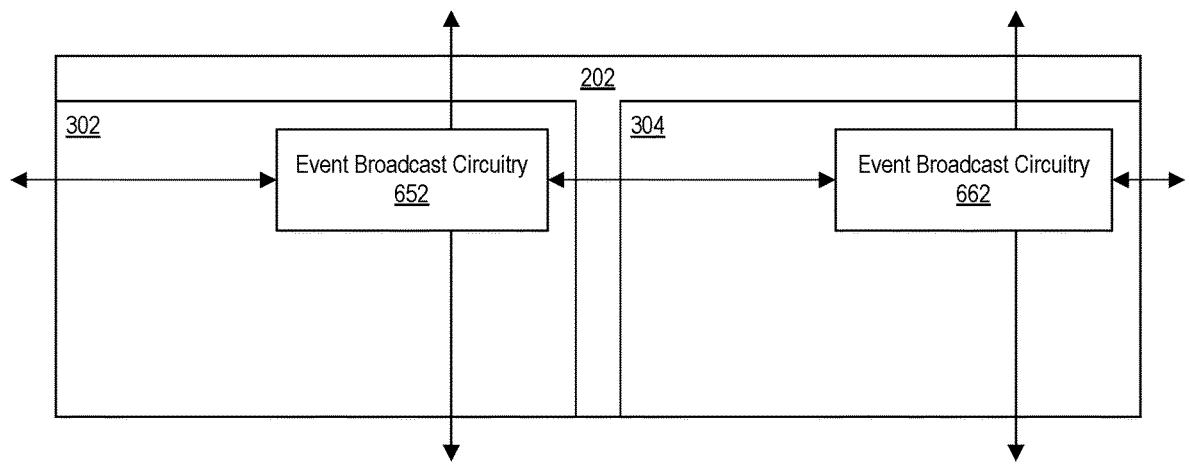

FIGS. 6A and 6B illustrate an example architecture for a DPE tile 202 of DPE array 102. For purposes of discussion, FIGS. 6A and 6B may be referred to collectively as "FIG. 6." Referring to FIG. 6A, DPE tile 202 includes core 302 and memory module 304. DPE tile 202 further includes stream switch 306 and MM switch 308.

Core 302 provides the data processing capabilities of DPE tile 202. Core 302 may be implemented as any of a variety of different processing circuits. In the example of FIG. 6A, core 302 includes an optional program memory 606. In one or more example implementations, core 302 is implemented as a processor that is capable of executing program code, e.g., computer readable instructions. Program memory 606 is capable of storing instructions that are executed by core 302. Core 302, for example, may be implemented as a CPU, a GPU, a DSP, a vector processor, or other type of processor that is capable of executing instructions. The core may be implemented using any of the various CPU and/or processor architectures described herein. In another example, core 302 is implemented as a very long instruction word (VLIW) vector processor or DSP.

Program memory 606 may be implemented as a dedicated program memory that is private to the core 302. Program memory 606 may only be used by the core of the same DPE tile 202. Thus, program memory 606 may only be accessed by core 302 and is not shared with any other DPE tile 202 or component of any other DPE tile 202 in DPE array 102. Program memory 606 may include a single port for read and write operations and is addressable using the memory mapped network of DPE array 102 via MM switch 308. Via MM switch 308, for example, program memory 606 may be loaded with program code by a master circuit external to DPE array 102. The program code loaded into program memory 606 may be executed by core 302.

In one or more example implementations, core 302 may have a customized architecture to support an application-specific instruction set. For example, core 302 may be customized for wireless applications and be configured to execute wireless-specific instructions. In another example, core 302 may be customized for machine learning and be configured to execute machine learning-specific instructions.

In one or more other example implementations, core 302 is implemented as hardwired circuitry such as a hardened Intellectual Property (IP) core that is dedicated for performing a particular operation or operations. In that case, core 302 may not execute program code. In implementations where core 302 does not execute program code, program memory 606 may be omitted. As an illustrative and non-limiting example, core 302 may be implemented as a hardened forward error correction (FEC) engine or other circuit block.

In some example implementations, different DPE tiles 202 may include different types of cores 302. For example, one or more cores 302 may be implemented to execute program code while cores 302 of other DPE tiles 202 are incapable of executing program code. In any case, each core 302 is configured to perform computations whether through execution of program code/instructions or not and may include an internal register or registers 626 that may be used with the cascade connectivity described within this disclosure.

Core 302 may include control registers 608. Control registers 608 may be loaded with configuration data to control operation of DPE tile 202. For example, configuration data loaded into control registers 608 are capable of configuring and/or controlling operation of core 302, memory module 304, stream switch 306, and cascade interfaces 622, 624 of DPE tile 202 to be described herein in greater detail. In one or more example implementations, DPE tile 202 may be activated and/or deactivated, e.g., as a whole, based upon configuration data loaded into control registers 608. Similarly, core 302 may be activated and/or deactivated based upon configuration data loaded into control registers 608. Core 302 may be activated and/or deactivated independently of memory module 304 so that memory module 304 may be accessed by one or more other cores. In the example of FIG. 6A, control registers 608 are addressable (e.g., may be read and/or written) via the memory mapped network through MM switch 308. Deactivation refers to placing the circuit block in a low power mode or disconnecting power (e.g., a supply voltage) from the circuit block. Deactivating a particular component or DPE tile 202 renders the component or tile inoperable until activated.

In one or more example implementations, memory module 304 is capable of storing data that is used by and/or generated by core 302, which is referred to herein as application data. Memory module 304 may include a read/write memory such as a RAM. Accordingly, memory module 304 is capable of storing data that may be read and consumed by core 302. Memory module 304 is also capable of storing data (e.g., results) that are written by core 302.

In one or more other example implementations, memory module 304 is capable of storing data, e.g., application data, that may be used by and/or generated by one or more other cores 302 of other DPE tiles 202 within DPE array 102. One or more other cores 302 of DPE tiles 202 may also read from and/or write to memory module 304. In particular example implementations, the other cores 302 that may read from and/or write to memory module 304 may be cores 302 of one or more adjacent DPE tiles 202. Two tiles are adjacent when the tiles share a border with one another. By allowing core 302 of FIG. 6A and one or more other cores 302 from adjacent DPE tiles (e.g., DPE tiles adjacent above, adjacent below, and adjacent to the right and/or left the subject DPE tile 202) to read and/or write to memory module 304, memory module 304 implements a shared memory that supports communication among the different DPE tiles 202 and/or cores 302 capable of accessing memory module 304.

As noted, DPE array 102 may include a plurality of different and independent networks sometimes referred to as "DPE interconnect circuitry." A stream network is formed of stream switches 306 for exchanging application data. As pictured, stream switch 306 of DPE tile 202 of FIG. 6A is coupled to the stream switches of adjacent tiles to the left, right, above, and below. The tiles may include one or more other DPE tiles 202, an interface tile 208, one or more memory tiles 204, or any combination thereof depending on the grid arrangement of DPE array 102.

Stream switch 306 is coupled to core 302 and is capable of communicating with core 302. Core 302, for example, includes a stream interface that connects to stream switch 306 thereby allowing core 302 to communicate directly with other tiles of DPE array 102 via the DPE interconnect circuitry. For example, core 302 may include instructions or hardwired circuitry that enable core 302 to send and/or receive application data directly to such other tiles via stream switch 306.

Stream switch 306 is coupled to memory module 304 and is capable of communicating with memory module 304. Memory module 304, for example, includes a stream interface that connects to stream switch 306 thereby allowing other tiles of DPE array 102 to communicate with memory module 304 of FIG. 6A via the DPE interconnect circuitry. In general, stream switches 306 facilitate communication between non-adjacent tiles of DPE array 102. For example, via stream switches 306, cores and/or memory modules of other DPE tiles 202 that are not directly connected to a memory interface of memory module 304 of FIG. 6A or a core interface of core 302 of FIG. 6A are able to communicate with the core 302 and/or memory module 304 of FIG. 6A via the DPE interconnect circuitry. As such, core 302 of FIG. 6A and/or memory module 304 of FIG. 6A are also capable of communicating with any of the tiles within DPE array 102 via the stream switches of the DPE interconnect circuitry whether such other tiles are adjacent or not.

Stream switch 306 may also be used to communicate with other systems such as PL 104, NoC 108, hardwired blocks 112, or other circuit blocks described herein. In general, stream switch 306 may be programmed to operate as a circuit-switching stream interconnect or a packet-switched stream interconnect. A circuit-switching stream interconnect is capable of implementing point-to-point, dedicated streams that are suitable for high-bandwidth communication among tiles of DPE array 102. A packet-switching stream interconnect allows streams to be shared to time-multiplex multiple logical streams onto one physical stream for medium bandwidth communication.

Stream switch 306 may be configured via control registers 608. The configuration data loaded into control registers 608, for example, dictates which other DPE tiles 202 and/or systems of IC 100 the DPE tile 202 of FIG. 6A will communicate with and whether such communications are established as circuit-switched point-to-point connections or as packet-switched connections.

A memory mapped network is capable of exchanging data such as configuration, control, and/or debugging data for DPE tile(s) 202. The memory mapped network is formed of MM switches 308. Each component of DPE tile 202 of FIG. 6 that may be read and/or written, e.g., control registers 608, program memory 606, memory module 304, and event broadcast circuitry (e.g., FIG. 6B) may be read or written using MM switch 308. MM switch 308 may also be used to exchange configuration, control, and debugging data for other types of tiles of DPE array 102. In the example of FIG. 6A, MM switch 308 is capable of receiving configuration data that is used to configure DPE tile 202. MM switch 308 may receive configuration data from a MM switch of a tile of DPE array 102 located below DPE tile 202 of FIG. 6A. MM switch 308 is capable of forwarding received configuration data to one or more other MM switches in tiles of DPE array 102 above DPE tile 202 of FIG. 6A, to core 302 of FIG. 6A (e.g., to program memory 606 and/or to control registers 608), and/or to memory module 304 of FIG. 6A (e.g., to memory within memory module 304 for initialization). Thus, MM switch 308 of FIG. 6A communicates with a MM switch of an adjacent tile of DPE array 102 below and/or with a MM switch of an adjacent tile of DPE array 102 above.

Control registers 608 of the respective DPE tiles 202 may be programmed by loading configuration data through the respective MM switches 308. Through configuration, the stream switches 306 are programmed to establish connections, whether packet-switched or circuit-switched, with other endpoints, whether in one or more other DPE tiles 202, memory tiles 204, and/or interface tiles 208.

MM switch 308 of FIG. 6A, in combination with memory mapped switches of other tiles of DPE array 102, implement a shared, transaction switched network where transactions propagate from MM switch to MM switch. Each of the MM switches 308, for example, is capable of dynamically routing transactions based upon addresses. MM switch 308 allows other systems of IC 100 to access resources (e.g., components) of tiles of DPE array 102. For example, DPE array 102 may be mapped to the address space of a processor (e.g., a processor of PS 106 or PMC 110). Accordingly, any control registers and/or memories within a tile of DPE array 102 may be accessed via a MM interface. For example, memory in memory module 304, program memory 606, and/or control registers 608 may be read and/or written via MM switches 308 in the respective DPE tiles 202.

In the example of FIG. 6A, memory module 304 includes a plurality of memory interfaces 610-1, 610-2, 610-3, and 610-4. Within FIG. 6A, memory interfaces 610-1 and 610-2 are abbreviated as "MI." Memory module 304 further includes a plurality of memory banks 612-1 to 612-N. In particular example implementations, memory module 304 includes eight memory banks 612. In other example implementations, memory module 304 may include fewer or more memory banks 612. In the example of FIG. 6A, each of memory banks 612-1 through 612-N has a respective arbitration circuit 614-1 through 614-N. Each arbitration circuit 614 may include arbitration logic. Further, each arbitration circuit 614 may include a crossbar. Accordingly, any master is capable of writing to any particular one or more of memory banks 612.

Memory module 304 may include a memory mapped interface (not shown) that communicates with MM switch 308. The memory mapped interface in memory module 304 may be connected to the communication lines in memory module 304 that couple to a DMA engine 616, memory interfaces 610, and arbitration circuits 614 in order to read from and/or write to memory banks 612.

DMA engine 616 may include two or more interfaces. For example, one or more interfaces are capable of receiving input data streams from other tiles of DPE array 102 via stream switch 306 and writing the received data to memory banks 612. One or more other interfaces are capable of reading data from memory banks 612 and sending the data out via a stream interface of DMA engine 616 to other tiles of DPE array 102 via stream switch 306.

Memory module 304 is capable of operating as a shared memory that may be accessed by a plurality of different DPE tiles 202. In the example of FIG. 6A, memory interface 610-1 is coupled to core 302 via a core interface 618-1 included in core 302. Memory interface 610-1 provides core 302 with access (e.g., read and write capability) to memory banks 612 through arbitration circuits 614. Memory interface 610-2 is coupled to a core interface of a DPE tile of DPE array 102 adjacent above DPE tile 202 of FIG. 6A. Memory interface 610-2 provides the core of the DPE tile adjacent above DPE tile 202 of FIG. 6A with access to memory banks 612. Memory interface 610-3 is coupled to a core interface of a DPE tile of DPE array 102 to the adjacent right of DPE tile 202 of FIG. 6A. Memory interface 610-3 provides the core of the DPE tile to the adjacent right of DPE tile 202 of FIG. 6A with access to memory banks 612. Memory interface 610-4 is coupled to a core interface of the DPE tile of DPE array 102 adjacent below DPE tile 202 of FIG. 6A. Memory interface 610-4 provides the core 302 of the DPE tile 202 adjacent below DPE 202 of FIG. 6A with access to memory banks 612.

Core 302 is capable of accessing memory modules of other neighboring DPE tiles via core interfaces 618-2, 618-3, and 618-4. In the example of FIG. 6A, core interface 618-2 is coupled to a memory interface of the DPE tile adjacent below DPE tile 202 of FIG. 6A. Accordingly, core 302 is capable of accessing the memory module of the DPE tile adjacent below DPE tile 202 of FIG. 6A. Core interface 618-3 is coupled to a memory interface of the DPE tile to the adjacent left of DPE tile 202 of FIG. 6A. Accordingly, core 302 is capable of accessing the memory module of the DPE tile to the adjacent left of DPE tile 202 of FIG. 6A. Core interface 618-4 is coupled to a memory interface of the DPE tile adjacent above DPE tile 202 of FIG. 6A. Accordingly, core 302 is capable of accessing the memory module of the DPE tile adjacent above DPE tile 202 of FIG. 6A.

As noted, core 302 is capable of mapping read and/or write operations in the correct direction through core interfaces 618-1, 618-2, 618-3, and/or 618-4 based upon the addresses of such operations. When core 302 generates an address for a memory access, core 302 is capable of decoding the address to determine the direction (e.g., the particular DPE tile 202 to be accessed) and forwards the memory operation to the correct core interface in the determined direction.

Memory module 304 may include hardware synchronization circuitry (HSC) 620. In general, HSC 620 is capable of synchronizing operation of different cores 302 (e.g., cores 302 of neighboring DPE tiles 202), core 302 of FIG. 6A, DMA engine 616, and other external masters (e.g., a processor) that may communicate with a DPE tile such as DPE tile 202 of FIG. 6A via the DPE interconnect circuitry. As an illustrative and non-limiting example, HSC 620 is capable of synchronizing two different cores 302 in different DPE tiles 202 accessing the same, e.g., a shared, buffer in memory module 304 of FIG. 6A. HSC 620 may be accessed by core 302 and/or cores of neighboring DPE tiles (e.g., those cores 302 of other DPE tiles 202 connected to memory interfaces 610) and/or by the stream switches 306 of other DPE tiles 202.

In addition to communicating with neighboring DPE tiles 202 through shared memory modules 304 and neighboring and/or non-neighboring DPE tiles 202 via the DPE interconnect circuitry, core 302 may include one or more cascade interfaces 622, 624 such as a cascade input (depicted as "CI"

622) and a cascade output (depicted as "CI" 624). Cascade interfaces 622 and 624 are capable of providing direct communication with other cores 302 of adjacent DPE tiles 202. As pictured, cascade interface 622 of core 302 is capable of receiving an input data stream directly from the core 302 of an adjacent DPE tile 202 (e.g., the DPE tile 202 to the left, above, or below). The data stream received via cascade interface 622 may be provided to the data processing circuitry within core 302. Cascade interface 624 of core 302 is capable of sending an output data stream directly to the core 302 of an adjacent DPE tile 202 (e.g., the DPE tile 202 to the right, above, or below).

In the example of FIG. 6A, each of cascade interface 622 and cascade interface 624 may include a first-in-first-out (FIFO) interface for buffering (not shown). In an example implementation, cascade interfaces 622 and 624 are capable of conveying data streams that may be hundreds of bits in width. The particular bit width of cascade interfaces 622 and 624 is not intended as a limitation. In the example of FIG. 6A, cascade interface 622 is coupled to an internal register (or registers) 626 within core 302. Internal register 626 may store data that is generated and/or being operated on by data processing circuitry within core 302.

In one aspect, internal register 626 may be an accumulation register. An accumulation register of core 302 is an internal register in which intermediate results of operations performed by core 302 may be stored. The accumulation register allows core 302 to store such intermediate results of calculations without having to write such content/data to another memory located external to core 302. In another aspect, internal register 626 is another register that may be connected to the accumulation register. For example, internal register 626 may be a register that is coupled to the accumulation register and specifically accessible to receive data via cascade interface 622 and write the data to the accumulation register and/or output data from the accumulation register over cascade interface 624. Cascade interface 624 is capable of outputting the contents of internal register 626 and may do so each clock cycle.

In the example of FIG. 6A, cascade interfaces 622 and 624 may be programmed based upon configuration data loaded into control registers 608. For example, based upon control registers 608, cascade interface 622 may be activated or deactivated. Similarly, based upon control registers 608, cascade interface 624 may be activated or deactivated. Cascade interface 622 may be activated and/or deactivated independently of cascade interface 624.

In an example implementation, cascade interfaces 622 and 624 are controlled by core 302. For example, core 302 may include instructions to read/write to cascade interfaces 622 and/or 624. In another example, core 302 may include hardwired circuitry that is capable of reading and/or writing to cascade interfaces 622 and/or 624. In particular example implementations, cascade interfaces 622 and 624 may be controlled by an entity outside of core 302.

In one or more example implementations, DPE array 102 may be formed of homogeneous DPE tiles 202. In one or more other example implementations, DPE array 102 may be formed of different types of DPE tiles 202. For example, the DPE tiles 202 may include different types of cores 302 such as cores 302 that execute program code, hardwired cores that do not execute program code, special purpose cores, or any combination thereof. In still another example implementation, the DPE array 102 may include one or more DPE tiles that are dummy DPE tiles, e.g., not functional DPE tiles. Each different DPE array, whether implemented in the same die or in different dies may include a different number of DPEs and/or different types of DPEs.

FIG. 6B illustrates an example of event processing circuitry within a DPE tile 202. DPE tiles may include event processing circuitry that is interconnected to event processing circuitry of other DPE tiles, memory tiles, and/or interface tiles. In the example of FIG. 6B, event processing circuitry is implemented in core 302 and within memory module 304. Core 302 may include event broadcast circuitry 652. Memory module 304 may include separate event processing circuitry including event broadcast circuitry 662.

Event broadcast circuitry 652 may be connected to event broadcast circuitry within each of the cores of the neighboring DPE tiles above and below DPE tile 202 of FIG. 6. Event broadcast circuitry 652 may also be connected to the event broadcast circuitry within the memory module of the neighboring DPE tile to the left of DPE tile 202 of FIG. 6B. Event broadcast circuitry 652 is connected to event broadcast circuitry 662. Event broadcast circuitry 662 may be connected to event broadcast circuitry within each of the memory modules of the neighboring DPE tiles above and below DPE tile 202 illustrated in FIG. 6B. Event broadcast circuitry 662 may also be connected to the event broadcast circuitry within the core of the neighboring DPE to the right of DPE tile 202 of FIG. 6B.

In this manner, the event processing circuitry of the DPE tiles may form an independent event broadcast network within DPE array 102. The event broadcast network within DPE array 102 may exist independently of the other networks described herein. Further, the event broadcast network may be individually configurable by loading suitable configuration data into control registers 608.

In the example of FIG. 6, control registers 608 program event broadcast circuitry 652 and 662 to detect particular types of events that occur within core 302 and memory module 304, respectively. The data loaded into control registers 608, for example, determines which of a plurality of different types of predetermined events are detected by event broadcast circuitry 652 and 662. Examples of events that may be detected by event broadcast circuitry 652 are events that occur within core 302. These events may include, but are not limited to, starts and/or ends of read operations by core 302, starts and/or ends of write operations by core 302, stalls, and the occurrence of other operations performed by core 302. Examples of events that may be detected by event broadcast circuitry 662 are events that occur within memory module 304. These events may include, but are not limited to, starts and/or ends of read operations by DMA engine 616, starts and/or ends of write operations by DMA engine 616, stalls, and the occurrence of other operations performed by memory module 304. The data loaded into control registers 608, for example, determines which of a plurality of different types of predetermined events are detected by event broadcast circuitry 652 and/or 662. It should be appreciated that event broadcast circuitry 652 and/or 662 are capable of detecting events originating from and/or relating to DMA engine 616, MM switch 308, stream switch 306, memory interfaces 610, core interfaces 618, cascade interfaces 622, 624, and/or other components located in the DPE tiles.

For example, configuration data loaded into control registers 608 may determine which of the events received by event broadcast circuitry 652 and/or 662 from other event broadcast circuitries are propagated to yet other event broadcast circuitries or other circuitry. The configuration data may also specify which events generated internally by event broadcast circuitry 652 and/or 662 are propagated to other event broadcast circuitries and/or to other circuitry.

Accordingly, events generated by event broadcast circuitry 652 and/or 662 may be broadcast to other tiles of DPE array 102. In the example of FIG. 6B, event broadcast circuitry 652 and/or 662 is capable of broadcasting events, whether internally generated or received from other tiles of DPE array 102, to the tile above, to the tile to the left (e.g., via event broadcast circuitry 652), to the tile to the right (e.g., via event broadcast circuitry 662), and to the tile below. Event broadcast circuitry 652 is also capable of broadcasting events to event broadcast circuitry 662 within memory module 304.

In the example of FIG. 6B, event broadcast circuitries located in cores communicate vertically with event broadcast circuitries located in cores of neighboring DPE tiles above and/or below. Similarly, event broadcast circuitry located in memory modules communicate vertically with event broadcast circuitry located in memory modules of neighboring DPEs above and/or below. Event broadcast circuitry is further capable of communicating with the event broadcast circuitry immediately to the left and/or to the right regardless of the type of tile of DPE array 102 such other event broadcast circuitry is located.

Once control registers 608 are written, event broadcast circuitry 652 and 662 are capable of operating in the background. In one or more example implementations, event broadcast circuitry 652 generates events only in response to detecting particular conditions within core 302; and, event broadcast circuitry 662 generates events only in response to detecting particular conditions within memory module 304.

In general, within this disclosure, stream switches are described as connecting to other stream switches; MM switches are described as connecting to other MM switches; and event broadcast circuitry is described as connecting to other event broadcast circuitry of like tiles. That is, such components are described as being connected between DPE tiles, between MM tiles, etc. It should be appreciated that stream switches, MM switches, and event broadcast circuitry may be coupled to respective stream switches, MM switches, and event broadcast circuitry of other neighboring tiles of DPE array 102 whether such other tiles are DPE tiles 202, memory tiles 204, or interface tiles 208. Accordingly, though FIG. 6 is described largely in the context of such components being connected to like components in other DPE tiles, such components may connect to like components in other types of tiles of DPE array 102 depending on the implementation of DPE array 102 and the locations of the various types of tiles included therein.

In the example of FIG. 6, the DPE tiles may be arranged so that DPE tiles are arranged in columns where the cores and the memory modules are aligned. In another example, the DPE tiles adjacent to one another in the same row may be inverted and alternate. That is, from left to right in a same column, odd numbered DPE tiles may have the core on the left and the memory module on the right (e.g., non-inverted), while the even DPE tiles may be inverted with the core on the right and the memory module on the left or vice versa. Further, rows may be spaced to form a checkerboard pattern so that columns of DPE tiles alternate in terms of being inverted and not as described.

Figure 7A:
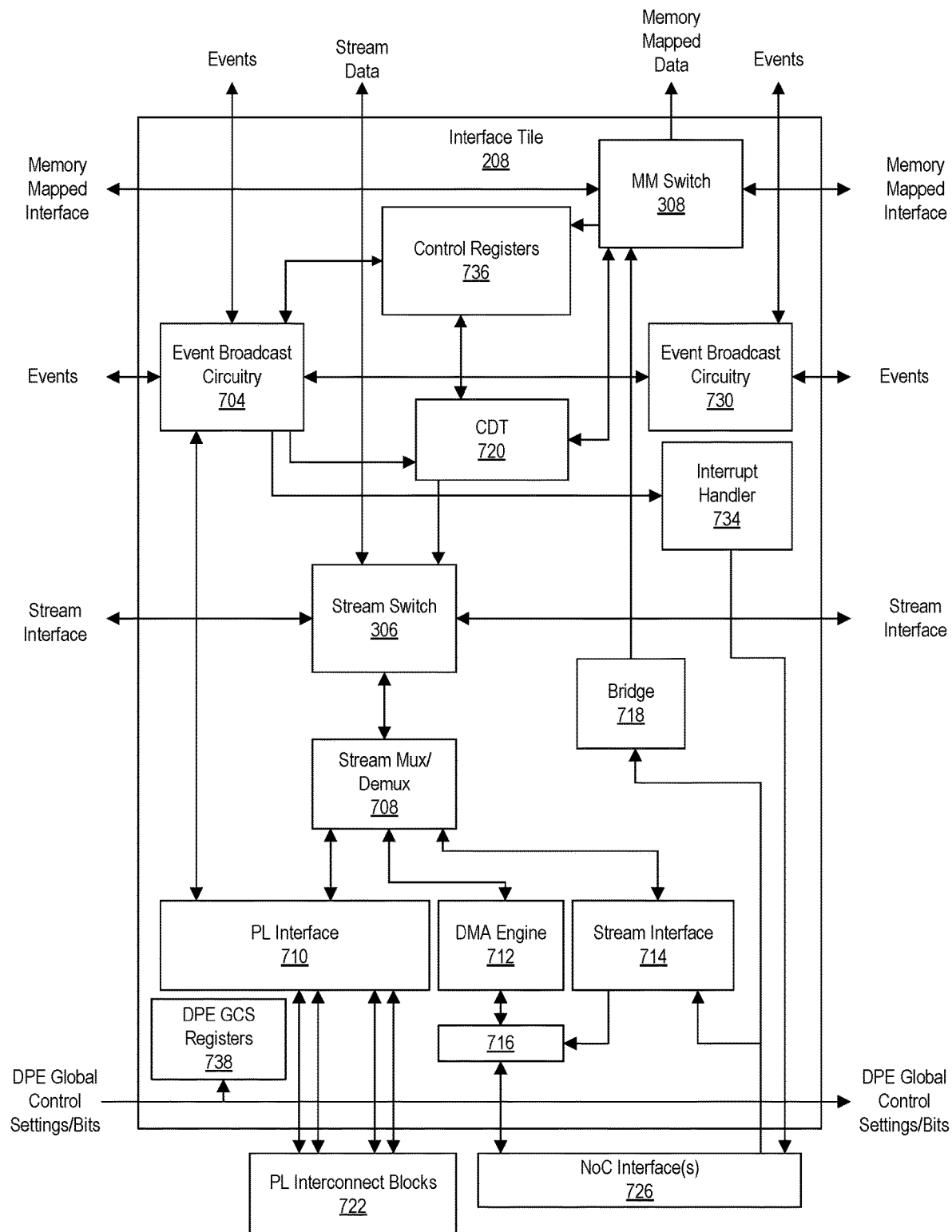
FIGS. 7A, 7B, and 7C illustrate example architectures for implementing interface tiles of an SoC interface of a DPE array.
Figure 7B:
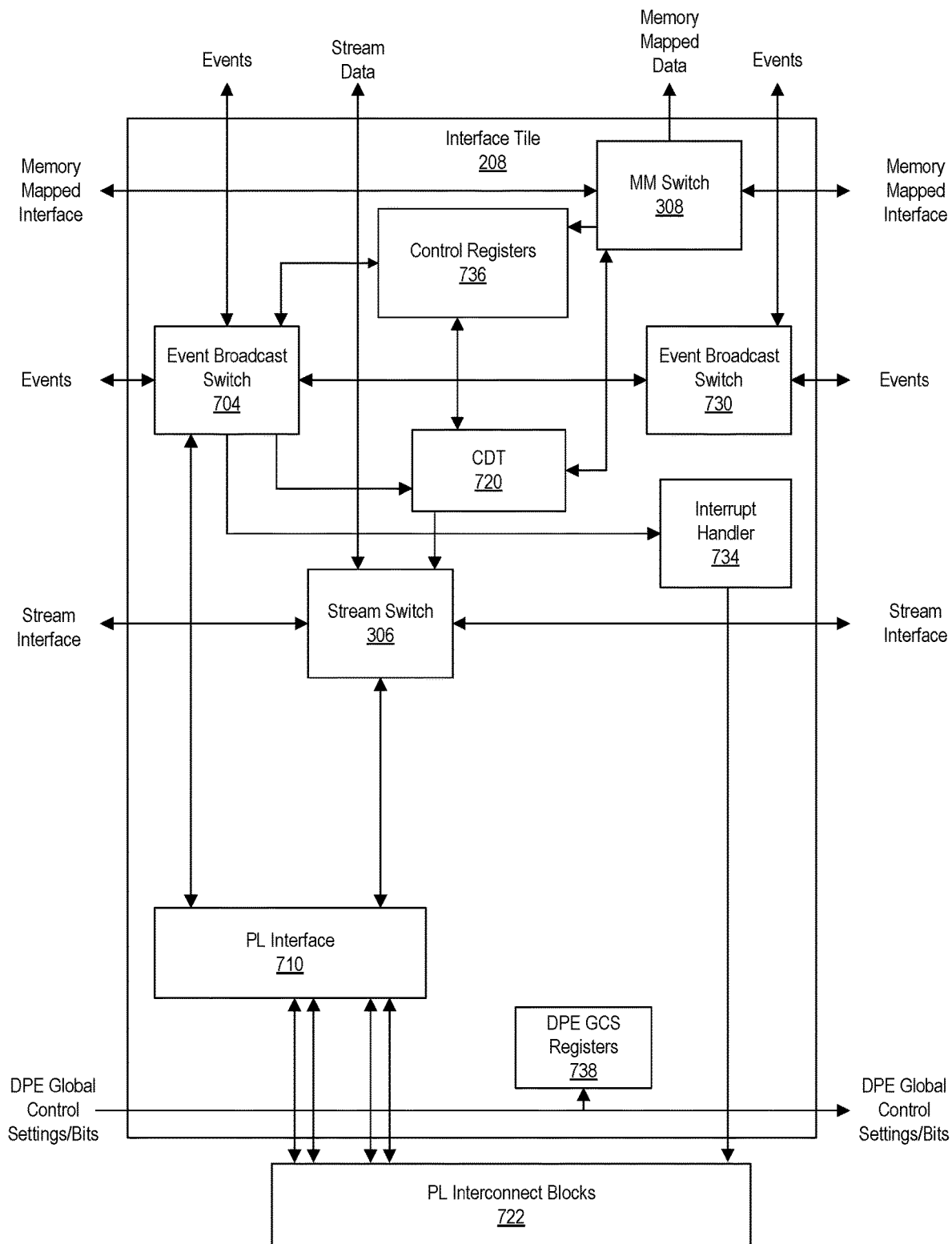
Figure 7C:
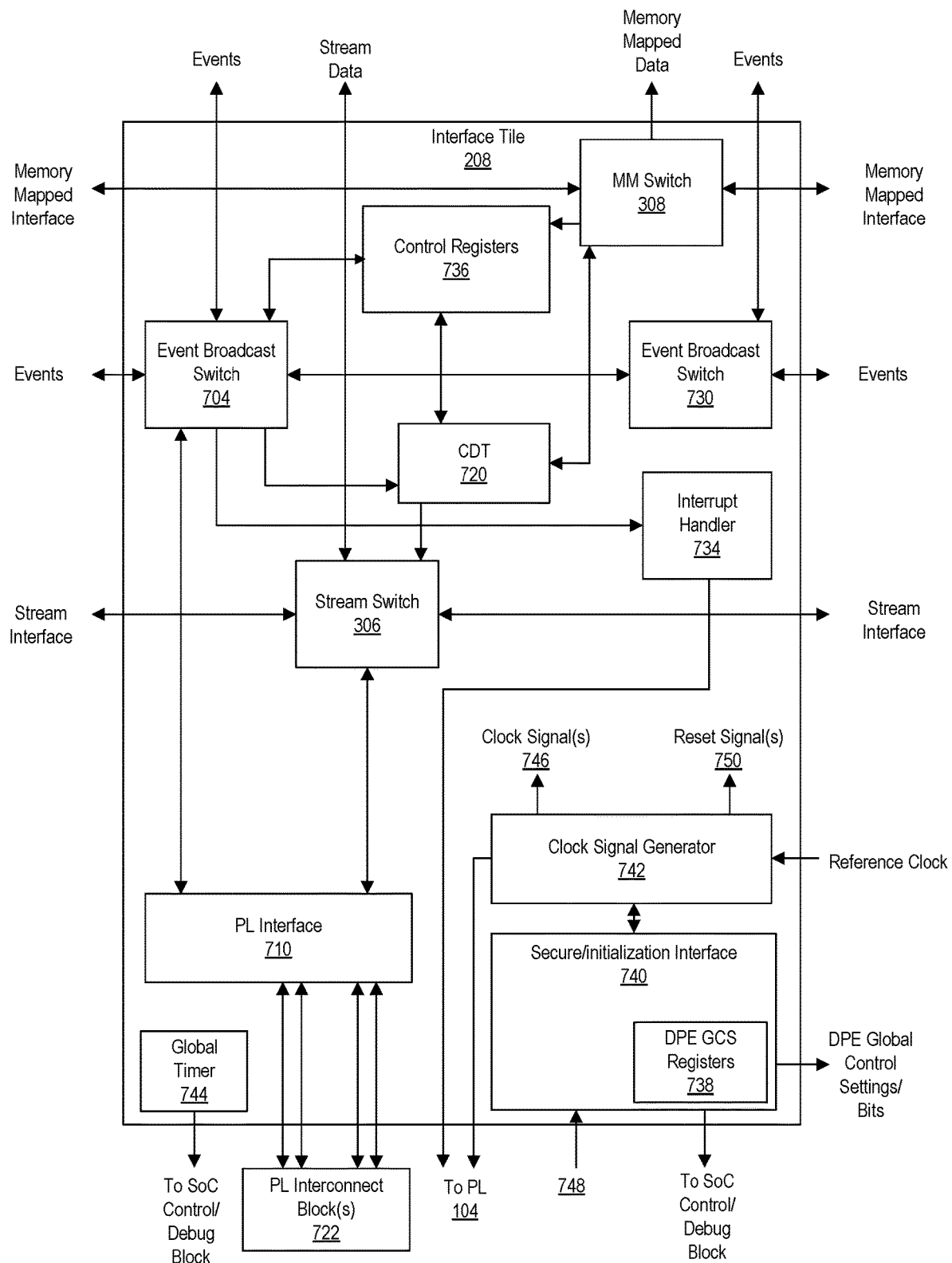

FIGS. 7A, 7B, and 7C illustrate example architectures for implementing interface tiles of SoC interface 206. SoC interface 206 includes a plurality of interconnected interface tiles 208 organized in a row. In one example, each of interface tiles 208 may have a same architecture. In another example, interface 208 may be implemented with different architectures where each different interface tile architecture supports communication with different types of resources of IC 100. Interface tiles 208 are connected so that data may be propagated from one tile to another bi-directionally. Each interface tile 208 is capable of operating as an interface for the column of tiles of DPE array 102 directly above.

FIG. 7A illustrates an example implementation of interface tile 208. The architecture illustrated in FIG. 7A may also be used to implement any of the other interface tiles 208 included in SoC interface 206.

Interface tile 208 includes a MM switch 308. MM switch 308 may include a plurality of memory mapped interfaces for communicating in each of a plurality of different directions. As an illustrative and non-limiting example, MM switch 308 may include one or more memory mapped interfaces where a memory mapped interface has a master that connects vertically to the MM switch of the tile of DPE array 102 adjacent above. As such, MM switch 308 is capable of operating as a master to the memory mapped interfaces of one or more tiles of DPE array 102. In a particular example, MM switch 308 may operate as a master for one or more DPE tiles 202 and/or one or more memory tiles 204. For example, MM switch 308 may operate as a master for a column of DPE tiles 202 and/or memory tiles 204 above interface tile 208. It should be appreciated that MM switch 308 may include additional memory mapped interfaces to connect to a plurality of different tiles of DPE array 102. The memory mapped interfaces of MM switch 308 may also include one or more slaves capable of communicating with different tiles of DPE array 102 located above interface tile 208.

In the example of FIG. 7A, MM switch 308 may include one or more memory mapped interfaces that facilitate communication in the horizontal direction to MM switches in neighboring interface tiles of SoC interface 206. For purposes of illustration, MM switch 308 may be connected to adjacent tiles in the horizontal direction via memory mapped interfaces, where each such memory mapped interface includes one or more masters and/or one or more slaves. Accordingly, MM switch 308 is capable of moving data (e.g., configuration, control, and/or debug data) from one interface tile to another to reach a correct tile of DPE array 102 and/or subset of tiles of DPE array 102 and direct the data to the target tiles, whether such tiles are in the column above interface tile 208 or above a different interface tile 208. If memory mapped transactions are received from other systems of IC 100, for example, MM switch 308 is capable of distributing the transaction(s) horizontally, e.g., to other interface tiles within SoC interface 206.

MM switch 308 may also include a memory mapped interface having one or more masters and/or slaves coupled to control registers 736 within interface tile 208. Through MM switch 308, configuration data may be loaded into control registers 736 to control various functions and operations performed by components within interface tile 208. FIGS. 7A, 7B, and 7C illustrate connections between control registers 736 and one or more elements of interface tile 208. It should be appreciated, however, that control registers 736 may control other elements of interface tile 208 and, as such, have connections to such other elements though such connections are not illustrated in FIGS. 7A, 7B, and/or 7C.

MM switch 308 may include a memory mapped interface coupled to NoC interfaces 726 via bridge 718. The memory mapped interface may include one or more masters and/or slaves. Bridge 718 is capable of converting data transfers from NoC interface(s) 726 (e.g., configuration, control, and/or debug data) into memory mapped data that may be received by MM switch 308.

Interface tile 208 may also include event broadcast circuitry 704. Event broadcast circuitry 704 may be configured by control registers 736. In the example of FIG. 7A, event broadcast circuitry 704 is coupled to a control, debug, and trace (CDT) circuit 720. The configuration data loaded into control registers 736 defines the particular events that may be detected locally within interface tile 208. Event broadcast circuitry 704 is capable of detecting a variety of different events, per control registers 736, originating from and/or relating to, DMA engine 712, MM switch 308, stream switch 306, first-in-first-out (FIFO) memories located within PL interface 710, and/or stream interface 714. Examples of events may include, but are not limited to, DMA finished transfer, a lock being released, a lock being acquired, the end of a PL transfer, or other events relating to the start or end of data flow through interface tile 208.

Interface tile 208 further may include event broadcast circuitry 730. In one aspect, event broadcast circuitry 730 may be included as broadcast circuitry only and not provide event generation and/or detection. In that case, event broadcast circuitry 730 may be included to receive events broadcast from other event broadcast circuitry in tiles above interface tile 208. Event broadcast circuitry 730 may provide such events to event broadcast circuitry 704 and/or to CDT circuit 720. In the example of FIG. 7A, event broadcast circuitry 730 may not have a direct connection to CDT circuit 720, but rather connect to CDT circuit 720 via event broadcast circuitry 704.

Each of event broadcast circuitry 704 and event broadcast circuitry 730 provide an interface between the event broadcast network of DPE array 102 and other interface tiles of SoC interface 206. Event broadcast circuitry 704 is coupled to event broadcast circuitry in an adjacent left interface tile 208 of SoC interface 206 and to event broadcast circuitry 730. Event broadcast circuitry 730 is coupled to event broadcast circuitry in adjacent right interface tile 208 of SoC interface 206. Event broadcast circuitry 704 and/or event broadcast circuitry 730 also may be connected to event broadcast circuitry located in other tiles above interface tile 208.

Event broadcast circuitry 704 is also coupled to PL interface 710. Though not illustrated, in another example implementation, event broadcast circuitry 730 may also be coupled to PL interface 710. Event broadcast circuitry 704 and event broadcast circuitry 730 are capable of sending events generated internally by event broadcast circuitry 704, events received from other interface tiles 208 of SoC interface 206, events received from DPE tiles 202, and/or events received from memory tiles 204 on to other tiles of DPE array 102. Event broadcast circuitry 704 is further capable of sending such events to other systems and/or circuits of IC 100 via PL interface 710. Further, PL interface 710 may receive events from other systems and/or circuit blocks of IC 100 and provide such events to event broadcast circuitry 704 and/or 730 for propagation of such events to particular DPE tiles 202 and/or particular memory tiles 204 to trigger further operations by the respective recipient tiles.

In an example, event broadcast circuitry 704 is capable of sending any events received from systems and/or circuit blocks of IC 100 via PL interface 710 to other interface tiles 208 of SoC interface 206 and/or to DPE tiles 202 and/or memory tiles 204 of DPE array 102. Because events may be broadcast among the interface tiles 208 in SoC interface 206, events may reach any tile of DPE array 102 by traversing through interface tiles 208 in SoC interface 206 and the event broadcast circuitry therein to the target (e.g., intended) tile of DPE array 102. For example, the event broadcast circuitry in interface tile 208 of SoC interface 206 beneath the column (or subset) of tiles managed by interface tile 208 including one or more target tiles may propagate the events to the target tile(s) of DPE array 102.

In the example of FIG. 7A, event broadcast circuitry 704 is coupled to CDT circuit 720. Event broadcast circuitry 704 is capable of sending events to CDT circuit 720. CDT circuit 720 is capable of packetizing the received events and sending the events from event broadcast circuitry 704 to stream switch 306. In particular example implementations, event broadcast circuitry 730 may be connected to stream switch 306 and/or to CDT circuit 720 as well.

In one or more example implementations, event broadcast circuitry 704 and event broadcast circuitry 730 are capable of gathering broadcast events from one or more or all directions as illustrated in FIG. 7A (e.g., via any of the connections shown in FIG. 7A). In some cases, event broadcast circuitry 704 and/or event broadcast circuitry 730 are capable of performing a logical "OR" of the signals and forwarding the results in one or more or all directions (e.g., including to CDT circuit 720). Each output from event broadcast circuitry 704 and event broadcast circuitry 730 may include a bitmask that is configurable by configuration data loaded into control registers 736. The bitmask determines which events are broadcast in each direction on an individual basis. Such bitmasks, for example, may eliminate unwanted or duplicative propagation of events.

In one or more example implementations, event broadcast circuitry 704 and event broadcast circuitry 730 maybe consolidated and implemented as a single, larger event broadcast circuitry module. In that case, the consolidated event broadcast circuitry module may implement the respective connections and/or functionality described in connection with event broadcast circuitry 704 and event broadcast circuitry 730.

Interrupt handler 734 is coupled to event broadcast circuitry 704 and is capable of receiving events that are broadcast from event broadcast circuitry 704. In one or more example implementations, interrupt handler 734 may be configured by configuration data loaded into control registers 736 to generate interrupts to NoC interface(s) 726 in response to selected events and/or combinations of events from event broadcast circuitry 704. Interrupt handler 734 is capable of generating interrupts, based upon the configuration data, to systems and/or other circuit blocks of IC 100. For example, interrupt handler 734 is capable of informing other device-level management blocks such as a processor or PS 106 of events occurring in any of the tiles of DPE array 102 based upon the interrupt(s) that are generated by interrupt handler 734.

PL interface 710 couples to PL interconnect blocks 722. In one or more example implementations, PL interface 710 provides an asynchronous clock-domain crossing between DPE array 102 and another clock domain. PL interface 710 may also provide level shifters and/or isolation cells for integration with power rails. In particular example implementations, PL interface 710 may be configured to provide 32-bit, 64-bit, and/or a 128-bit interface with FIFO support to handle back-pressure. The particular width of bitwise interface 710 may be controlled by configuration data loaded into control registers 736.

In one or more other example implementations, PL interface 710 is coupled to other types of circuit blocks and/or systems in other dies via PL interconnect blocks 722. As such, PL interface 710 is capable of transferring data between interface tile 208 and such other systems and/or circuit blocks of IC 100.

In the example of FIG. 7A, interface tile 208 includes a stream switch 306. Stream switch 306 is coupled to stream switches in adjacent or neighboring interface tiles through one or more stream interfaces. Each stream interface may include one or more masters and/or one or more slaves. In particular example implementations, each pair of neighboring stream switches is capable of exchanging data via one or more streams in each direction. Stream switch 306 is also coupled to the stream switch in the tile of DPE array 102 adjacent above interface tile 208 by one or more stream interfaces. Stream switch 306 is also coupled to PL interface 710, DMA engine 712, and/or to stream interface 714 via stream multiplexer/demultiplexer 708 (abbreviated as stream mux/demux in FIG. 7A). Stream switch 306, for example, may include one or more stream interfaces used to communicate with each of PL interface 710, DMA engine 712, and/or stream interface 714 through stream multiplexer/demultiplexer 708.

Stream switch 306 may be configured by configuration data loaded into control registers 736. Stream switch 306, for example, may be configured to support packet-switched and/or circuit-switched operation based upon the configuration data. Further, the configuration data defines the particular tiles of DPE array 102 to which stream switch 306 communicates. In one or more example implementations, the configuration data defines the particular tile or subset of tiles of DPE array 102 in the column of tiles directly above interface tile 208 to which stream switch 306 communicates.

Stream multiplexer/demultiplexer 708 is capable of directing data received from PL interface 710, DMA engine 712, and/or stream interface 714 to stream switch 306. Similarly, stream multiplexer/demultiplexer 708 is capable of directing data received from stream switch 306 to PL interface 710, DMA engine 712, and/or to stream interface 714. For example, stream multiplexer/demultiplexer 708 may be programmed by configuration data stored in control registers 736 to route selected data to PL interface 710, to route selected data to DMA engine 712 where such data are sent to NoC interface(s) 726 as memory mapped transactions, and/or to route selected data to stream interface 714 where the data are sent over physical NoC interface(s) 726 as a data stream or streams.

DMA engine 712 is capable of operating as a master to direct data into NoC interface(s) 726 through selector block 716. DMA engine 712 is capable of receiving data from tiles of DPE array 102 and providing such data to physical NoC interface(s) 726 as memory mapped data transactions. In one or more example implementations, DMA engine 712 includes hardware synchronization circuitry that may be used to synchronize multiple channels included in DMA engine 712 and/or a channel within DMA engine 712 with a master that polls and drives the lock requests. For example, the master may be a processor and/or processor system in another system of IC 100. The master may also receive an interrupt generated by the hardware synchronization circuitry within DMA engine 712.

In one or more example implementations, DMA engine 712 is capable of accessing an external memory (e.g., a memory external to IC 100) and/or a memory implemented in IC 100. For example, DMA engine 712 is capable of receiving data streams from tiles of DPE array 102 and sending the data stream to the memory through NoC 108. Similarly, DMA engine 712 is capable of receiving data from external memory where the data may be distributed to other interface tiles 208 of SoC interface 206 and on to other tiles of DPE array 102.

In one or more example implementations, DMA engine 712 includes security bits that may be set using DPE global control settings registers (DPE GCS registers) 738. The memory may be divided into different regions or partitions where DPE array 102 is only permitted to access particular regions of the memory. The security bits within DMA engine 712 may be set so that DPE array 102, by way of DMA engine 712, is only able to access the particular region(s) of memory that are allowed per the security bits. For example, an application implemented by DPE array 102 may be restricted to access only particular regions of memory, restricted to only reading from particular regions of memory, and/or restricted from writing to the memory entirely using this mechanism.

The security bits within DMA engine 712 that control access to the memory may be implemented to control DPE array 102 as a whole or may be implemented in a more granular way where access to the memory may be specified and/or controlled on a per tile and/or tile group basis of DPE array 102 where such tiles or tile groups are configured to operate in a coordinated manner, e.g., to implement a kernel and/or other application.

Stream interface 714 is capable of receiving data from NoC interface(s) 726 and forwarding the data to stream multiplexer/demultiplexer 708. Stream interface 714 is further capable of receiving data from stream multiplexer/demultiplexer 708 and forwarding the data to NoC interface(s) 726. Selector block 716 is configurable to pass data from DMA engine 712 or from stream interface 714 on to NoC interface(s) 726.

CDT circuit 720 is capable of performing control, debug, and trace operations within interface tile 208. Regarding debug, each of the registers located in interface tile 208 is mapped onto the memory map accessible via MM switch 308. CDT circuit 720 may include circuitry such as, for example, trace hardware, trace buffers, performance counters, and/or stall logic. Trace hardware of CDT circuit 720 is capable of collecting trace data. Trace buffers of CDT circuit 720 are capable of buffering trace data. CDT circuit 720 is further capable of outputting the trace data to stream switch 306.

In one or more example implementations, CDT circuit 720 is capable of collecting data, e.g., trace and/or debug data, packetizing such data, and then outputting the packetized data through stream switch 306. For example, CDT circuit 720 is capable of outputting packetized data and providing such data to stream switch 306. Additionally, control registers 736 or others can be read or written during debugging via memory mapped transactions through the MM switch 308 of the respective tile. Similarly, performance counters within CDT circuit 720 can be read or written during profiling via memory mapped transactions through the MM switch 308 of the respective tile.

In one or more example implementations, CDT circuit 720 is capable of receiving any events propagated by event broadcast circuitry 704 (or event broadcast circuitry 730) or selected events per the bitmask utilized by the interface of event broadcast circuitry 704 that is coupled to CDT circuit 720. For example, CDT circuit 720 is capable of receiving events broadcast from event broadcast circuitry located in any tile(s) of DPE array 102. CDT circuit 720 is capable of packing, e.g., packetizing, a plurality of such events together in a packet and associating the packetized events with timestamp(s). CDT circuit 720 is further capable of sending the packetized events over stream switch 306 to destinations external to interface tile 208. Events may be sent by way of stream switch 306 and stream multiplexer/demultiplexer 708 to other systems and/or circuit blocks of IC 100 via PL interface 710, DMA engine 712, and/or stream interface 714.

DPE GCS registers 738 may store DPE global control settings/bits (also referred to herein as "security bits") that are used to enable or disable secure access to and/or from DPE array 102. DPE GCS registers 738 may be programmed via an SoC secure/initialization interface to be described in greater detail below in connection with FIG. 7C. The security bit(s) received from the SoC secure/initialization interface may propagate from one interface tile to the next of SoC interface 206 via a bus as illustrated in FIG. 7A.

In one or more example implementations, external memory mapped data transfers into DPE array 102 may not be secure or trusted. Without setting the security bits within DPE GCS registers 738, any entity in IC 100 that is capable of communicating by way of memory mapped data transfers is capable of communicating with DPE array 102. By setting the security bits within DPE GCS registers 738, the particular entities that are permitted to communicate with DPE array 102 may be defined such that only the specified entities capable of generating secure traffic may communicate with DPE array 102.

In one or more example implementations, memory mapped data transfers may include additional sideband signals, e.g., bits, that specify whether a transaction is secure or not secure. When the security bits within DPE GCS registers 738 are set, then memory mapped transactions entering into SoC interface 206, e.g., interface tile 208, must have the sideband signals set to indicate that the memory mapped transaction arriving at SoC interface 206 is secure. When a memory mapped transaction arriving at SoC interface 206 does not have the sideband bits set and the security bits are set within DPE GCS registers 738, then SoC interface 206 does not allow the transaction to enter or pass to other tiles of DPE array 102.

In one or more example implementations, IC 100 includes a secure agent (e.g., circuit) that operates as a root of trust. PMC 110, for example, may be the secure agent. The secure agent is capable of configuring the different entities (e.g., circuits) within IC 100 with the permissions needed to set the sideband bits within memory mapped transactions in order to access DPE array 102 when the security bits of DPE GCS registers 738 are set. The secure agent, at the time IC 100 is configured, gives permissions to the different masters that may be implemented therein thereby giving such masters the capability of issuing secure transactions to DPE array 102.

FIG. 7B illustrates another example implementation of interface tile 208. The example architecture illustrated in FIG. 7B may also be used to implement any of the other interface tiles included in SoC interface 206. The example of FIG. 7B illustrates a simplified version of the architecture illustrated in FIG. 7A. The architecture of FIG. 7B provides connectivity between DPE tiles 202 and/or memory tiles 204 and other systems and/or circuit blocks within IC 100. In the example of FIG. 7B, DMA engine 712, stream interface 714, selector block 716, bridge 718, and stream multiplexer/demultiplexer 708 are omitted. As such, interface tile 208 of FIG. 7B may be implemented using less area of IC 100. Further, as pictured, stream switch 306 is directly coupled to PL interface 710.

The example architecture of FIG. 7B is unable to directly receive memory mapped data, e.g., configuration data, from circuitry outside of DPE array 102 for purposes of configuring tiles of DPE array 102. Such configuration data may be received from neighboring interface tiles via MM switch 308 and directed to the subset of DPE tiles 202 and/or memory tiles 204 that interface tile 208 manages (e.g., up into the column of tiles above interface tile 208 of FIG. 7B).

FIG. 7C illustrates another example implementation of interface tile 208. In particular example implementations, the architecture illustrated in FIG. 7C may be used to implement only one tile within SoC interface 206. The architecture illustrated in FIG. 7C is similar to the architecture shown in FIG. 7B. In FIG. 7C, additional components such as a secure/initialization interface 740, a clock signal generator 742, and a global timer 744 are included.

In the example of FIG. 7C, secure/initialization interface 740 is capable of providing access to global reset registers for DPE array 102 (not shown) and to DPE GCS registers 738. DPE GCS registers 738 can include the control registers for clock signal generator 742. As pictured, secure/initialization interface 740 is capable of providing security bits to DPE GCS registers 738 and propagating the security bits to other DPE GCS registers 738 in other interface tiles of SoC interface 206. Secure/initialization interface 740 is capable of implementing a single slave endpoint for SoC interface 206.

In the example of FIG. 7C, clock signal generator 742 is capable of generating one or more clock signal(s) 746 and/or one or more reset signals 750. Clock signal(s) 746 and/or reset signals 750 may be distributed to each of DPE tiles 202, memory tiles 204, and to other interface tiles 208 of SoC interface 206. For example, clock signal generator 742 may include one or more phase lock loop circuits (PLLs). As illustrated, clock signal generator 742 is capable of receiving a reference clock signal generated by another circuit external to DPE array 102. In another example, the reference clock may be received from a source external to IC 100. Clock signal generator 742 is capable of generating the clock signal(s) 746 based upon the received reference clock signal.

In the example of FIG. 7C, clock signal generator 742 is configured through secure/initialization interface 740. For example, clock signal generator 742 may be configured by loading data into DPE GCS registers 738. As such, the clock frequency or clock frequencies of DPE array 102 and the generation of reset signals 750 may be set by writing appropriate configuration data to DPE GCS registers 738 through secure/initialization interface 740. For test purposes, clock signal(s) 746 and/or reset signals 750 may also be routed directly PL 104.

Secure/initialization interface 740 may be coupled to a control/debug (circuit) block (e.g., a control and/or debug system of IC 100 not shown). In one or more example implementations, secure/initialization interface 740 is capable of providing status signals to the control/debug block. As an illustrative and non-limiting example, secure/initialization interface 740 is capable of providing a "PLL lock" signal generated from inside of clock signal generator 742 to the control/debug block. The PLL lock signal may indicate when the PLL acquires lock on the reference clock signal.

Secure/initialization interface 740 is capable of receiving instructions and/or data via an interface 748. The data may include the security bits described herein, clock signal generator configuration data, and/or other data that may be written to DPE GCS registers 738. In one aspect, PMC 110 or another master circuit may be coupled to interface 748.

Global timer 744 is capable of interfacing to CDT circuit 720. For example, global timer 744 may be coupled to CDT circuit 720. Global timer 744 is capable of providing a signal that is used by CDT circuit 720 for time-stamping events used for tracing. In one or more example implementations, global timer 744 may be coupled to CDT circuit 720 within other ones of the interface tiles of SoC interface 206. For example, global timer 744 may be coupled to CDT circuit 720 in the example interface tiles of FIGS. 7A, 7B, and/or 7C. Global timer 744 may also be coupled to the control/debug block.

Figure 8:
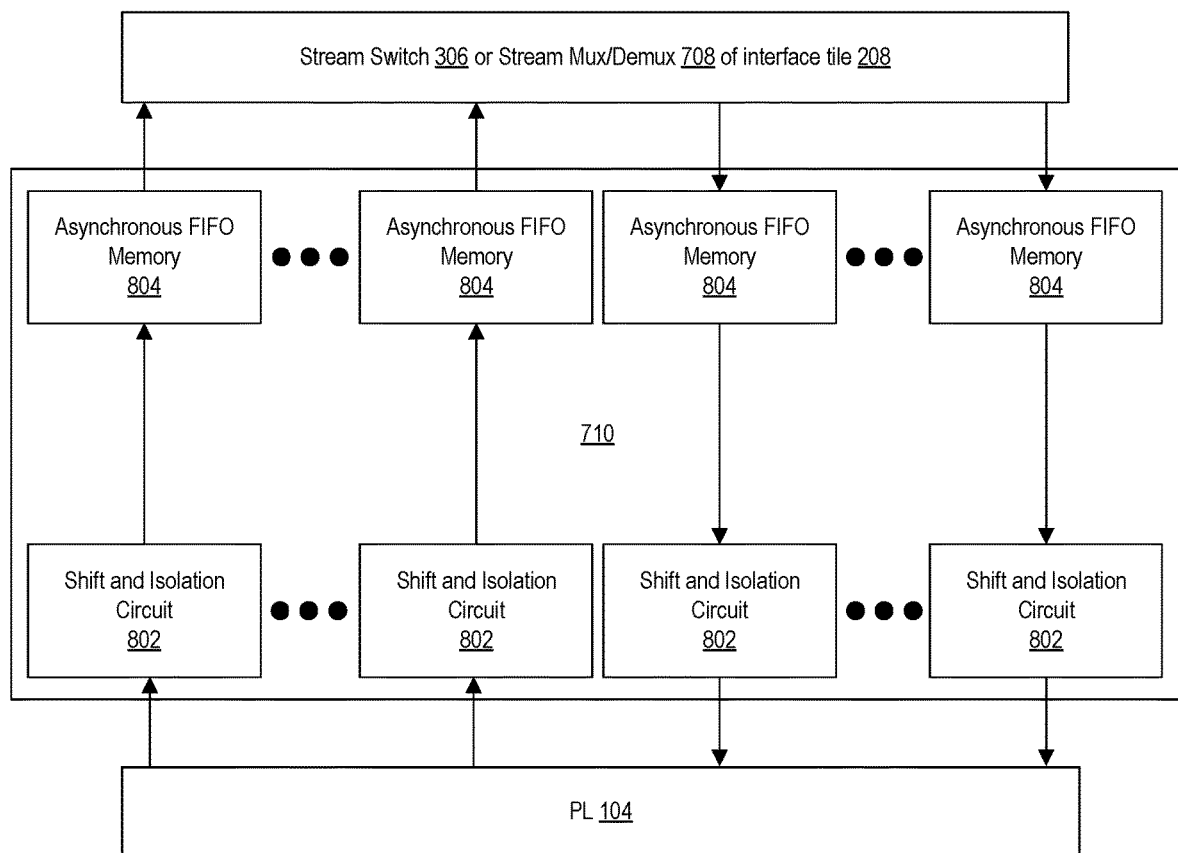
FIG. 8 illustrates an example implementation of a programmable logic (PL) interface of an interface tile of an SoC interface.

FIG. 8 illustrates an example implementation of PL interface 710. In the example of FIG. 8, PL interface 710 includes a plurality of channels that couple PL interconnect blocks 722 to stream switch 306 and/or stream multiplexer/demultiplexer 708 depending upon the particular tile architecture that is used. The particular number of channels illustrated in FIG. 8 within PL interface 710 is for purposes of illustration and not limitation. In other examples, PL interface 710 may include fewer or more channels than shown in FIG. 8.

In one or more example implementations, other systems and/or circuit blocks of IC 100 coupled to PL interface 710 operate at a different reference voltage and/or a different clock speed than DPE array 102. Accordingly, in the example of FIG. 8, PL interface 710 includes a plurality of shift and isolation circuits 802 and a plurality of asynchronous FIFO memories 804. Each of the channels includes a shift isolation circuit 802 and an asynchronous FIFO memory 804. A first subset of the channels convey data from PL 104 or other circuitry to stream switch 306 and/or stream multiplexer/demultiplexer 708. A second subset of the channels convey data from stream switch 306 and/or stream multiplexer/demultiplexer 708 to PL 104 or other circuitry.

Shift and isolation circuits 802 are capable of interfacing between domains of different voltage. In this case, shift and isolation circuits 802 are capable of providing an interface that transitions between the operating voltage of PL 104 and/or other circuitry and the operating voltage of tiles of DPE array 102. Asynchronous FIFO memories 804 are capable of interfacing between two different clock domains. In this case, asynchronous FIFO memories 804 are capable of providing an interface that transitions between the clock rate of PL 104 or other circuitry and the clock rate of DPE array 102.

In one or more example implementations, asynchronous FIFO memories 804 have 32-bit interfaces to DPE array 102. Connections between asynchronous FIFO memories 804 and shift and isolation circuits 802 and connections between shift and isolation circuits 802 and PL 104 may be programmable (e.g., configurable) in width. For example, the connections between asynchronous FIFO memories 804 and shift and isolation circuits 802 and the connections between shift and isolation circuits 802 and PL 104 may be configured to be 32-bits, 64-bits, or 128-bits in width. As discussed, PL interface 710 is configurable by way of MM switch 308 writing configuration data to control registers 736 to achieve the bit-widths described. Using MM switch 308, the side of asynchronous FIFO memories 804 on the side of PL 104 may be configurable to use either 32-bits, 64-bits, or 128-bits. The bit widths provided herein are for purposes of illustration. In other example implementations, other bit widths may be used. In any case, the widths described for the various components may be varied based upon configuration data loaded into control registers 736.

Figure 9:
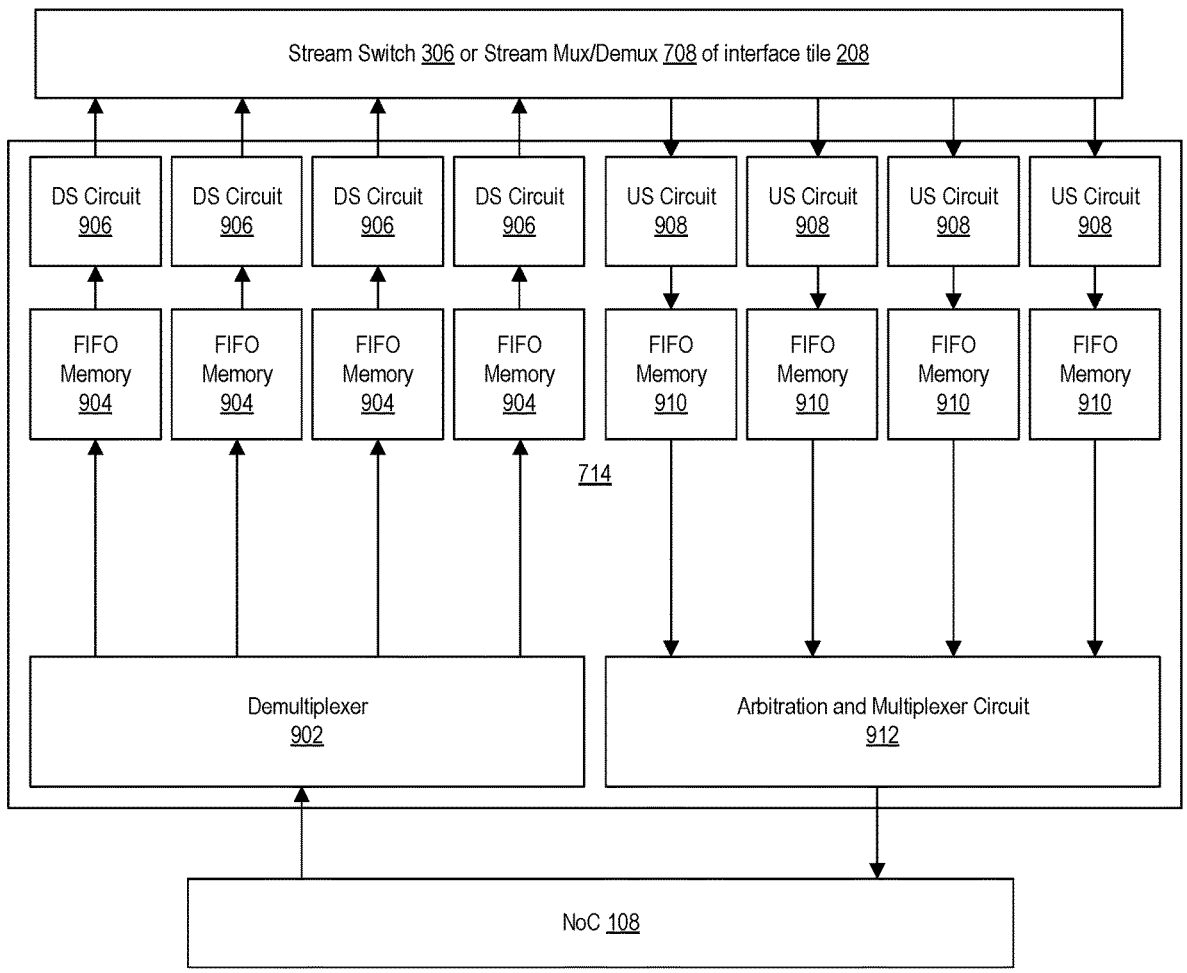
FIG. 9 illustrates an example implementation of a stream interface of an interface tile of an SoC interface.

FIG. 9 illustrates an example implementation of stream interface 714. DPE array 102 has two general ways of communicating via NoC 108 using the stream interfaces in the tiles. In one aspect, DPE tiles 202 and/or memory tiles 204 are capable of accessing DMA engine 712 using stream switch 306. DMA engine 712 is capable of converting memory mapped transactions from NoC 108 to data streams for sending to the tiles in DPE array 102 and converting data streams from the tiles in DPE array 102 to memory mapped transactions for sending over NoC 108. In another aspect, the data streams may be directed to stream interface 714.

In the example of FIG. 9, stream interface 714 includes a plurality of channels that couple NoC 108 to stream switch 306 and/or stream multiplexer/demultiplex 708. Each channel may include a FIFO memory and either an upsize circuit or a downsize circuit. A first subset of the channels convey data from NoC 108 to stream switch 306 and/or stream multiplexer/demultiplexer 708. A second subset of the channels convey data from stream switch 306 and/or stream multiplexer/demultiplexer 708 to NoC 108. The particular number of channels illustrated in FIG. 9 within stream interface 714 is for purposes of illustration and not limitation. In other examples, stream interface 714 may include fewer or more channels than shown in FIG. 9.

In one or more example implementations, each of upsize circuits 908 (abbreviated as "US circuit" in FIG. 9) is capable of receiving a data stream and increasing the width of the received data stream. For example, each upsize circuit 908 may receive a 32-bit data stream and output a 128-bit data stream to a corresponding FIFO memory 910. Each of FIFO memories 910 is coupled to arbitration and multiplexer circuit 912. Arbitration and multiplexer circuit 912 is capable of arbitrating between the received data streams using a particular arbitration scheme or priority (e.g., round-robin or other style) for providing a resulting output data stream to NoC interfaces 726. Arbitration and multiplexer circuit 912 is capable of handling and accepting a new request every clock cycle. Clock domain crossing between DPE array 102 and NoC 108 may be handled within NoC 108 itself. In one or more other embodiments, clock domain crossing between DPE array 102 and NoC 108 may be handled within SoC interface 206. For example, clock domain crossing may be handled in stream interface 714.

Demultiplexer 902 is capable of receiving a data stream from NoC 108. For example, demultiplexer 902 may be coupled to NoC interface(s) 726. For purposes of illustration, the data stream from NoC interface(s) 726 may be 128-bits in width. Demultiplexer 902 is capable of forwarding the received data stream to one of FIFO memories 904. The particular FIFO memory 904 to which demultiplexer 902 provides the data stream may be encoded within the data stream itself. FIFO memories 904 are coupled to downsize circuits 906 (abbreviated as "DS circuit" in FIG. 9). Downsize circuits 906 are capable of downsizing the received streams to a lesser width after buffering using time-division multiplexing. For example, downsize circuits 906 may downsize a stream from 128 bits in width to 32-bits in width.

As illustrated, downsize circuits 906 and upsize circuits 908 are coupled to stream switch 306 or stream multiplexer/demultiplexer 708 depending upon the particular architecture of the interface tile 208 that is used. FIG. 9 is provided for purposes of illustration and is not intended as a limitation. The order and/or connectivity of components in the channels (e.g., upsize/downsize circuit and FIFO memory may vary). In one or more example implementations, DPE array 102 may operate at a clock rate that is faster or higher than one or more or all other systems in IC 100.

In one or more other examples, PL interface 710, as described in connection with FIG. 8, may include upsize circuits and/or downsize circuits as described in connection with FIG. 9. For example, downsize circuits may be included in each channel that conveys data from PL 104 (or other circuitry) to stream switch 306 and/or to stream multiplexer/demultiplexer 708. Upsize circuits may be included in each channel that conveys data from stream switch 306 and/or stream multiplexer/demultiplexer 708 to PL 104 (or other circuitry).

In one or more other example implementations, though shown as independent elements, each downsize circuit 906 may be combined with the corresponding FIFO memory 904, e.g., as a single block or circuit. Similarly, each upsize circuit 908 may be combined with the corresponding FIFO memory 910, e.g., as a single block or circuit.

Figure 10:
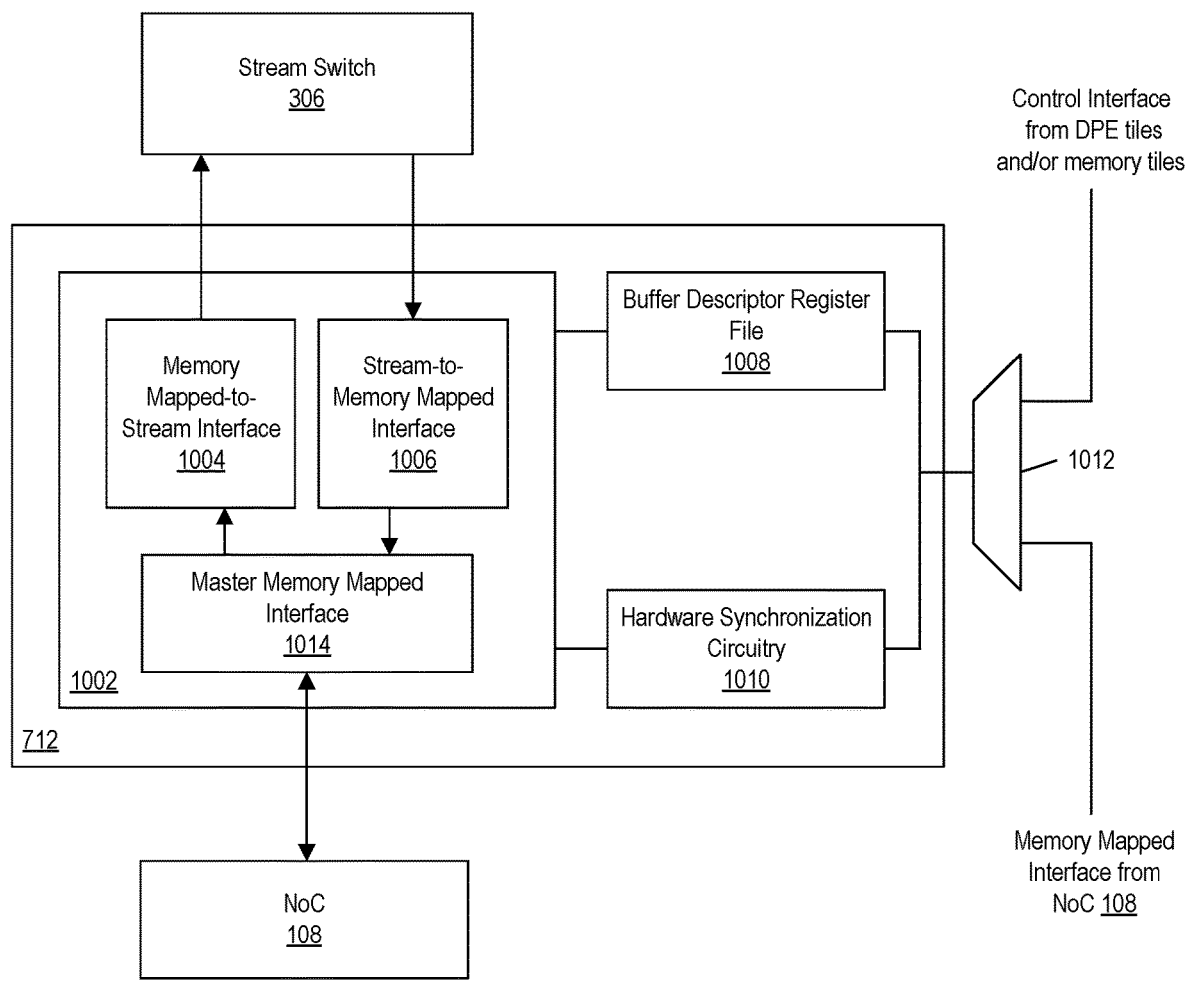
FIG. 10 illustrates an example implementation of a direct memory access (DMA) engine of an interface tile of an SoC interface.

FIG. 10 illustrates an example implementation of DMA engine 712. In the example of FIG. 10, DMA engine 712 includes data path circuitry 1002. Data path circuitry 1002 may be divided into a plurality of modules or interfaces. Each interface is capable of operating independently of the other. Data path circuitry 1002 may include a memory mapped-to-stream interface (interface) 1004 and a stream-to-memory mapped interface (interface) 1006. Each of interface 1004 and interface 1006 may include one or more separate channels. For example, interface 1004 may include a plurality of memory mapped-to-stream channels while interface 1006 may include a plurality of stream-to-memory mapped channels. Each channel may be independently configurable. Accordingly, DMA engine 712 is capable of receiving two or more incoming streams from stream switch 306 via interface 1006 (e.g., one stream per channel) and sending two or more outgoing streams to stream switch 306 via interface 1004 (e.g., one stream per channel). Data path circuitry 1002 further may include a master memory mapped interface 1014. Master memory mapped interface 1014 couples NoC 108 to interface 1004 and to interface 1006.

DMA engine 712 may also include a buffer descriptor register file 1008 and hardware synchronization circuitry 1010. Buffer descriptor register file 1008 and hardware synchronization circuitry 1010 may be accessed via multiplexer 1012 thereby facilitating access to buffer descriptor register file 1008 and hardware synchronization circuitry 1010 by other circuitry having control interfaces coupled to multiplexer 1012. Examples of such control interfaces include, but are not limited to, a memory mapped interface or a control stream interface. The control interfaces may couple to DPE tiles 202 of DPE array 102, memory tiles 204 of DPE array 102, PS 106, or another master including a processor of an external host computing system connected to IC 100 via a communication bus such as a Peripheral Component Interconnect Express (PCIe) bus. An example of a control stream interface is a streaming interface as described in connection with DPE tiles 202 and/or memory tiles 204.

Hardware synchronization circuitry 1010 may be used to synchronize the multiple channels included in DMA engine 712 and/or a channel within DMA engine 712 with a master that polls and drives the lock requests. For example, the master may be PS 106 or a device implemented within PL 104. In another example, the master may also receive an interrupt generated by hardware synchronization circuitry 1010 within DMA engine 712 when a lock is available.

DMA transfers may be defined by buffer descriptors stored within buffer descriptor register file 1008. Interface 1006 is capable of requesting read transfers to NoC 108 based on the information in the buffer descriptors. Outgoing streams to stream switch 306 from interface 1004 can be configured as packet-switched or circuit-switched based upon the configuration registers for stream switches and/or the configuration of individual channels of interface 1004.

DMA engine 712 may include one or more additional circuits described herein in connection with FIGS. 12A-12B and 13A-13B. For example, DMA engine 712 may include a physical memory protection circuit as described in connection with FIG. 12 and/or a memory management unit as described in connection with FIG. 13.

Figure 11A:
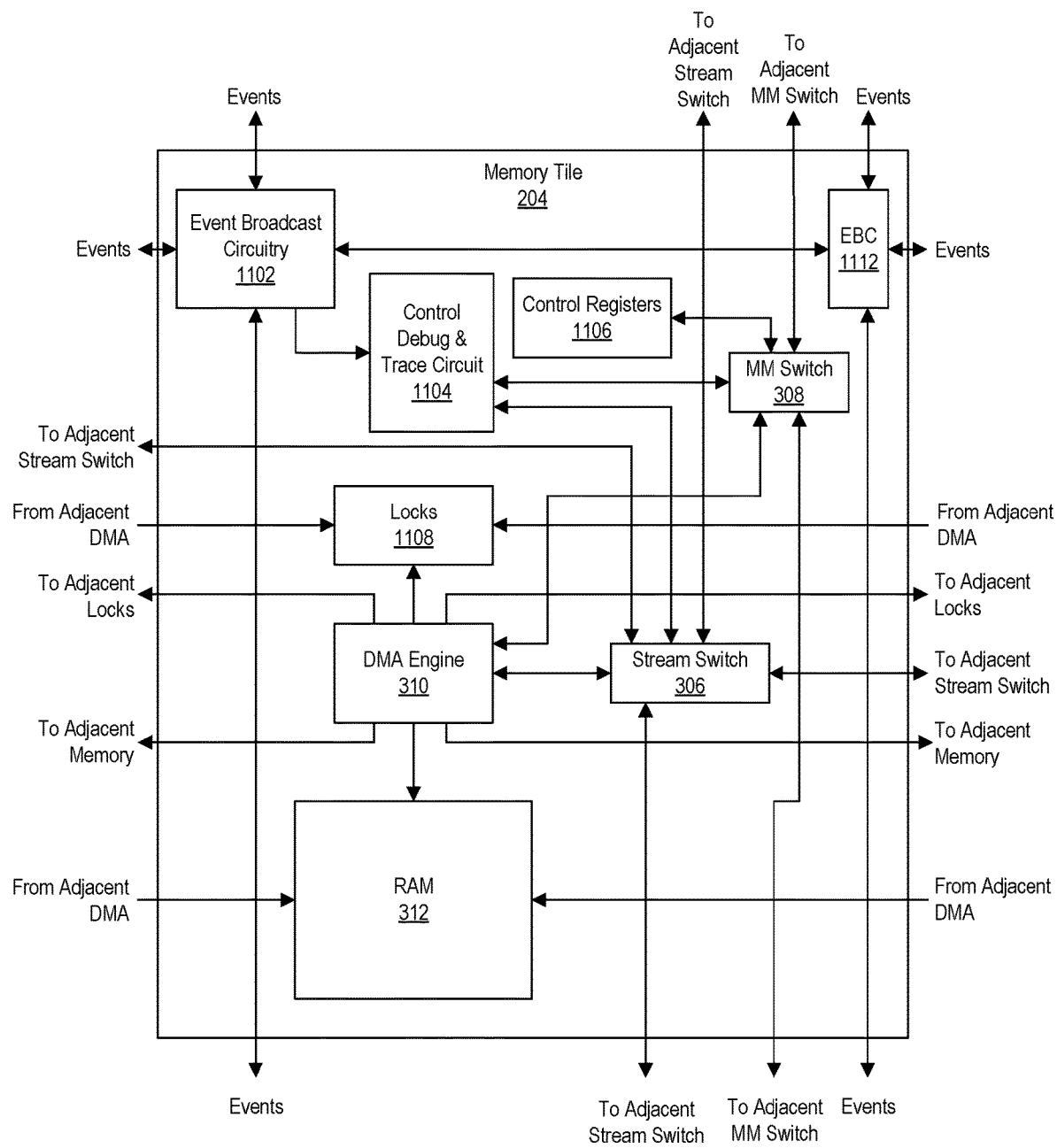
FIGS. 11A, 11B, and 11C illustrate example implementations of a memory tile.
Figure 11B:
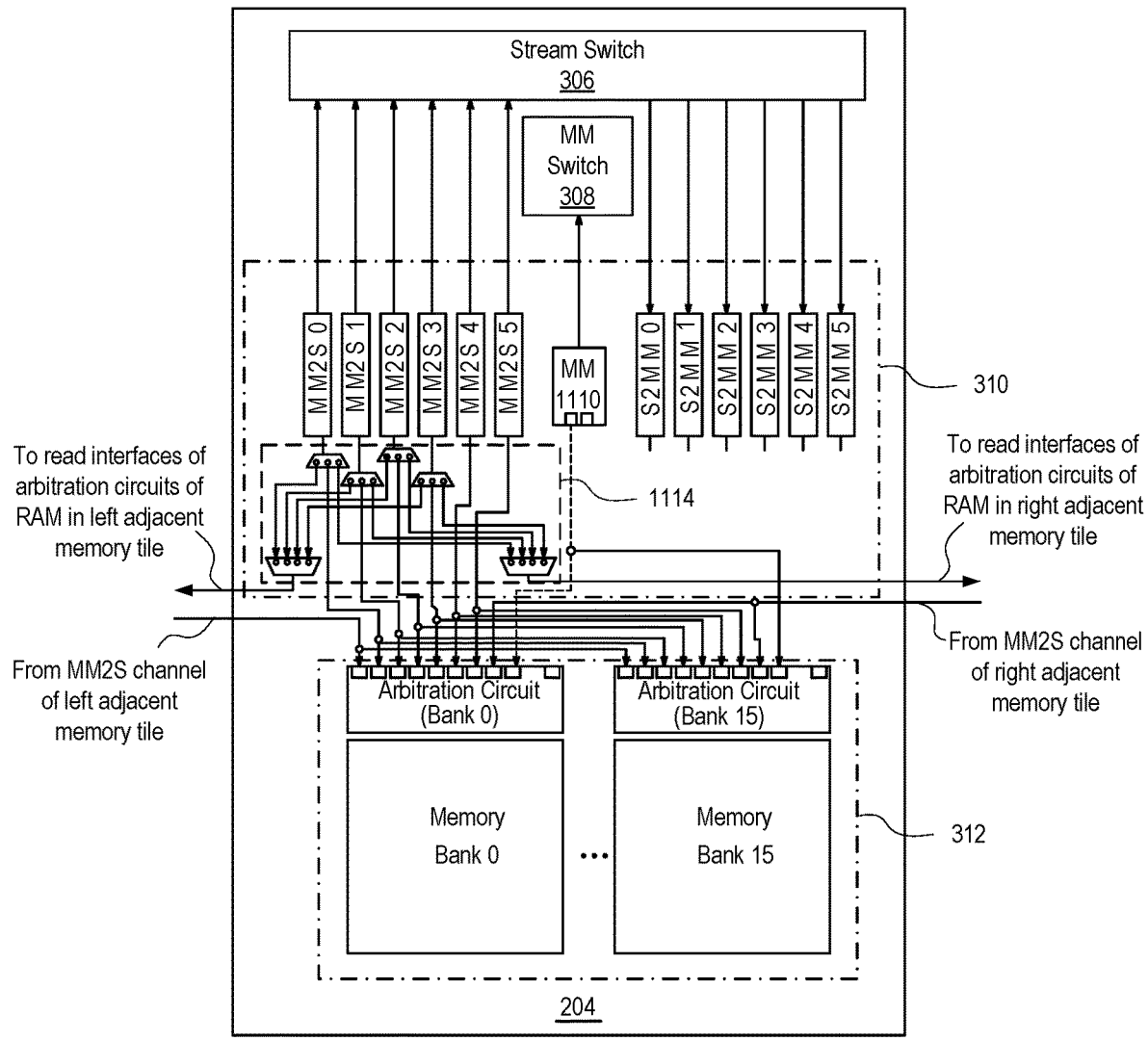
Figure 11C:
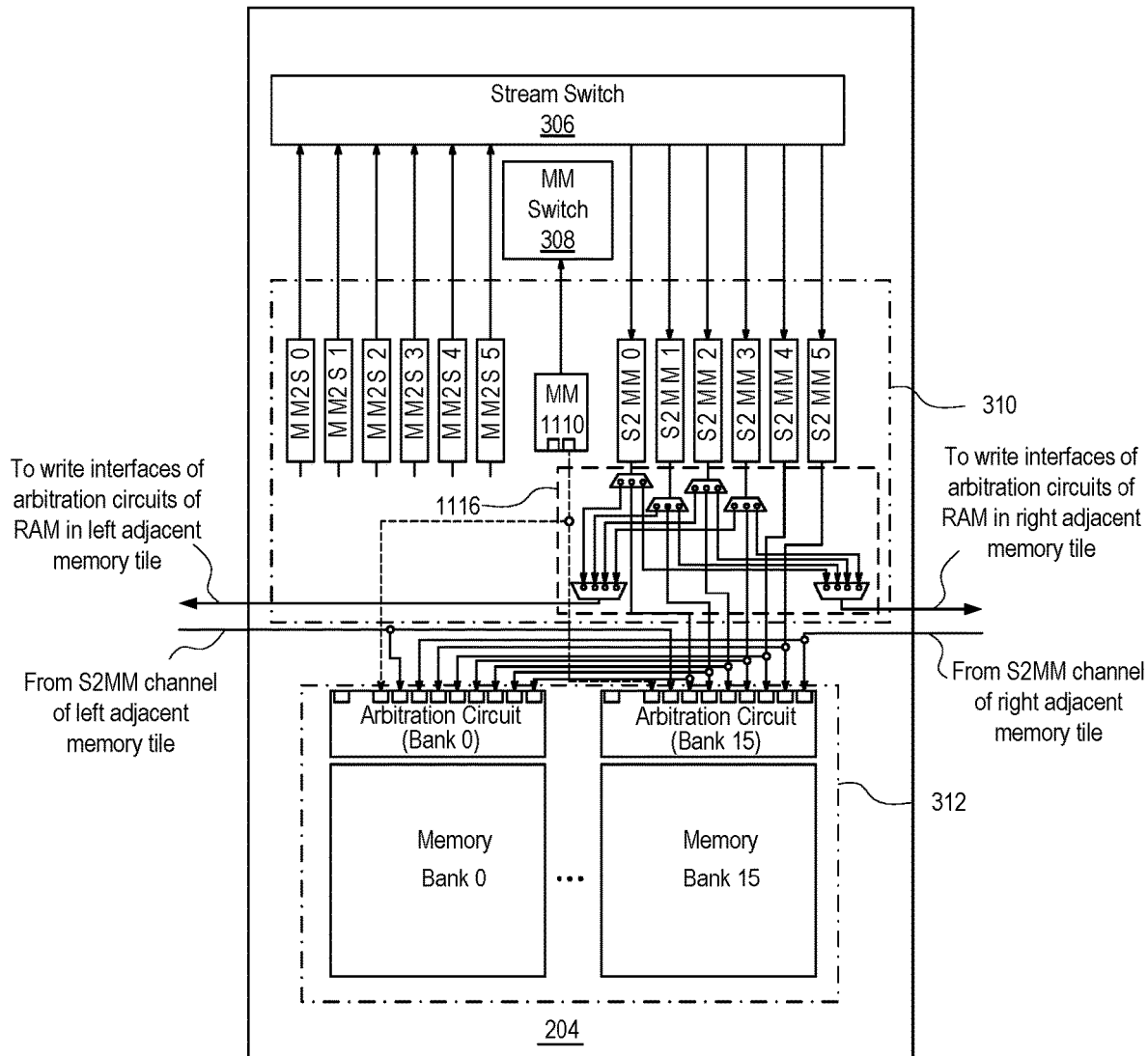

FIGS. 11A, 11B, and 11C illustrate example implementations of memory tile 204. In the example of FIG. 11A, memory tile 204 includes a stream switch 306, a MM switch 308, a DMA engine 310, and a RAM 312. Memory tile 204 also includes broadcast circuitry 1102, optionally event broadcast circuitry 1112, a CDT circuit 1104, control registers 1106, and a lock circuit block (shown as "locks" in FIG. 11A) 1108.

In the example of FIG. 11A, stream switch 306 is coupled to DMA engine 310, to CDT circuit 1104, and to the stream switch located in each tile of DPA array 102 that is adjacent to memory tile 204 of FIG. 11A. In the example, stream switch 306 connects to other stream switches in adjacent tiles above, below, to the right, and to the left of memory tile 204. The adjacent tiles may be one or more other memory tiles 204, one or more DPE tiles 202, one or more interface tiles 208, or a combination thereof depending on the arrangement of tiles and location of memory tile 204 therein. The particular tiles of DPE array 102 that are adjacent to memory tile 204 will vary based on the particular grid arrangement implemented for DPE array 102.

In one or more other example implementations, stream switch 306 may be connected to DMA engine 310 and to stream switches in fewer adjacent tiles of DPE array 102. In one aspect, stream switch 306 may be connected to the stream switch of only adjacent tiles of DPE array 102 that are above and below memory tile 204. In such an example, stream switch 306 is not connected to the stream switches of tiles to the adjacent left and adjacent right.

MM switch 308 is connected to CDT circuit 1104 and to control registers 1106. MM switch 308 is also connected to the MM switch in the tile of DPE array 102 that is adjacent above and the MM switch in the tile of DPE array 102 that is adjacent below memory tile 204. The adjacent tiles above and below memory tile 204 may be one or more other memory tiles 204, one or more DPE tiles 202, one or more interface tiles 208, or a combination of any two tile types. As noted, the particular tiles of DPE array 102 that are adjacent to memory tile 204 will vary based on the grid arrangement of DPE array 102.

DMA engine 310 is capable of accessing, e.g., reading and/or writing, RAM 312 and the RAMs located in any adjacent memory tiles to the left and right of memory tile 204 of FIG. 11A. DMA engine 310 further is connected to lock circuit block 1108 to request certain portions of RAM 312 to be locked to prevent other circuits from accessing the same portions of memory at the same time. Similarly, DMA engine 310 is capable of accessing the locks of adjacent memory tiles to the left and right to request locks on certain portions of the RAM located in each respective adjacent memory tile.

In an example implementation, lock circuit block 1108 is capable of providing 64 semaphore locks and a 6-bit state per lock. Each lock circuit block 1108 is accessible by the DMA engine in the same memory tile and the DMA engine in each adjacent memory tile to the right and/or to the left.

Event broadcast circuitry 1102 and 1112 is connected to event broadcast circuitry located in tiles of DPE array 102 that are adjacent to memory tile 204 of FIG. 11A. In the example, broadcast circuitry 1102 connects to other event broadcast circuitry in adjacent tiles above, below, and to the left of memory tile 204. Event broadcast circuitry 1112 connects to other event broadcast circuitry in adjacent tiles above, below, and to the right of memory tile 204. Event broadcast circuitry 1102 is coupled to event broadcast circuitry 1112. The adjacent tiles may be one or more other memory tiles 204, one or more DPE tiles 202, one or more interface tiles 208, or some combination thereof. The particular tiles of DPE array 102 that are adjacent to memory tile 204 will vary based on the grid arrangement of DPE array 102.

Event broadcast circuitry 1102, 1112 is capable of operating similar to event broadcast circuitry in other tiles of DPE array 102. For example, event broadcast circuitry 1102 and 1112 are capable of conveying events received from other tiles and/or circuitry of IC 100 to particular destinations. Event broadcast circuitry 1102, 1112 are also capable of generating events. The events generated by event broadcast circuitry 1102, 1112 relate to operations performed by memory tile 204. Examples of events that may be generated by event broadcast circuitry 1102 and/or event broadcast circuitry 1112 may include, but are not limited to, the start and/or completion of a read operation by DMA engine 310, the start and/or completion of a write operation by DMA engine 310, and the start and/or end of a transaction conducted by stream switch 306. Event broadcast circuitry 1102, 1112 may be programmed by control registers 1106 to detect selected ones of the example events and to forward selected ones of such events to a particular destination such as other event broadcast circuitry and/or CDT circuit 1104.

In another example implementation, memory tile 204 may include only event broadcast circuitry 1102 (omit event broadcast circuitry 1112). In cases where event broadcast circuitry 1112 is omitted and event broadcast circuitry 1102 connects to another tile above and/or below that includes two instances of event broadcast circuitry (e.g., an interface tile 208 and/or a DPE tile 202), event broadcast circuitry 1102 may include additional ports so as to connect to both instances of event broadcast circuitry in such tile(s) above and/or below. Further, event broadcast circuitry 1102 would connect to event broadcast circuitry in adjacent tiles to the right and to the left of memory tile 204.

CDT circuit 1104 is capable of performing operations similar to other CDT circuits described herein. For example, CDT circuit 1104 is capable of performing control, debug, and trace operations within memory tile 204. Regarding debug, each of the registers located in memory tile 204 is mapped onto the memory map accessible via MM switch 308. CDT circuit 1104 may include circuitry such as, for example, trace hardware, trace buffers, performance counters, and/or stall logic. Trace hardware of CDT circuit 1104 is capable of collecting trace data. Trace buffers of CDT circuit 1104 are capable of buffering trace data. CDT circuit 1104 is further capable of outputting the trace data to stream switch 306.

In an example implementation, CDT circuit 1104 is capable of packetizing event data received from event broadcast circuitry 1102 and forwarding the packetized event data to stream switch 306. Any trace data generated by CDT 1104 may also be packetized prior to forwarding such data to stream switch 306. Stream switch 306 is capable of forwarding the packetized event data to other destinations via other connected stream switches.

Configuration data may be loaded into control registers 1106 through MM switch 308. Configuration data loaded into control registers 1106 dictates operation of memory tile 204. For example, configuration data loaded into control register 1106 may be used to configure which events are generated by event broadcast circuitry 1102, 1112 and/or passed on to other destinations, logical connections established by stream switch 306 with other stream switches, which RAMs of memory tiles DMA engine 310 is able to access, and/or debug and trace modes implemented by CDT circuit 1104.

By loading appropriate configuration data into control registers 1106, different ones of memory tiles 204 may be interconnected (e.g., logically) using stream switches 306 and/or interconnected to other tiles, e.g., DPE tiles 202, of DPE array 102. Accordingly, based on the configuration data, DMA engine 310 is capable of initiating accesses to RAM 312 therein and/or to a RAM in an adjacent left and/or right memory to effectuate DMA transfers requested by other tiles in DPE array 102.

Any one or more of DPE tiles 202 is/are capable of initiating reads and/or writes of memory tile 204 or a group of memory tiles 204 that form a composite memory (e.g., those memory tiles 204 configured to access one another's RAM 312 using DMA engines 310). A composite memory is formed of two or more memory tiles 204 where the DMA engine 310 in such memory tile(s) 204 is/are capable of reading and/or writing to a RAM 312 in at least one other memory tile 204. In an example implementation, DPE array 102 may be configured to form a plurality of clusters, where each cluster includes one or more DPE tiles 202 and optionally one or more memory tiles 204. Tiles in the same cluster of DPE array 102 may communicate with one another to implement a particular application. Clusters may operate in isolation from one another where each different cluster is capable of running a cluster-specific application (or different instance of an application run in another cluster). The DPE tiles 202 and the memory tiles 204 of a particular cluster may be logically isolated from one another.

By providing a pool of memory in the form of a memory tile 204 or a plurality of memory tiles 204 configured to operate together as a single larger memory, DPE tiles 202 are capable of performing operations more efficiently. DPE tiles 202 may access larger pools of memory within DPE array 102 from one or more memory tiles 204 without having to access memories located outside of DPE array 102 when the memory modules 304 included in DPE tiles 202 are not large enough for efficient execution of an application. Accesses to external memory, for example, may be avoided thereby increasing speed and bandwidth of the DPE array 102.

FIG. 11B illustrates another example implementation of memory tile 204. The example of FIG. 11B illustrates example read channels for memory tile 204. In the example of FIG. 11B, certain components of memory tile 204 have been omitted to better illustrate operation of the read channels. In the example of FIG. 11B, RAM 312 includes a plurality of memory banks. For purposes of illustration, RAM 312 includes 16 memory banks 0-15. Each memory bank has an associated arbitration circuit having a plurality of read and write interfaces.

In an example implementation, RAM 312 may be a 512 KB SRAM. Each of the 16 physical memory banks may be 128-bits wide and 2k words in depth. RAM 312 may be configured to provide ECC memory protection. Each of memory banks 0-15 may be single ported and support one read operation or one write operation each clock cycle. Each of the arbitration circuits 0-15 of memory banks 0-15 may include 9 read interfaces and 9 write interfaces. Each read and write interface may be 128-bits in width. Read interfaces of the arbitration circuits are illustrated in FIG. 11B.

DMA engine 310 includes a plurality of different channels and switching circuitry 1114. In the example, DMA engine 310 includes a plurality of memory mapped-to-stream (MM2S) channels 0-5, a plurality of stream-to-memory mapped (S2MM) channels 0-5, and a MM interface 1110. The MM2S channels and the S2MM channels are connected to stream switch 306. Each MM2S channel is capable of performing read operations. Each S2MM channel is capable of performing write operations.

In an example implementation, the MM2S channels, the S2MM channels, and the MM interface 1110 may be compliant with Advanced Microcontroller Bus Architecture (AMBA) eXtensible Interface (AXI) bus protocols. An AMBA AXI bus is an embedded microcontroller bus interface for use in establishing on-chip connections between circuit blocks and/or systems. AMBA AXI or "AXI" is provided as an illustrative example of an interface and is not intended as a limitation of the inventive arrangements described herein. Other suitable interconnect architectures and/or bus architectures may be used in lieu of AXI.

MM2S channels 0-3 are connected to arbitration circuits 0-15 via switching circuitry 1114 and, as such, are capable of reading data from any one or more of memory banks 0-15. Similarly, via switching circuitry 1114, MM2S channels 0-3 are connected to arbitration circuits 0-15 for memory banks located in adjacent memory tiles to the left and right of the example of FIG. 11B. Accordingly, MM2S channels 0-3 are capable of reading data from any one or more of memory banks 0-15 of adjacent memory tiles to the left and right of the example of FIG. 11B. MMS2 channels 4-5 are connected to arbitration banks 0-15 via switching circuitry 1114 within the same memory tile and are only capable of reading data from memory banks 0-15 in the same memory tile. Using the architecture illustrated in FIG. 11B, DMA engine 310 is capable of initiating reads from memory banks 0-15 within the same memory tile and directing reads to memory banks 0-15 of adjacent memory tiles to the left and/or to the right.

MM2S channels 0-5 are capable of initiating reads of memory banks coupled to each respective one of MM2S channels 0-5. Data read from the memory banks using MM2S channels is read as memory mapped data, converted from memory mapped data to stream data by the respective MM2S channel(s), and sent out as stream data. In one aspect, operation of MM2S channels 0-5 may be controlled by generating and storing buffer descriptors in a buffer descriptor register file (not shown) that is accessible by the MM2S channels 0-5. For example, DMA engine 310 is capable of supporting 48 buffer descriptors that may be shared across all of the DMA channels including MM2S channels 0-5 and S2MM channels 0-5.

In one aspect, each MM2S channel includes a 32-bit stream interface and a 128-bit memory mapped interface to access memory banks. Each of MM2S channels 0-5 supports functions such as address generation, support for 40 tensor address generation, inserting zero padding into the data stream, and the ability to store incremental address offset buffer descriptor calls. To support accessing memory banks of adjacent memory tiles, MM2S channels 0-3 are capable of accessing the locks in the adjacent left and/or right memory tiles. Each of MM2S channels 0-5 further may support task queue and task-complete-tokens, task repeat count, and data compression.

MM interface 1110 includes a read port coupled to arbitration circuits 0-15 and, as such, is capable of reading from any one or more of memory banks 0-15. MM interface 1110 is further connected to MM switch 308 thereby allowing any master circuits connected to MM switches 308 to read from memory banks 0-15 located in the same memory tile 204 as MM interface 1110. Via MM interface 1110, a master may initialize memory banks 0-15.

FIG. 11C illustrates another example implementation of memory tile 204. The example of FIG. 11C illustrates example write channels (e.g., S2MM channels) for memory tile 204. In the example of FIG. 11B, certain components of memory tile 204 have been omitted to better illustrate operation of the read channels.

S2MM channels 0-3 are connected to arbitration circuits 0-15 via switching circuitry 1116 and, as such, are capable of writing data to any one or more of memory banks 0-15. Similarly, via switching circuitry 1116, S2MM channels 0-3 are connected to arbitration circuits 0-15 for memory banks located in adjacent memory tiles to the left and right of the example of FIG. 11C. Accordingly, S2MM channels 0-3 are capable of writing data to any one or more of memory banks 0-15 of adjacent memory tiles to the left and right of the example of FIG. 11C. S2MM channels 4-5 are connected to arbitration circuits for memory banks 0-15 via switching circuitry 1116 within the same memory tile and are only capable of writing data to memory banks 0-15 in the same memory tile. Using the architecture illustrated in FIG. 11C, DMA engine 310 is capable of writing data to memory banks 0-15 within the same memory tile and writing data to memory banks 0-15 of adjacent memory tiles to the left and/or to the right.

S2MM channels 0-5 are capable of initiating writes to memory banks coupled to each respective one of S2MM channels 0-5. Data to be written may be received as data streams via stream switch 306. The data to be written is converted from stream data to memory mapped data by the respective S2MM channel and written to the appropriate memory bank(s). Any acknowledgements may be sent out as stream data. In one aspect, operation of S2MM channels 0-5 may be controlled by generating and storing buffer descriptors in a buffer descriptor register file (not shown) that is accessible by the S2MM channels as described in connection with FIG. 11B.

In one aspect, each S2MM channel includes a 32-bit stream interface and a 128-bit memory mapped interface to access the memory banks 0-15. Each of S2MM channels 0-5 supports functions such as address generation, support for 40 tensor address generation, and the ability to store incremental address offset buffer descriptor calls. To support accessing memory banks of adjacent memory tiles, S2MM channels 0-3 are capable of accessing the locks in the left and/or right adjacent memory tiles. Each of MM2S channels 0-5 further may support task queue and task-complete-tokens, task repeat count, and data decompression. In one aspect, S2MM channels 0-5 also may support out-of-order packet transfers.

Referring to the example circuit architectures of FIGS. 11A-11C in combination with the example of FIG. 2B, a composite memory may be formed of one or more memory tiles 204-1, 204-2, 204-3, 204-4, and/or 204-5. That is, since the DMA engine of each memory tile 204 in the row of FIG. 2B may access the RAM within that memory tile and the RAM of the adjacent left and/or adjacent right memory tile, a larger memory formed of two or three memory tiles, for example, may be formed. The composite memory may be accessed by particular DPEs 202 by way of the stream switches of DPE array 102.

It should be appreciated that in example implementations where memory tiles are not aligned in a same row and are aligned in a same column, the DMA engine capabilities described herein in connection with accessing RAMs of left and right adjacent memory tiles may be implemented for above and below adjacent memory tiles. That is, the DMA engines may form composite memories in columns as opposed to rows.

Figure 12A:
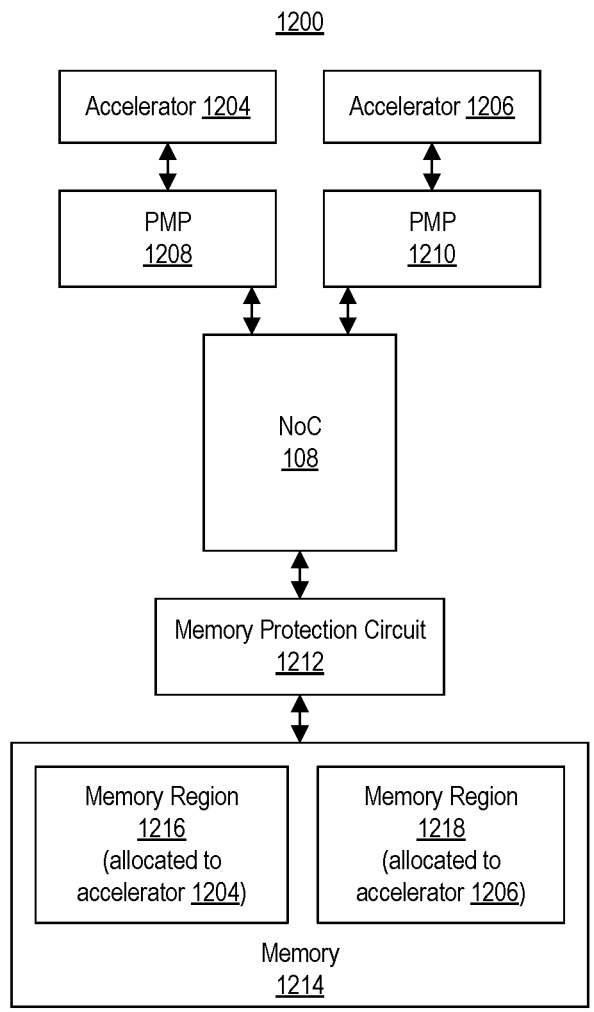
FIGS. 12A and 12B illustrate example circuit architectures for isolating physical memory for multiple applications.
Figure 12B:
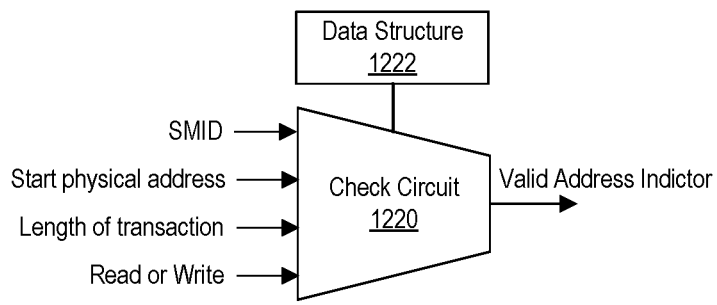

FIGS. 12A and 12B illustrate example circuit architectures for isolating physical memory for multiple accelerators. IC 100 is capable of including two or more different accelerators concurrently. Each accelerator may be implemented in one or more of the various systems described herein. For example, an accelerator may be implemented as one or more tiles of DPE array 102, as circuitry implemented in PL 104, as a hardwired circuit block 112, or the like. An accelerator, for example, may perform a function such as video decoding, error correction, encryption/decryption, etc. Architecture 1200, as implemented in IC 100, is capable of providing isolation for accelerators that operate concurrently within IC 100. Architecture 1200 is capable of preventing a first accelerator from accessing memory that is allocated to a second and different accelerator running concurrently in IC 100 with the first accelerator.

In the example of FIG. 12A, architecture 1200 includes an accelerator 1204 and an accelerator 1206. Accelerator 1204 may be implemented within IC 100 in DPE array 102 using one or more DPE tiles 202 and/or zero, one, or more memory tiles 204; in PL 104; or as a hardened circuit block 112 (e.g., an ASIC). Similarly, accelerator 1206 may be implemented within IC 100 in DPE array 102 using one or more DPE tiles 202 and/or zero, one, or more memory tiles 204; in PL 104; or as a hardened circuit block 112 (e.g., an ASIC).

Accelerator 1204 is operating concurrently within accelerator 1206 within IC 100. It should be appreciated that while two accelerators are shown as running concurrently, in other example implementations, more than two accelerators may operate concurrently within IC 100. Accelerator 1204 is coupled to a physical memory protection (PMP) circuit 1208. Accelerator 1206 is coupled to a PMP 1210. In the example of FIG. 12A, each of PMP circuits 1208 and 1210 is connected to NoC 108. NoC 108 is connected to an optional memory protection circuit (MPC) 1212.

In one aspect, memory 1214 may be an external memory, e.g., a DDR or other RAM external to IC 100. In another example, memory 1214 may be a High Bandwidth Memory (HBM) that is external to IC 100 or implemented as part of IC 100. When included in IC 100, memory 1214 may be implemented on a same die or a different die of IC 100 than accelerators 1204, 1206. IC 100 may access memory 1214 using a memory controller (not shown). In another aspect, memory 1214 may be an internal memory of IC 100. In any case, memory 1214 includes memory region 1216 that is allocated to accelerator 1204 and a memory region 1218 that is allocated to accelerator 1206.

While accelerators 1204 and 1206 may be isolated within IC 100 in that the two accelerators operate independently of one another and do not share data, in cases where accelerators 1204 and 1206 access memory 1214, maintaining isolation becomes more difficult. If accelerator 1204 is permitted to access memory region 1218 or accelerator 1206 is permitted to access memory region 1216, a fault may occur in either one or both of accelerators 1204, 1206. The fault may also jeopardize the security and operability of IC 100 as a whole.

In some implementations, memory protection is implemented using a centralized approach. In a centralized approach, an MPC is implemented at the destination of the transaction. For example, an MPC may be implemented at or in the memory controller that accesses the external memory or at the memory that is being accessed when internal. The MPC discards read and/or write transactions directed to the memory that are not allowed. In the centralized example, PMP circuits 1208, 1210 are not included and memory protection is implemented solely via the MPC located at the destination of the transactions (e.g., the memory).

For purposes of illustration, transactions from accelerator 1204 are only allowed to access the region of memory allocated to accelerator 1204, e.g., memory region 1216. Similarly, transactions from accelerator 1206 are only allowed to access the region of memory allocated to accelerator 1206, e.g., memory region 1216. MPC 1212 is capable of enforcing these restrictions by only allowing transactions having an appropriate identifier for the target memory region to pass.

For example, each master, when initiating a transaction to memory 1214, is capable of including a secure master identifier (SMID) within the transaction. The SMID uniquely identifies the master that originates the transaction. In the example of FIG. 12A, each of accelerators 1204 and 1206 is a master. Accelerator 1204 is may be assigned a first unique SMID, while accelerator 1206 may be assigned a second unique SMID (e.g., different from the first unique SMID). Each transaction from accelerator 1204 or 1206 includes the SMID of the master, the operation to be performed (read or write), and the memory address(es) to be accessed. In some aspects, each accelerator may be assigned a plurality of SMIDs. Still, the SMIDs assigned to a given accelerator are not shared with or common to any other accelerator.

MPC 1212 is capable of storing a data structure in memory included therein. The data structure may be a table that specifies a list of SMIDs and memory ranges of memory 1214 that each master (SMID) is allowed to access. MPC 1212 is capable of receiving a transaction, extracting the SMID therefrom, and locating a matching SMID in the table stored therein. MPC 1212 further compares the address(es) of the transaction with the range of allowable addresses in the table to ensure that the master that originated the transaction is permitted to access the addresses specified in the transaction.

In response to determining that the master is allowed to access the address(es) specified in the transaction, MPC 1212 permits the transaction. In response to determining that the master is not allowed to access the address(es) specified in the transaction, MPC 1212 discards the transaction. As noted, in the case of centralized physical memory protection, MPC 1212 is used and PMP circuits 1208 and 1210 are omitted.

Centralized memory protection, as implemented solely using a circuit such as MPC 1212 without PMP circuits, suffers from several different issues. One issue is the number of entries that may be stored in the table within MPC 1212. The table is limited in size but must also accommodate each master (and/or SMID of the master) within IC 100 that is allowed to access memory 1214. Often the amount of memory available for implementing such a table within MPC 1212 is limited thereby also limiting the number of entries that may be included in the table.

Another issue is that when transactions are rejected by MPC 1212, the transactions have already traversed various pathways through IC 100 and consumed bandwidth. In the example of FIG. 12A, the transactions have already traversed NoC 108. In cases where an accelerator is a "bad actor," the accelerator may intentionally issue transactions that will be rejected by MPC 1212 thereby flooding NoC 108 with invalid transactions. This means that one accelerator can degrade the performance of another accelerator and/or IC 100 by consuming bandwidth on a resource such as NoC 108 that would otherwise be available to a different accelerator.

In accordance with the inventive arrangements described within this disclosure, one or more PMP circuits such as PMP circuits 1208, 1210 may be included. PMP circuits 1208, 1210 may be distributed and implemented near the source of the transactions rather than the destination of the transactions. For example, PMP circuits 1208, 1210 are local to the source of the transactions (e.g., accelerators 1204, 1206, respectively) in that PMP circuits 1208, 1210 may be implemented within IC 100 within a predetermined wire distance of their respective transaction sources. PMP circuits 1208, 1210 are capable of discarding transactions under certain circumstances before the transactions consume bandwidth over signal paths of IC 100. Referring to the example of FIG. 12A, PMP circuit 1208 is capable of discarding invalid transactions from accelerator 1204 prior to such transactions entering or traversing through NoC 108. Similarly, PMP 1210 is capable of discarding invalid transactions from accelerator 1206 prior to such transactions entering NoC 108.

In an example implementation, PMP circuits may be implemented within interface tiles 208 of SoC interface 206. More particularly, each DMA engine 712 of an interface tile 208 may include a PMP circuit. By including the PMP circuit in interface tiles 208, invalid transactions originating from DPE array 102 may be stopped at the source. Further, the distributed PMP circuits are capable of operating concurrently in parallel.

In an example implementation where accelerators 1204 and 1206 are implemented in DPE array 102, the SMIDs may be formed of a plurality of bits. In one aspect, the most significant bits (MSBs) of the SMIDs may be obtained from the DPE GCS registers 738 (e.g., the security bits described herein). Each SMID may be 8 bits where the DPE GCS registers 738 may provide the 4 MSBs of the SMID. Any accelerator implemented in DPE array 102 will have those bits in common as the MSBs of the SMID with any other accelerator implemented in DPE array 102. The least significant bits, e.g., the 4 LSBs, may be obtained from the buffer descriptor received by DMA engine 712 for the transaction. Accordingly, for each transaction originating from DPE array 102, DMA engine 712 is capable of generating the SMID by concatenating the 4 MSBs from the DPE GCS registers 738 and the 4 LSBs obtained from the buffer descriptor for the transaction.

Each PMP circuit may include memory configured to store a data structure that specifies the SMIDs that are allowed and corresponding ranges of addresses of memory 1214 that transactions with the specified SMID are allowed to access. In one example implementation, each PMP circuit stores a table of allowable SMIDs and associated addresses or ranges of addresses in memory 1214 that may be accessed by transactions having the associated SMID.

For example, PMP circuit 1208 may include a table including SMIDs used by accelerator 1204 and the addresses or range(s) of addresses in memory 1214 that are allocated to accelerator 1204. Similarly, PMP circuit 1210 may include a table including SMIDs used by accelerator 1206 and the addresses or range(s) of addresses in memory 1214 that are allocated to accelerator 1206. By distributing the protection, and table, among multiple, different circuits at or near the point of transaction origination, the tables included in each respective PMP circuit 1208, 1210 may be smaller than when implemented at the destination (e.g., in MPC 1212) using a centralized protection approach. For example, once the accelerators are allocated to particular tiles of DPE array 102 and assigned to particular interface tiles 208, the table stored in PMP circuit 1208 need only include data for accelerator 1204 and not include data corresponding to accelerator 1206. Similarly, the table stored in PMP circuit 1210 need only include data for accelerator 1206 and not include data corresponding to accelerator 1204.

As an example, the table stored in each PMP circuit may include a plurality of entries. Each entry may include an SMID, a start physical address of the range (range_start), a number of bytes in the range (range_length), and whether the range can be read and/or written (access_types).

In another example implementation, the data structure stored by each PMP circuit may be a bit map that covers memory 1214. For example, each bit in the bitmap can represent a specific page of memory 1214 and indicate whether the page is accessible by the accelerator(s) handled by the PMP circuit. Rather than indicating address ranges of memory 1214, the bitmap may be used to check which page(s) of memory 1214 a given DPE tile 202 or accelerator (based on SMID) is capable of accessing.

The data structures (e.g., tables or bitmaps) of the PMP circuits may be managed by the operating system of a host computer or a guest operating system when virtualization is used in the host computer. Valid physical address ranges can be efficiently programmed by the operating system or guest operating system via the MM switches. Using the MM switches, for example, the data structures of the PMP circuits may be updated as different accelerators are implemented in the systems of IC 100 over time.

Because each DMA engine 712 may include a PMP circuit, the PMP circuits utilize physical addresses of memory 1214 as opposed to virtual addresses. Physical addresses of memory 1214, for example, may be known by each respective accelerator 1204, 1206. By using physical addresses instead of virtual address for purposes of checking validity of transactions, address translation need not be performed. The distributed nature of the architecture described effectively removes limitations relating to the number of accelerators that may run concurrently on IC 100 due to data structure size limitations. The distributed architecture also provides greater flexibility to accelerators by providing an increased number of physical address ranges per accelerator.

In cases where the accelerator is implemented in DPE array 102 using the SMID generation technique described, the PMP circuits are capable of regulating the particular addresses of memory 1214 that DPE tiles 202 and/or memory tiles 204 are able to access. Each PMP circuit may compare the SMID and target memory addresses for a given transaction with the list of allowable SMIDs and allowable memory addresses stored therein. In response to determining that the SMID of the transaction is on the list of allowable SMIDs and that the memory addresses to be accessed by the transaction are allowed for the SMID of the transaction, the PMP circuit allows the transaction to pass. The transaction is determined to be valid. If either the SMID of the transaction does not match the allowable SMIDs or the addresses to be accessed by the transaction do not match the allowed addresses, the PMP circuit discards the transaction as invalid.

It should be appreciated that while two accelerators are shown as running concurrently, in other examples, more than two accelerators may operate concurrently in IC 100. Each accelerator may be allocated a PMP circuit. While each PMP circuit may process transactions from one or more accelerators.

FIG. 12B illustrates an example implementation of a PMP circuit such as PMP circuit 1208 and/or 1210. In the example of FIG. 12B, PMP circuit 1208, 1210 includes a check circuit 1220. In the example of FIG. 12B, check circuit 1220 receives data from the buffer descriptor received by the DMA engine. As shown, check circuit 1220 receives the SM ID, a start physical address for the transaction to be checked, the length of the DMA transfer (e.g., amount of data to be transferred by the transaction), and whether the transaction is a read or a write.

Check circuit may be coupled to a memory that stores data structure 1222. In one aspect, data structure 1222 is a table as described in connection with FIG. 12A. Check circuit 1220 is capable of indexing into data structure 1222 and computing whether each byte of the DMA transfer involving memory 1214 is allowed based on the entry located using the SM ID, the type (e.g., read or write) of access being requested, the start physical address for the access, and the length of the transaction. Each byte to be transferred to or from memory 1214 must be in the allowed range in the entry located using the SMID and permitted for the type of transaction to be performed (read or write). In response to determining that a given transaction is valid, e.g., each byte is valid, check circuit 1220 is capable of asserting the valid address signal indicating a valid transaction (e.g., a logic high). The transaction is permitted to pass as valid in response to the valid address signal indicating a valid address. In response to determining that a given transaction is invalid, check circuit 1220 is capable of de-asserting the valid address signal indicating that the transaction is invalid. The transaction may be discarded.

In the case where data structure 1222 is a bitmap as described in connection with FIG. 12A, data structure 1222 may include a separate bitmap corresponding to read and write transactions. A first bitmap may be used for write transactions while a second bitmap may be used for read transactions. In one aspect, each bitmap may be stored in a different internal memory, e.g., an SRAM, coupled to check circuit 1220.

Check circuit 1220 is capable of determining whether each transaction is allowed to access each page from memory 1214 necessary for the DMA transfer. Further, check circuit 1220 determines that each page needed for the DMA transfer may be accessed for the specified transaction type. Check circuit 1220 is capable of determining each page of memory 1214 involved in the DMA transfer and confirming that the application (originating master) is permitted to access such pages with the given transaction type. In response to determining that a given transaction is valid, check circuit 1220 is capable of asserting the valid address signal indicating a valid transaction. The transaction is permitted to pass as valid in response to the valid address signal indicating a valid address. In response to determining that a given transaction is invalid, check circuit 1220 is capable of de-asserting the valid address signal indicating that the transaction is invalid. The transaction may be discarded.

While example implementations of accelerators 1204, 1206 are described in connection with DPE array 102, in other example implementations, the accelerators may be implemented in different systems and/or a combination of systems of IC 100. Accordingly, PMP circuits may be implemented in a distributed manner in various locations of IC 100 local to transaction sources. For example, PMP circuits may be implemented in NMUs 402 of NoC 108. NMUs 402 are described in connection with FIG. 4. Each NMU 402 may include one PMP circuit. Inclusion of PMP circuits in NMUs 402 also allows transactions to be checked for validity local to the origination point as opposed to the destination point thereby avoiding the situation where an accelerator floods the pathways of IC 100 (e.g., NoC 108) with invalid transactions. Such transactions may be discarded prior to the transactions traversing through NoC 108. Such PMP circuit implementations may be used in combination with accelerators implemented in DPE array 102, PL 104, and/or as hardwired circuit blocks 112.

In the example of FIG. 12, MPC 1212 optionally may be included. For example, MPC 1212 may be included to safeguard memory 1214 in cases where PMP circuits may not be implemented for each master in IC 100. In other example implementations where sufficient PMP circuits are implemented in IC 100 such that each accelerator is allocated to a PMP circuit, MPC 1212 may be omitted.

PMP circuits as described in connection with FIG. 12 may be incorporated within any of the various circuits described herein at or close to the origination point of the transactions to check the validity of such transactions passing therethrough. Such circuits, whether an interface circuit or a DMA engine, for example, may be adapted to pass or drop received transactions based on the status of the valid address indicator signal output from the PMP circuit.

Inclusion of the PMP circuits not only protects memories such as memory 1214 or RAM from being improperly accessed by accelerators, but also protects other types of memories in IC 100 from improper access. For example, the available memory of IC 100 may include internal memory (RAM), configuration and/or control registers, on-chip memory of PS 106, on-chip memory of PMC 110, and/or external memory. Each of the noted memories conforms to a unified address space for IC 100. The PMP circuits, by checking validity of transactions as described, also prevents accelerators from improperly accessing any of the different types of memory described beyond RAM or application memory thereby further securing IC 100.

Figure 13A:
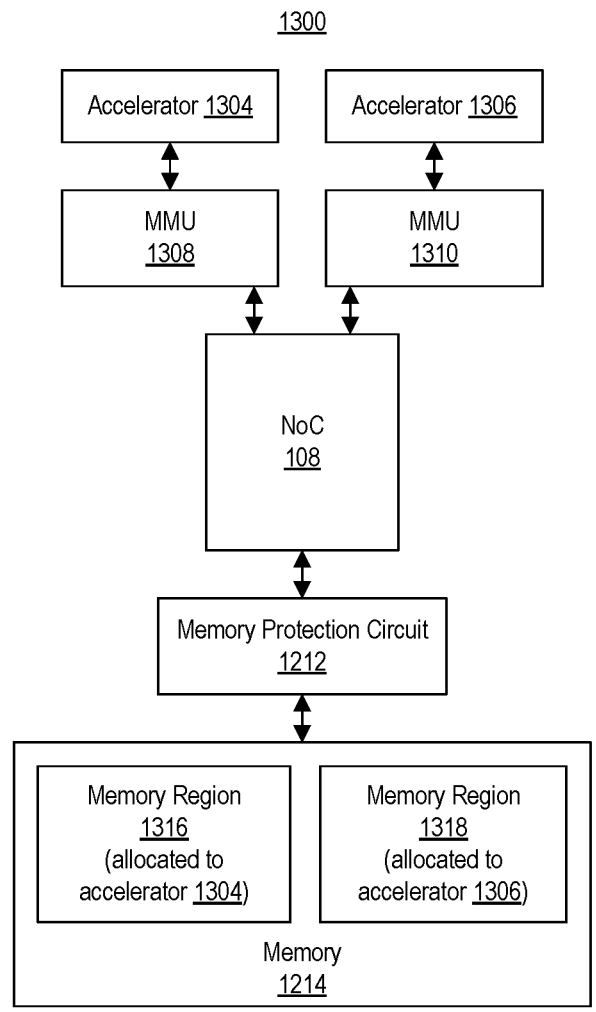
FIGS. 13A and 13B illustrate example circuit architectures for performing virtual address translations.
Figure 13B:
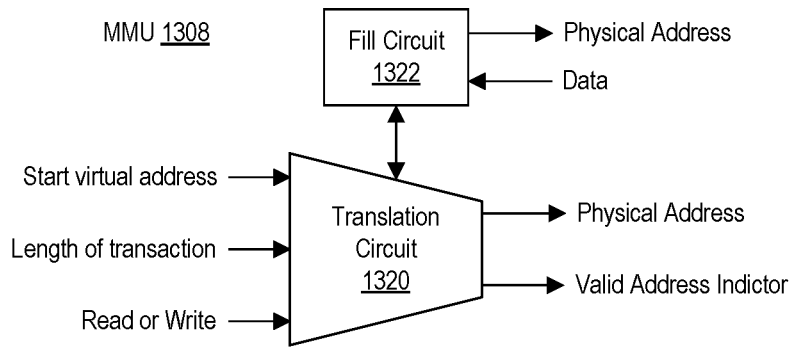

FIGS. 13A and 13B illustrate example circuit architectures for performing virtual address translations. In the example of FIG. 13A, architecture 1300 includes an accelerator 1304 and an accelerator 1306. Accelerators 1304 and 1306 may operate concurrently in IC 100. Accelerators 1304, 1306 may be implemented largely as described in connection with FIG. 12 in that accelerators 1304, 1306 may be implemented in any of the various systems of IC 100 described herein. In the example of FIG. 13, accelerators 1304, 1306 are virtual accelerators in that each utilizes virtual addresses as opposed to physical addresses.

Accelerator 1304 is coupled to a memory management unit (MMU) 1308. Accelerator 1306 is coupled to MMU 1310. In the example of FIG. 13A, each of MMUs 1308, 1310 is connected to NoC 108. NoC 108 is connected to optional MPC 1212. Memory 1214 includes memory region 1316 that is allocated to accelerator 1304 and a memory region 1318 that is allocated to accelerator 1306.

FIG. 13A illustrates an example implementation where MMU functionality is distributed or decentralized to a plurality of different MMU circuits rather than using a centralized MMU. In conventional systems, a single, centralized MMU is implemented as part of a processor system to serve the entire IC. The MMU services requests to translate virtual memory addresses to physical memory addresses (address translation requests). In the example of FIG. 13A, for each of accelerators 1304 and 1306 to access their respective allocated regions 1316, 1318 of memory 1214, each application must first request translation of a virtual address to a physical address. As the number of accelerators in the IC increases, the number of address translation requests to the centralized MMU also increases. Thus, in cases where many different circuits require address translation functionality, accessing a centralized MMU adds latency to each transaction and may cause bottlenecks that limit data throughput in the IC.

In the example of FIG. 13A, MMUs may be added to interface tiles 208 of SoC interface 206. The distributed MMUs within interface tiles 208 are capable of operating concurrently and in parallel. By including a plurality of distributed MMUs within IC 100, several different benefits may be achieved. In one aspect, the latency of accessing a centralized MMU and the bottlenecks that limit data throughput may be avoided. Each interface tile 208 in which an MMU is implemented is capable of translating virtual addresses to physical addresses.

In another aspect, a centralized MMU must cover the entire data set being accessed by all the accelerator implemented in IC 100. As a result, the centralized MMU is larger in size to store a data structure large enough to perform the address translations for all of the accelerators. The decentralized MMUs may be smaller in size relative to the centralized MMU implementation because each MMU need only translate a limited set of virtual addresses. For example, each MMU may translate virtual addresses for a limited number of accelerators (e.g., a subset of the accelerators in IC 100 or a single accelerator). In another example, each MMU may include only the data set necessary for address translation to service the accelerator or subset of accelerators that use the particular MMU. For example, an MMU disposed in an interface tile 208 need only include the data set necessary for address translation to service the accelerator or subset of accelerators of DPE array 102 that use the particular interface tile 208 in which the MMU is disposed.

In another aspect, using decentralized MMUs that are allocated to particular accelerators allows each MMU to use a single page size (e.g., the page size supported by the accelerator(s) allocated to the respective MMU), thereby reducing the complexity and size of the MMU. A centralized MMU must support different page sizes such as 4 KBs, 16 KBs, etc. as required by the CPU. In cases where the decentralized MMUs support larger page sizes, fewer entries in the address translation data structures stored in the MMUs are needed. Fewer entries are needed to cover the same amount of memory than compared with MMUs that must also support smaller page sizes. This feature further reduces the size of the distributed MMUs.

In the example of FIG. 13, MMUs 1308, 1310 may be local to accelerators 1304, 1306, respectively, in that MMUs 1308, 1310 may be implemented within IC 100 within a predetermined wire distance of their respective transaction sources. In addition, since address translation may be performed at or near the point of transaction origination, the addresses used in NoC 108 are validated physical addresses. Further, the additional circuitry needed to create data paths between accelerators that require address translation and a centralized MMU that may be implemented in PS 106 can be omitted from IC 100.

FIG. 13B illustrates an example implementation of a decentralized MMU such as MMU 1308. The example architecture of FIG. 13B may also be used to implement MMU 1310 or another decentralized MMU within IC 100. In the example of FIG. 13B, MMU 1308 includes a translation circuit 1320 and a fill circuit 1322. In the example of FIG. 13B, translation circuit 1320 receives data from the buffer descriptor received by a DMA engine such as DMA engine 712. As shown, translation circuit 1320 receives the start virtual address for the transaction, the length of the DMA transfer (e.g., amount of data to be transferred by the transaction), and whether the transaction is a read or a write. In response to receiving the data, translation circuit 1320 submits a request to fill circuit 1322 for a physical address translation of the received virtual address.

Fill circuit 1322 may include an associative data structure such as a lookup table that may be used to perform the translation. Fill circuit 1322 searches the data structure contained therein for an entry matching the request received from translation circuit 1320. For example, fill circuit 1322 may search the data structure therein for a virtual address corresponding to the start virtual address. In response to determining a matching entry for the received virtual address (e.g., a hit), fill circuit 1322 provides the physical address mapped to the received virtual address back to translation circuit 1320. In response to determining that the data structure does not contain an entry matching the received virtual address (e.g., a miss), fill circuit 1322 is capable of requesting further data from a page table in memory 1214 to update the data structure contained in fill circuit 1322. For example, fill circuit 1322 may send a physical address to fetch data from memory 1214 to refresh the data structure contained therein. Fill circuit 1322 is capable of continuing to search the updated data for an entry matching the received start virtual address and further continue fetching data from memory 1214 to find a match to the received virtual address.

Translation circuit 1320, in response to receiving the physical address translated from the virtual address from fill circuit 1322, is capable of outputting the physical address. Translation circuit 1320 further is capable of asserting a valid address signal indicating that the physical address being output is valid (e.g., a logic high).

In one or more example implementations, fill circuit 1322 may limit the number of times that data is obtained from the page table. In response to a miss after the enumerated number of data retrievals from the page table, fill circuit 1322 may return an invalid physical address. In response, translation circuit 1320 may output a signal indicating that the address being output therefrom is not valid (e.g., de-assert the valid address indicator or output a logic low).

In the example of FIG. 13, MPC 1212 still may be included to check that each transaction received to access memory 1214 is allowed to access the intended region of memory. In another example implementation, the decentralized MMUs may be included in NoC 108. For example, NMUs 402 as described in connection with FIG. 4 may be implemented to include MMUs. Each NMU 402 may include one MMU. Inclusion of MMUs in NMUs 402 also supports a decentralized implementation of MMUs within IC 100. Further, in implementations where MMUs are included at the boundaries of NoC 108, MMUs may be used for accelerators that are implemented as hardwired circuit blocks and/or implemented within PL 104. A distributed MMU as described in connection with FIG. 13 may be incorporated within any of the various circuits described herein that may require address translation. Such circuits, whether an interface circuit or a DMA engine, for example, may be adapted to use a distributed MMU as described herein.

Figure 14A:
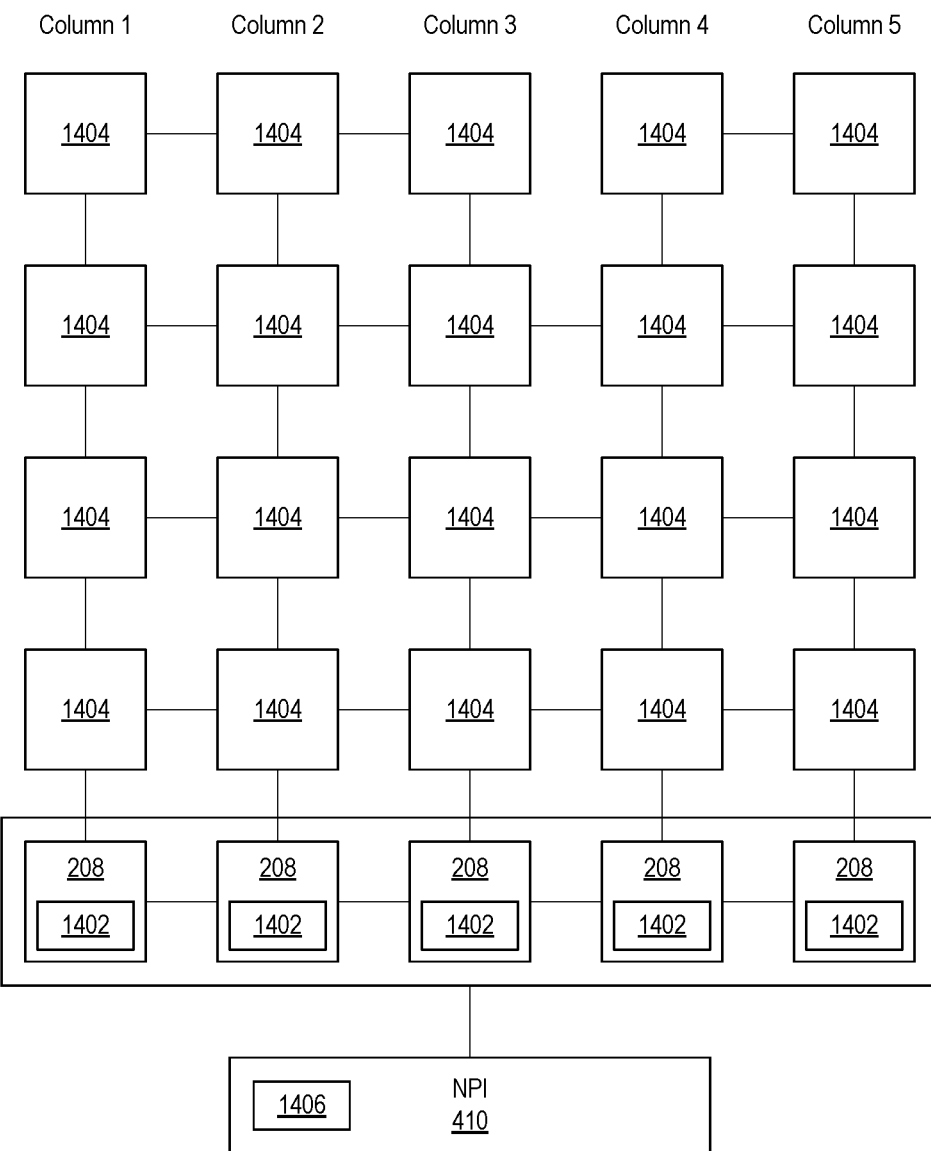
FIGS. 14A-14C illustrate example circuit architectures for providing secure register access for virtualized accelerators.
Figure 14B:
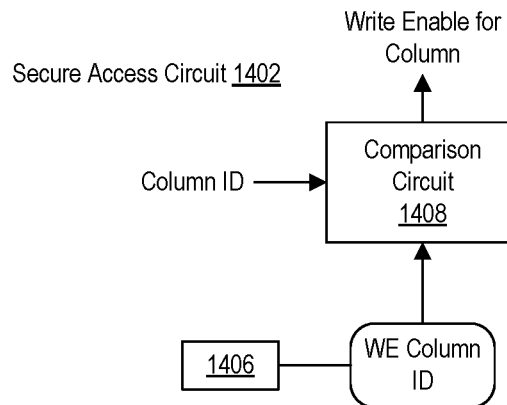
Figure 14C:
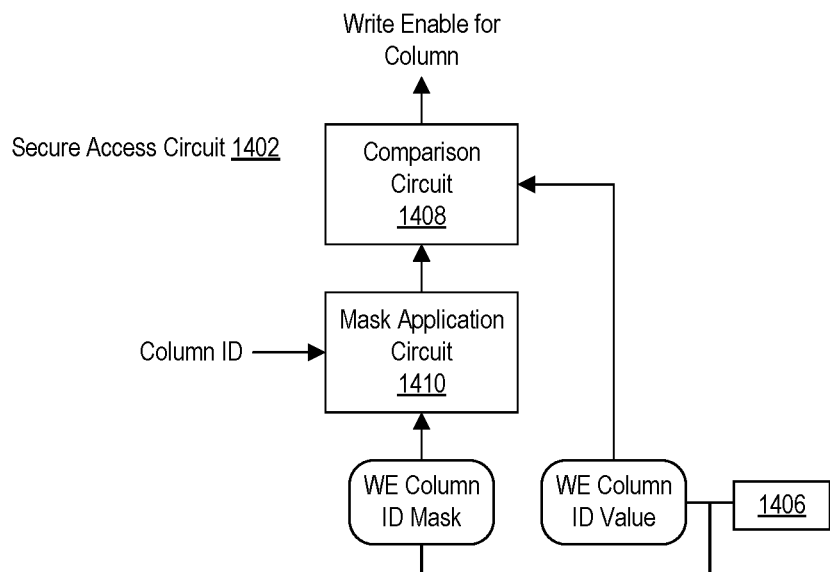

FIGS. 14A-14C illustrate an example circuit architecture for providing secure register access for virtualized accelerators. The example of FIG. 14A illustrates an implementation of DPE array 102 having an SoC interface 206 including interface tiles 208. DPE array 102 also includes tiles 1404 which may include any combination of DPE tiles 202 and/or memory tiles 204. SoC interface 206 is coupled to NoC interfaces 726 of NoC 108, which include NPI 410.

In the example of FIG. 14A, each interface tile 208 includes a secure access circuit 1402. In one aspect, secure access circuits 1402 may be enabled based on a value that is written to a secure access register that may be located within DPE GCS registers 738. The value may be specified in whole or in part by one or more of the security bits. The value stored in the secure access register determines whether secure access circuits 1402 are enabled to implement secure transactions for DPE array 102. For example, when enabled, each secure access circuit 1402 is capable of determining whether incoming memory mapped write transactions meet certain security criteria. When not enabled, secure access circuits 1402 do not check memory mapped write transactions entering interface tiles 208 for the criteria. The value written to the secure access register may also allow writing to a write enable register 1406 located in NPI 410.

In an example implementation, each column of tiles 1404 has a unique column ID that is hardwired into IC 100. For example, the unique column ID may be specified using e-fuses or by tying circuit nodes to VCC or ground. Because the column ID for each column of tiles 1404 is implemented in silicon in IC 100, the column IDs cannot be spoofed or changed. In cases where secure transactions are enabled based on the value written to the secure access register, write enable register 1406 may be written by privileged software executing in a host computer via a communication bus such as a PCIe bus, PS 106, or PMC 110 with data that facilitates secure access to one or more columns of tiles 1404.

Secure access circuits 1402 are capable of performing a comparison of the data written to write enable register 1406 and the hardwired column ID. In response to determining that the data matches the column ID for a column of tiles 1404, the secure access circuit 1402 of the column permits the memory mapped transaction to pass to tiles 1404 in that column. In response to determining that the data does not match the column ID, secure access circuit 1402 does not permit the memory mapped transaction to pass to tiles 1404 in the column.

In one aspect, secure access circuits 1402 may be implemented in bridge circuit 718 of interface tiles 208. In another aspect, secure access circuits 1402 may be implemented as separate or independent circuit blocks in the data path between NoC 108 and bridge circuits 718 in the respective interface tiles 208.

For purposes of illustration, consider an example where a first accelerator is implemented using tiles 1404 of DPE array 102 in columns 1, 2, and 3, while a second accelerator is implemented using tiles 1404 in columns 4 and 5. Each accelerator may be controlled by corresponding program code executing in a host computer or PS 106. For example, the first accelerator may be controlled by first program code (e.g., a first application) and the second accelerator controlled by second program code (e.g., a second application). In cases where secure transactions are enabled for the entire DPE array 102 on a global basis, both the first application and the second application may write to control registers or memory attached to MM switches in DPE array 102. This means that the first application may interfere with the second accelerator and the second application may interfere with the first accelerator. Such implementations, for example, omit the secure access circuits 1402. Further, write enable register 1406, rather than being configured to store multiple bits of data that correspond to columns, may only store a single write enable bit. In such implementations, a malicious application may write to registers and/or memories of another accelerator in DPE array 102 thereby creating security concerns.

In the example of FIG. 14A, secure transactions may be enabled and checked on a per column basis for DPE array 102. This means that an application executing in a processor such as PS 106 and/or in a host computer is prevented from writing data to tiles 1404 that implement an accelerator that is not managed or controlled by the application. An application executing in a processor may only write, via MM switches of DPE array 102, to registers and/or memory of tiles 1404 (e.g., the accelerator) belonging to that application. The application is unable to access any registers and/or memory of tiles 1404 belonging to a different application via the MM switches of DPE array 102 so long as the accelerators are partitioned, and assigned to, tiles 1404 in DPE array 102 according to column. That is, a column of tiles 1404 may be used to implement only one accelerator at a time.

FIG. 14B illustrates an example implementation of secure access circuit 1402 of FIG. 14A. In the example of FIG. 14B, secure access circuit 1402 includes a comparison circuit 1408. As discussed, privileged software executing in a host computer, PS 106, and/or PMC 110 writes a write enable column ID to write enable register 1406 in NPI 410. For write transactions directed to DPE array 102, NPI 410 provides the write enable column ID from write enable register 1406 to secure access circuit 1402. The write enable column ID may be provided along with, or as part of, the transaction. Comparison circuit 1408 compares the write enable column ID from NPI 410 with the column ID that is hardwired into IC 100 for the column. In response to determining that the write enable column ID matches the column ID, comparison circuit 1408 asserts a write enable signal (e.g., a logic high). The write enable signal is provided to the various memories and/or control registers of tiles 1404 in the column above so that data from memory mapped write transactions may be to written to the appropriate memories and/or control registers of the column of tiles 1404. In response to determining that the write enable column ID does not match the column ID, comparison circuit 1408 does not assert the write enable signal (e.g., generates a logic low). As such, memory mapped write transactions to the column of tiles are discarded.

Since the value stored in write enable register 1406 may be provided to the secure access circuit 1402 of each of interface tiles 208, only tiles 1404 of one of columns 1-5 may be written at a time. To write to a different column of tiles 1404, a different write enable column ID for a different column must be written to write enable register 1406. Thus, only one column of tiles 1404 may be configured at a time in the example of FIG. 14B. In another aspect, a transaction may be routed to the appropriate column rather than attempting to write to more than one or all columns. Still, the secure access circuit 1402 in that column is capable of performing the check described to ensure that the entity attempting the write operation is authorized or permitted to do so.

FIG. 14C illustrates another example implementation of a secure access circuit 1402 of FIG. 14A. In the example of FIG. 14C, secure access circuit 1402 includes comparison circuit 1408 and a mask application circuit 1410. In the example of FIG. 14C, privileged software executing in a host computer, PS 106, and/or PMC 110 writes a write enable column ID mask and a write enable column ID value to write enable register 1406 in NPI 410. For write transactions directed to DPE array 102, NPI 410 provides the write enable column ID mask to mask application circuit 1410 and the write enable column ID value comparison circuit 1408. In one aspect, in the example of FIG. 14C, write enable register 1406 may be implemented as two separate registers where one stores the write enable column ID mask and the other stores the write enable column ID value.

Mask application circuit 1410 applies the write enable column ID mask to the hardwired column ID to generate an output value. In one example implementation, the write enable column ID mask may specify a range of columns. The range may specify the column ID of the first column of tiles 1404 the range and the column ID of the last column of tiles 1404 in the range. Comparison circuit 1408 compares the output value from mask application circuit 1410 with the write enable column ID value.

In response to determining that the write enable column ID value matches the output value from mask application circuit 1410, comparison circuit 1408 asserts the write enable signal (e.g., a logic high). The write enable signal is provided to the various memories and/or control registers of tiles 1404 in the column above so that data from memory mapped write transaction may be to written to the appropriate memories and/or control registers of the column of tiles 1404. In cases where the write enable column ID value matches the output value from mask application 1410, the column of tiles 1404 is determined to be within the range of columns specified by the write enable column ID mask. In response to determining that the write enable column ID value does not match the output value from mask application circuit 1410, comparison circuit 1408 does not generate a write enable signal (e.g., generates a logic low). As such, memory mapped write transaction to the column of tiles are discarded.

The example of FIG. 14C allows one or more columns, e.g., a range of columns, of tiles 1404 to be written concurrently. This architecture allows one or more columns, e.g., a range of columns, of tiles 1404 to be written based on the write enable column ID mask and the write enable column ID value stored in write enable register 1406. To write to a different range of one or more columns of tiles 1404, a different write enable column ID mask and/or write enable column ID value must be written to write enable register 1406.

The examples of FIG. 14 are described in connection with DPE array 102. In one or more other example implementations, the circuit architectures described in connection with FIG. 14 may be implemented and/or used with any of a variety of other accelerator arrays where the accelerators are arranged in a grid where limited or restricted access to only a particular column or particular range of columns of the accelerators is desired.

Figure 15:
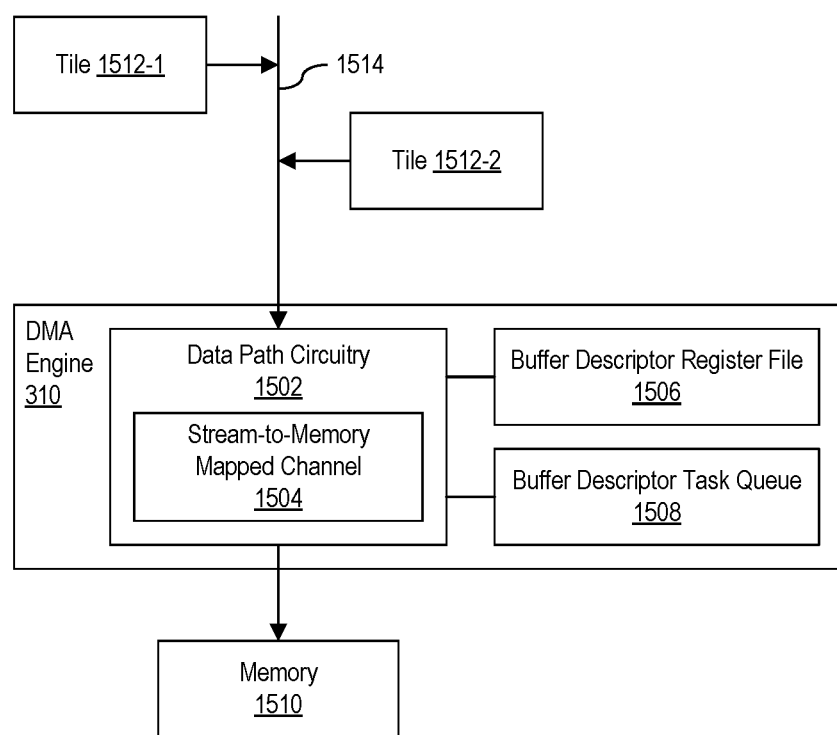
FIG. 15 illustrates example packet processing modes implemented by one or more DMA engines of the IC of FIG. 1.

FIG. 15 illustrates example packet processing modes that may be implemented by one or more DMA engines of IC 100. In the example of FIG. 15, an example implementation of DMA engine 310 is illustrated. The example circuit architecture illustrated in FIG. 15 may be incorporated into other DMA engines implemented in IC 100 to facilitate an "out-of-order" packet processing mode (OOO mode). For purposes of illustration, the example circuit architecture of FIG. 15 may also be used or incorporated within the DMA engine of FIG. 10 and/or DMA engine 616 of DPE tile 202.

In one or more example implementations described herein, DMA engine 310 may be programmed to operate using one of a plurality of different packet processing modes. The packet processing modes may include an "in-order" packet processing mode (IO mode) and the OOO mode. In the example of FIG. 15, DMA engine 310 includes data path circuitry 1502. In the example, data path circuitry 1502 includes a stream-to-memory mapped (S2MM) channel 1504. S2MM channel 1504 may be implemented as one of the S2MM channels described in connection with FIG. 11. In other example implementations, data path circuitry 1502 may include other S2MM channels, MM2S channels, and/or a master memory mapped interface depending on the particular implementation of the DMA engine. Data path circuitry 1502 is coupled to memory 1510. Memory 1510 may be implemented as RAM 312 within the same memory tile or a RAM located in a different memory tile than DMA engine 310.

In the example, DMA engine 310 also includes a buffer descriptor register file 1506 and a buffer descriptor task queue 1508. Buffer descriptor register file 1506 may be implemented as a memory, e.g., a buffer, that is configured to store one or more buffer descriptors. Buffer descriptor task queue 1508 may be implemented as a memory, e.g., a buffer, that is configured to store a list of buffer descriptors. Each buffer descriptor in buffer descriptor register file 1506 includes one or more parameters such as a length of data to be read or written and the address to which the data is to be written or from which the data is to be read. Thus, for purposes of FIG. 15 and S2MM channel 1504, each buffer descriptor specifies where received data, e.g., a packet, is to be written. The list stored in buffer descriptor task queue 1508 specifies the order in which buffer descriptors from buffer descriptor register file 1506 are processed or executed. In one aspect, as part of the IO mode, the order in which buffer descriptors are executed is predetermined based on the list stored in buffer descriptor task queue 1508.

In the example, each of tiles 1512-1 and 1512-2 is connected to bus 1514. Bus 1514 may be implemented, or formed, of the streaming interconnects of the respective tiles 1512 shown. For purposes of illustration, tiles 1512 may be DPE tiles. A DMA engine (e.g., DMA engine 616) within each tile 1512 may include a memory MM2S channel that is sending data to DMA engine 310. That is, DMA engine 310 is receiving data from each of tiles 1512-1 and 1512-2. As an example, each of tiles 1512-1 and 1512-2 may be sending data to be written to memory 1510.

In the example of FIG. 15, tiles 1512 write data to bus 1514. In the IO mode, the data arrives at S2MM channel 1504 from tiles 1512-1 and 1512-2 in a predetermined and known order. That is, data arrives in a deterministic manner as each of tiles 1512-1 and 1512-2 writes data to bus 1514 according to a predetermined schedule. As such, the data arrives at S2MM channel 1504 in that predetermined order, which is expected and known by DMA engine 310. In an example implementation, each received packet may be processed based on a particular buffer descriptor. The order in which buffer descriptors are executed is determined by the ordered list stored in buffer descriptor task queue 1508.

As an illustrative and non-limiting example, buffer descriptor register file 1506 may include a buffer descriptor "BD1" and a buffer descriptor "BD2." BD1 specifies the instructions (e.g., the length or amount of data and the destination address) for storing data received from tile 1512-1. BD2 specifies the instructions for storing data from tile 1512-2. Buffer descriptor task queue 1508 specifies an order of the buffer descriptors. For example, in the case where the predetermined order in which data is received from tiles 1512 is a packet from tile 1512-1 followed by a packet from tile 1512-2, the list stored in buffer descriptor task queue 1508 would be "BD1, BD2." In the case where the predetermined order in which packets are received from tiles 1512 is a packet from tile 1512-2 followed by a packet from tile 1512-1, the list stored in buffer descriptor task queue 1508 would be "BD2, BD1."

In the OOO mode, data from tiles 1512 arrives in an arbitrary or unknown order. In the OOO mode, rather than tiles 1512 placing data on bus 1514 according to a predetermined and known schedule, each tile 1512 may attempt to place data on bus 1514. Each tile 1512, for example, includes arbitration circuitry that controls which tile is allowed to place data onto bus 1514 at any given time. Thus, the particular order in which tiles 1512 place data on bus 1514 and that such data arrives at S2MM channel 1504 is non-deterministic.

In accordance with the inventive arrangements described herein, as part of the OOO mode, packets from tiles 1512 that are sent to DMA engine 310 via bus 1514 are generated to include a header. The header includes a buffer descriptor identifier in a designated field. Rather than rely on the order of buffer descriptor execution specified in buffer descriptor task queue 1508, S2MM channel 1504 is capable of extracting the buffer descriptor identifier from the designated field of the header of the received packet. S2MM channel 1504 determines the buffer descriptor to be executed from buffer descriptor register file 1506 using the buffer descriptor identifier. For example, the buffer descriptor identifier may specify a particular buffer descriptor such as "BD0" or "BD1" or specify an index that may be used to lookup the correct buffer descriptor from buffer descriptor register file 1506. S2MM channel 1504 then processes the payload of the received packet by executing the buffer descriptor specified by the buffer descriptor identifier from the header of the packet itself. By including the buffer descriptor identifier to be used to process the packet within the header of each respective packet, DMA engine 310 is capable of processing packets received in a non-deterministic order.

Accordingly, in one aspect, when operating in the OOO mode, the memory mapped-to-stream channels of the data path circuitry located in the sending DMA engines (e.g., in tiles 1512) are capable of formatting data to be sent to DMA engine 310 as packets. As part of packet generation, the memory mapped-to-stream channels include the data to be sent as the payload of the packet and create the header of the packet to include the buffer descriptor identifier specifying the particular buffer descriptor to be used in processing the packet. The referenced buffer descriptor will have been stored in buffer descriptor register file 1506.

In an example implementation, each different S2MM channel may be independently configured to operate in IO mode or OOO mode. Thus, in cases where DMA engine 310 includes multiple S2MM channels 1504, each may be independently configured to operate in IO mode or OOO mode. In one aspect, each S2MM channel may be configured to use a particular packet processing mode by writing suitable configuration data to the control registers of the memory tile for the respective S2MM channel. The configuration data may specify a particular packet processing mode to use on a per S2MM channel basis. In another aspect, the ability to switch between the packet processing modes may be dynamic in that the S2MM channel may switch between using IO mode and OOO mode during operation.

In an example implementation, S2MM interface 1504 may switch between IO mode and OOO mode based on the data, or lack thereof, stored in buffer descriptor task queue 1508. If, for example, a task stored in buffer descriptor task queue 1508 is a start buffer descriptor, S2MM interface 1504 implements the IO mode. If, for example, the task stored in buffer descriptor task queue 1508 is not a start buffer descriptor (e.g., does not point to a buffer descriptor stored in buffer descriptor register file 1506) and instead indicates OOO mode, S2MM interface 1504 implements the OOO mode.

In one or more other example implementations, the OOO mode supports use of a repeat function. The repeat function may specify a count of packets (e.g., an integer value) of packets that may be processed using a same buffer descriptor specified by the buffer descriptor identifier of the first packet received as part of a plurality of packets from a given tile. For example, tile 1512-1 may send M packets, where "M" is an integer value. In response to receiving the first packet, DMA engine 310 determines the particular buffer descriptor to be executed to process the received data. Further, DMA engine 310 determines that the buffer descriptor indicated by the buffer descriptor identifier is to be used to process M packets. That is, DMA engine 310 processes the first received packet and the next M−1 packets using the same buffer descriptor. DMA engine 310 considers processing the M packets using the same buffer descriptor as a single task. In one aspect, the value of M may be specified in a field of the header of the first packet. In another aspect, the value of M may be specified by the task stored in buffer descriptor task queue 1508.

For purposes of illustration, consider an example where S2MM interface 1504 is to receive packets from N different sources (e.g., tiles 1512-1 and 1512-2, where N=2). In one aspect, S2MM interface 1504, in response to determining that buffer descriptor task queue 1508 does not include any outstanding (e.g., unfinished) tasks (e.g., is empty), implements the OOO mode. Accordingly, buffer descriptor register file 1506 is configured to store, e.g., programmed, with N buffer descriptors. Buffer descriptor register file 1506 may store one buffer descriptor for each source. Each buffer descriptor may specify a base-address to be used and a buffer-length.

In one aspect, a task may be stored in buffer descriptor task queue 1508. The task specifies a number of packets to be processed from each of the N sources. If, for example, each of the N sources sends "M" packets of data, wherein M is an integer value of 1 or more, the task stored in buffer descriptor task queue 1508 specifies N×M packets to be processed. This allows multiple packets sent from a same source to be processed using a same buffer descriptor. A new buffer descriptor need not be stored in the buffer descriptor register file 1506 for each packet to be processed, which improves data transfer efficiency within IC 100.

Asynchronously to the above, a buffer descriptor is configured and stored in the buffer descriptor register file of each respective MM2S channel of tiles 1512-1 and 1512-2. Further, an in-order task is inserted into the buffer descriptor task queue of each respective MM2S interface of tiles 1512-1 and 1512-2. Each of tiles 1512-1 and 1512-2 may push data onto bus 1514 concurrently. Arbitration hardware implemented in each stream switch allows a full data transfer from one source (e.g., of all "M" packets from the source) past the merge point before arbitration is granted to another source.

In response to a packet, S2MM interface 1504 reads the packet header and extracts the buffer descriptor identifier. S2MM interface 1504 retrieves, from buffer descriptor register file 1506, the buffer descriptor specified by the buffer descriptor identifier. S2MM interface 1504 executes the retrieved buffer descriptor to process the received packet. In processing the packet, S2MM interface 1504 drops or discards the header of the packet and stores the remaining portion of the packet (e.g., the payload), at the correct address determined from the buffer descriptor. The length of the packet, once the header is dropped, matches the buffer-length in the buffer descriptor. In response to detecting a TLAST on a word mid-buffer or detecting that TLAST is missing from the last word, S2MM interface 1504 may generate an error event (e.g., via the event broadcast circuitry). S2MM interface 1504 may repeat this process for each packet from the same source.

In example implementations where the repeat functionality is used, once the process is repeated for N×M packets (e.g., M packets from each of the N sources), S2MM channel 1504 considers the task from buffer descriptor task queue 1508 complete. S2MM channel 1504, in response to determining that the task is complete, is capable of issuing a task-complete-token and further is capable of attempting to execute a next task in buffer descriptor task queue 1508.

In one aspect, since each buffer descriptor may be used to process more than one packet from a given source, S2MM channel 1504 may include iteration-state address offset circuitry that adjusts the address to which data is written for each iteration using the same buffer descriptor to prevent unintended or incorrect overwriting of data. Once the task is complete, memory 1510 will store N×M sub-buffers that, taken collectively, may be considered a single larger buffer for future data movement operations.

In other example implementations, tasks may be specified on a per source basis such that each different source may transfer a different number "M" of packets if so configured. In such cases, the task is complete when "M" packets from a given source are written. As noted, repeat functionality may not be used. In such cases, in the OOO mode, each packet may specify the particular buffer descriptor to be used to process the packet by way of the buffer descriptor identifier in the designated field of the header of the packet.

As noted, S2MM channel 1504 is capable of switching modes using a variety of different mechanisms. For example, S2MM channel 1504 may be configured to operate in a selected packet processing mode by loading suitable configuration data in the control registers of the tile that determines the packet processing mode. In another example, S2MM channel 1504 may initiate OOO mode in response to detecting that no task is stored in buffer descriptor task queue 1508. In still another example, S2MM channel 1504 may initiate OOO mode in response to detecting a particular type of task stored in buffer descriptor task queue 1508. In that case, the task may also specify a value to be used for repeat function processing. In any case, buffer descriptors may be used to process more than one packet from a given source. As such, buffer descriptors do not need to be written to buffer descriptor register file 1506 for each packet to be processed, which significantly reduces the overhead of initiating DMA data transfers.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise. As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

The terms first, second, etc. may be used herein to describe various elements. These elements should not be limited by these terms, as these terms are only used to distinguish one element from another unless stated otherwise or the context clearly indicates otherwise.

The corresponding structures, materials, acts, and equivalents of all means or step plus function elements that may be found in the claims below are intended to include any structure, material, or act for performing the function in combination with other claimed elements as specifically claimed.

An IC can include a DPE array having a plurality of tiles. The plurality of tiles can include a plurality of DPE tiles and a plurality of memory tiles. Each DPE tile can include a stream switch, a core configured to perform operations, and a memory module. Each memory tile can include a stream switch, a DMA engine, and a RAM. The DMA engine of each memory tile may be configured to access the RAM within the same memory tile and the RAM of at least one other memory tile. Selected ones of the plurality of DPE tiles can be configured to access selected ones of the plurality of memory tiles via the stream switches.

The foregoing and other implementations can each optionally include one or more of the following features, alone or in combination. Some example implementations include all the following features in combination.

In one aspect, the DPE array includes an SoC interface having a plurality of stream switches coupled to the stream switches of the plurality of DPE tiles and the stream switches of the plurality of memory tiles. The SoC interface communicatively links the DPE array with one or more other circuit blocks of the IC.

In another aspect, the memory tiles are arranged in one or more rows between a plurality of rows of DPE tiles and the SoC interface.

In another aspect, the DMA engine of a selected memory tile is configured to access the RAMs of at least two other memory tiles.

In another aspect, the stream switch of a selected memory tile is configured to establish a logical connection with a stream switch of a selected DPE tile, wherein the logical connection couples the selected DPE tile with the DMA engine of the selected memory tile to pass data between the selected memory tile and the DPE tile.

In another aspect, the plurality of tiles are arranged in a grid having rows and columns. The stream switch of each memory tile connects to the stream switch of an above adjacent tile and the stream switch of a below adjacent tile in the same column. The stream switches of adjacent memory tiles in same rows may also be connected.

In another aspect, the stream switch of each DPE tile connects to the stream switch of each adjacent tile.

In another aspect, each column of tiles includes one or more DPE tiles and one or more memory tiles.

In another aspect, one or more columns of tiles include DPE tiles and no memory tiles; and, one or more other columns of tiles include memory tiles and no DPE tiles.

In another aspect, the plurality of DPE tiles are arranged in a grid having a plurality of rows and a plurality of columns. The plurality of memory tiles are interspersed within one or more of the rows such that the one or more rows include one or more DPE tiles and one or more memory tiles.

In another aspect, each memory tile includes event broadcast circuitry. The event broadcast circuitry of the memory tiles may be interconnected forming an event broadcast network that is independent of a network formed by the stream switches. The event broadcast network may convey events detected within the memory tiles.

In another aspect, the event broadcast network of the plurality of memory tiles is configured to convey debug and trace information for the plurality of memory tiles.

In another aspect, each of the memory tiles includes a memory mapped switch. The memory mapped switches of the memory tiles are interconnected forming a memory mapped network that is independent of a network formed by the stream switches. The memory mapped network conveys configuration data to the memory tiles.

In another aspect, the IC includes a PMP circuit coupled to an accelerator circuit, wherein the PMP circuit is local to the accelerator circuit and configured to selectively pass transactions originating from the accelerator circuit to a memory based on a secure master identifier assigned to each transaction and a region of the memory that is to be accessed by each transaction.

In another aspect, the PMP circuit is implemented within an SoC interface of the DPE array or within a NoC of the IC.

In another aspect, the IC includes an MMU coupled to an accelerator circuit, wherein the MMU is local to the accelerator circuit and configured to translate virtual memory addresses used by the accelerator circuit to physical memory addresses.

In another aspect, the MMU is implemented within an SoC interface of the DPE array or within a NoC of the IC.

In another aspect, the IC includes a plurality of protection circuits configured to selectively pass a memory mapped transaction to a selected column of a plurality of columns of tiles of the DPE array based on matching a column identifier corresponding to the memory mapped transaction with a hardwired and unique column identifier assigned to each of the plurality of columns of tiles in the DPE array.

In another aspect, the IC includes a plurality of protection circuits configured to selectively pass a memory mapped transaction to a range of a plurality of columns of tiles of the DPE array based on matching an expected value generated from applying a column identifier mask to a hardwired and unique column identifier assigned to each of the plurality of columns of tiles in the DPE array.

An IC can include a DPE array. The DPE array includes a plurality of memory tiles. A first of the memory tiles can include a first DMA engine, a first RAM connected to the first DMA engine, and a first stream switch coupled to the first DMA engine. The first DMA engine is coupled to a second RAM disposed in a second memory tile. The first stream switch is coupled to a second stream switch disposed in the second memory tile.

The foregoing and other implementations can each optionally include one or more of the following features, alone or in combination. Some example implementations include all the following features in combination.

In another aspect, the first DMA engine is programmable to access the first RAM and the second RAM to form a composite memory formed of the first memory tile and the second memory tile.

In another aspect, the first memory tile and the second memory tile are adjacent.

In another aspect, the first DMA engine is programmable to access a third RAM located in a third memory tile.

In another aspect, the third memory tile is adjacent to the first memory tile.

In another aspect, the first memory tile includes first event broadcast circuitry configured to generate events corresponding to read and write operations of the first DMA engine. The first event broadcast circuitry is programmable to provide selected ones of the events to one or more selected destination circuits.

In another aspect, the first event broadcast circuitry is connected to second event broadcast circuitry of the second memory tile.

In another aspect, the first memory tile includes a control, debug, and trace circuit configured to packetize the selected events and provide the packetized selected events to the first stream switch. The first stream switch is capable of sending the packetized selected events to a further destination circuit.

In another aspect, the first memory tile includes a first lock circuit coupled to the first DMA engine and to a second DMA engine of the second memory tile. The first lock circuit is configured to grant requests for locks for portions of the first RAM received from the first DMA engine and the second DMA engine.

In another aspect, the first memory tile includes a first memory mapped switch configured to receive configuration data to program the first stream switch and the first DMA engine.

In another aspect, the DPE array includes a plurality of tiles arranged in a grid having columns and rows. The first memory mapped switch is connected to a memory mapped switch in an above adjacent tile and a memory mapped switch in a below adjacent tile. The memory mapped switches are capable of conveying configuration data among the tiles of the DPE array in a same column.

In another aspect, the first RAM includes a plurality of first arbitration circuits and a plurality of first memory banks coupled to respective ones of the plurality of first arbitration circuits. Each first arbitration circuit is coupled to a plurality of stream-to-memory mapped channels of the first DMA engine, a plurality of memory mapped-to-stream channels of the first DMA engine, and to a plurality of second arbitration circuits coupled to respective second memory banks of the second RAM.

In another aspect, the first memory tile includes a first memory mapped switch configured to receive configuration data to program the first stream switch and the first DMA engine. The first memory mapped switch is coupled to each of the plurality of first arbitration circuits.

In another aspect, the first DMA engine includes a plurality of stream-to-memory mapped channels, wherein each stream-to-memory mapped channel is independently configurable to operate using one of a plurality of different packet processing modes.

In another aspect, the plurality of packet processing modes include an in-order mode where packets received from other tiles of the DPE array arrive in a predetermined order and an out-of-order mode where packets received from other tiles of the DPE array arrive in a non-deterministic order.

In another aspect, the first DMA engine includes a plurality of stream-to-memory mapped channels, wherein at least one of the plurality of stream-to-memory mapped channels is configured to operate using an out-of-order mode where packets received from other tiles of the DPE array arrive in a non-deterministic order.

In another aspect, the DPE array includes a plurality of tiles arranged in a grid having rows and columns, wherein the plurality of tiles include a plurality of DPE tiles, the plurality of memory tiles, and a plurality of interface tiles. The plurality of interface tiles form an SoC interface that communicatively links the DPE array with one or more other circuit blocks of the IC.

In another aspect, each DPE tile includes a DMA engine including a plurality of stream-to-memory mapped channels, wherein each stream-to-memory mapped channel is independently configurable to operate using one of a plurality of different packet processing modes.

In another aspect, the plurality of packet processing modes include an in-order mode where packets received from other tiles of the DPE array arrive in a predetermined order and an out-of-order mode where packets received from other tiles of the DPE array arrive in a non-deterministic order.

In another aspect, each DPE tile includes a DMA engine including a plurality of stream-to-memory mapped channels, wherein at least one of the plurality of stream-to-memory mapped channel is configured to operate using an out-of-order mode where packets received from other tiles of the DPE array arrive in a non-deterministic order.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. An integrated circuit, comprising:
   a data processing engine (DPE) array comprising a plurality of tiles, wherein the plurality of tiles include:
   a plurality of DPE tiles, wherein each DPE tile includes a stream switch, a core configured to perform operations, and a memory module;
   a plurality of memory tiles, wherein each memory tile includes a stream switch, a direct memory access (DMA) engine, and a random-access memory;
   wherein the DMA engine of each memory tile is configured to access the random-access memory within the same memory tile and the random-access memory of at least one other memory tile; and
   wherein selected ones of the plurality of DPE tiles are configured to access selected ones of the plurality of memory tiles via the stream switches.

2. The integrated circuit of claim 1, wherein the DPE array comprises:
   a System-on-Chip (SoC) interface having a plurality of stream switches coupled to the stream switches of the plurality of DPE tiles and the stream switches of the plurality of memory tiles; and
   wherein the SoC interface communicatively links the DPE array with one or more other circuit blocks of the integrated circuit.

3. The integrated circuit of claim 2, wherein
   the memory tiles are arranged in one or more rows between a plurality of rows of DPE tiles and the SoC interface.

4. The integrated circuit of claim 1, wherein
   the DMA engine of a selected memory tile is configured to access the random-access memories of at least two other memory tiles.

5. The integrated circuit of claim 1, wherein
   the stream switch of a selected memory tile is configured to establish a logical connection with a stream switch of a selected DPE tile, wherein the logical connection couples the selected DPE tile with the DMA engine of the selected memory tile to pass data between the selected memory tile and the DPE tile.

6. The integrated circuit of claim 1, wherein
   the plurality of tiles are arranged in a grid having rows and columns; and
   the stream switch of each memory tile connects to the stream switch of an above adjacent tile and the stream switch of a below adjacent tile in the same column.

7. The integrated circuit of claim 6, wherein
   the stream switches of adjacent memory tiles in same rows are connected.

8. The integrated circuit of claim 6, wherein
   the stream switch of each DPE tile connects to the stream switch of each adjacent tile.

9. The integrated circuit of claim 6, wherein
   each column of tiles includes one or more DPE tiles and one or more memory tiles.

10. The integrated circuit of claim 6, wherein
    one or more columns of tiles include DPE tiles and no memory tiles; and
    one or more other columns of tiles include memory tiles and no DPE tiles.

11. The integrated circuit of claim 1, wherein
    the plurality of DPE tiles are arranged in a grid having a plurality of rows and a plurality of columns; and
    the plurality of memory tiles are interspersed within one or more of the rows such that the one or more rows include one or more DPE tiles and one or more memory tiles.

12. The integrated circuit of claim 1, wherein
    each memory tile includes event broadcast circuitry;
    the event broadcast circuitry of the memory tiles are interconnected forming an event broadcast network that is independent of a network formed by the stream switches; and
    the event broadcast network conveys events detected within the memory tiles.

13. The integrated circuit of claim 12, wherein
    the event broadcast network of the plurality of memory tiles is configured to convey debug and trace information for the plurality of memory tiles.

14. The integrated circuit of claim 1, wherein
each of the memory tiles includes a memory mapped switch;
the memory mapped switches of the memory tiles are interconnected forming a memory mapped network that is independent of a network formed by the stream switches; and
the memory mapped network conveys configuration data to the memory tiles.

15. The integrated circuit of claim 1, comprising:
a physical memory protection circuit coupled to an accelerator circuit, wherein the physical memory protection circuit is local to the accelerator circuit and configured to selectively pass transactions originating from the accelerator circuit to a memory based on a secure master identifier assigned to each transaction and a region of the memory that is to be accessed by each transaction.

16. The integrated circuit of claim 15, wherein the physical memory protection circuit is implemented within a System-on-Chip interface of the DPE array or within a Network-on-Chip of the integrated circuit.

17. The integrated circuit of claim 1, comprising:
a memory management unit coupled to an accelerator circuit, wherein the memory management unit is local to the accelerator circuit and configured to translate virtual memory addresses used by the accelerator circuit to physical memory addresses.

18. The integrated circuit of claim 1, wherein the memory management unit is implemented within a System-on-Chip interface of the DPE array or within a Network-on-Chip of the integrated circuit.

19. The integrated circuit of claim 1, comprising:
a plurality of protection circuits configured to selectively pass a memory mapped transaction to a selected column of a plurality of columns of tiles of the DPE array based on matching a column identifier corresponding to the memory mapped transaction with a hardwired and unique column identifier assigned to each of the plurality of columns of tiles in the DPE array.

20. The integrated circuit of claim 1, comprising:
a plurality of protection circuits configured to selectively pass a memory mapped transaction to a range of a plurality of columns of tiles of the DPE array based on matching an expected value generated from applying a column identifier mask to a hardwired and unique column identifier assigned to each of the plurality of columns of tiles in the DPE array.

* * * * *